US012586981B2

(12) United States Patent
Yamaguchi et al.

(10) Patent No.: US 12,586,981 B2
(45) Date of Patent: Mar. 24, 2026

(54) SEMICONDUCTOR LASER DEVICE

(71) Applicant: ROHM CO., LTD., Kyoto (JP)

(72) Inventors: Atsushi Yamaguchi, Kyoto (JP); Koki Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1108 days.

(21) Appl. No.: 17/597,426

(22) PCT Filed: Jul. 2, 2020

(86) PCT No.: PCT/JP2020/025941
§ 371 (c)(1),
(2) Date: Jan. 5, 2022

(87) PCT Pub. No.: WO2021/014917
PCT Pub. Date: Jan. 28, 2021

(65) Prior Publication Data
US 2022/0285911 A1 Sep. 8, 2022

(30) Foreign Application Priority Data

Jul. 23, 2019 (JP) ................................. 2019-135356

(51) Int. Cl.
| | |
|---|---|
| *H01S 5/042* | (2006.01) |
| *H01S 5/0233* | (2021.01) |
| *G01S 7/484* | (2006.01) |

(52) U.S. Cl.
CPC .......... *H01S 5/0428* (2013.01); *H01S 5/0233* (2021.01); *G01S 7/484* (2013.01)

(58) Field of Classification Search
CPC .. H01S 5/0428; H01S 5/0233; H01S 5/02315; H01S 5/02345; H01S 5/0237;
(Continued)

(56) References Cited

U.S. PATENT DOCUMENTS

| | | | | |
|---|---|---|---|---|
| 4,873,566 A | * | 10/1989 | Hokanson | .......... H10H 20/8506 |
| | | | | 257/E33.071 |
| 2003/0123805 A1 | * | 7/2003 | Akashi | ................. G02B 6/4266 |
| | | | | 385/49 |

(Continued)

FOREIGN PATENT DOCUMENTS

| | | |
|---|---|---|
| JP | 2005332983 | 12/2005 |
| JP | 2018128432 | 8/2018 |

(Continued)

OTHER PUBLICATIONS

The Second Office Action issued for Chinese Patent Application No. 202080052125.2, dated Sep. 27, 2024, 8 pages including English machine translation.

(Continued)

*Primary Examiner* — Xinning(Tom) Niu
(74) *Attorney, Agent, or Firm* — HSML P.C.

(57) ABSTRACT

This semiconductor laser device comprises: a semiconductor laser element; a switching element connected in series to the semiconductor laser element, the switching element having a gate electrode, a drain electrode, and a source electrode; capacitors connected in parallel to the semiconductor laser element and the switching element; first drive electroconductive parts to which first terminals of the capacitors are connected; a second drive electroconductive part positioned apart from the first drive electroconductive parts; first drive connection members that connect the first (Continued)

drive electroconductive parts and the source electrode; and a second drive connection member that connects the second drive electroconductive part and the source electrode.

19 Claims, 44 Drawing Sheets

(58) Field of Classification Search
CPC .. H01S 5/4031; H01S 5/02234; H01S 5/0239; H01S 5/3095; H01S 5/4043; H01S 5/0232; H01S 5/0262
See application file for complete search history.

(56) References Cited

U.S. PATENT DOCUMENTS

| | | | |
|---|---|---|---|
| 2007/0019902 A1* | 1/2007 | Nakata | G02B 6/4246 |
| | | | 385/14 |
| 2007/0267649 A1* | 11/2007 | Matsushita | H01L 25/167 |
| | | | 257/E31.101 |
| 2018/0109074 A1* | 4/2018 | Gassend | H01S 5/06817 |
| 2018/0254605 A1 | 9/2018 | Wojcik et al. | |
| 2018/0278011 A1 | 9/2018 | Galvano et al. | |
| 2019/0312407 A1* | 10/2019 | Halbritter | H01L 23/49589 |

FOREIGN PATENT DOCUMENTS

| | | |
|---|---|---|
| JP | 2018525826 | 9/2018 |
| JP | 2019511128 | 4/2019 |

OTHER PUBLICATIONS

First Office Action issued for Chinese Patent Application No. 202080052125.2, dated Feb. 29, 2024, 16 pages including English machine translation.

International Search Report and Written Opinion issued for International Patent Application No. PCT/JP2020/025941, Date of mailing: Sep. 8, 2020, 17 pages including English translation of Search Report.

Office Action issued in Japanese Patent Application No. 2021-533901, Mar. 19, 2024, with machine translation (11 pages).

International Preliminary Report on Patentability issued for International Patent Application No. PCT/JP2020/025941, Date of issuance: Jan. 25, 2022, 14 pages including English translation.

Notice of Reasons for Refusal issued for Japanese Patent Application No. 2025-072126, Dispatch date: Oct. 21, 2025, 6 pages including English machine translation.

* cited by examiner 50
60 51
(60A)
76A     85 11 10     86     76B     51c
51a
64A     32     32     64B
30A     20A     30B
(30)     (30)
75c   88
61A     31 21     84a 83a     24 31     73B
73A     24a
22A 23 22C 22B
81     82     61B
84     83
51e     51f
65     74     62
51d     75     84b     83b     74     60C

Y
↑
→ X

SEMICONDUCTOR LASER DEVICE

TECHNICAL FIELD

The present disclosure relates to a semiconductor laser device.

BACKGROUND ART

A known three-dimensional distance measurement technique used for a vehicle and the like emits a laser beam to a measurement object to measure the distance to the measurement object based on reflection light reflected by the measurement object. As a laser distance measurement device that uses the above-described technique, systems using light detection and ranging, or laser imaging detection and ranging, also known as LiDAR, have been proposed (for example, refer to Patent Literature 1).

Patent Literature 1: Japanese Laid-Open Patent Publication No. 2018-128432

SUMMARY

A semiconductor laser device used as a light source of LiDAR includes a laser diode and a transistor connected in series to the laser diode. The semiconductor laser device switches the transistor on and off to emit a laser beam having a pulse width of a few dozen nanoseconds or less. When the pulse with is a few dozen nanoseconds or less, the time rate of change in a current flowing through the laser diode may increase. This may increase counter electromotive force due to inductance in the semiconductor laser device. The counter electromotive force may affect the gate voltage of the transistor. Such shortcomings are not limited to a transistor. When another switching element is used, the counter electromotive force due to inductance may affect a control voltage that is applied to the control electrode of the switching element.

It is an objective of the present disclosure to provide a semiconductor laser device that reduces the effect of counter electromotive force due to inductance imposed on the control voltage of a switching element.

According to one aspect of the present disclosure, a semiconductor laser device includes a semiconductor laser element, a switching element, a capacitor, a first drive conductor, a second drive conductor, a first drive connection member, and a second drive connection member. The switching element is connected in series to the semiconductor laser element. The switching element includes a control electrode, a first drive electrode, and a second drive electrode and controls a current flowing to the semiconductor laser element in accordance with a voltage applied to the control electrode. The capacitor is configured to be connected in parallel to the semiconductor laser element and the switching element. The first drive conductor is connected to a first terminal of the capacitor. The second drive conductor is located separate from the first drive conductor. The first drive connection member connects the first drive conductor and the second drive electrode. The second drive connection member connects the second drive conductor and the second drive electrode.

In this structure, a first path of current flowing from the second drive electrode of the switching element through the first drive connection member to the first drive conductor is formed separately from a second path of current flowing from the second drive electrode of the switching element through the second drive connection member to the second drive conductor. Thus, variations in the current flowing through the first path are less likely to affect the second path. That is, the second path is less likely to be affected by inductance of the first drive connection member. Accordingly, the effect of counter electromotive force due to the inductance of the first drive connection member imposed on the control voltage of the switching element is reduced in the second path.

According to one aspect of the present disclosure, a semiconductor laser device includes a semiconductor laser element, a switching element, a capacitor, a first drive conductor. The switching element is connected in series to the semiconductor laser element. The switching element includes a control electrode, a first drive electrode, and a second drive electrode and controls a current flowing to the semiconductor laser element in accordance with a voltage applied to the control electrode. The capacitor is connected in parallel to the semiconductor laser element and the switching element. The first drive conductor is connected to a first terminal of the capacitor. The first drive conductor includes a first end connected to the first terminal of the capacitor and a second end located opposite to the first end in a direction in which the first drive conductor extends. The semiconductor laser device further includes a first drive connection member and a second drive connection member. The first drive connection member connects the second drive electrode and the first drive conductor on a position toward the first terminal of the capacitor. The second drive connection member connects the second drive electrode and the first drive conductor on a position closer to the second end than the first terminal of the capacitor.

In this structure, a first path of current flowing from the second drive electrode of the switching element through the first drive connection member to the first drive conductor on a position toward the first terminal of the capacitor is formed separately from a second path of current flowing from the second drive electrode of the switching element through the second drive connection member to the first drive conductor on a position toward the control electrode. Thus, variations in the current flowing through the first path are less likely to affect the second path. That is, the second path is less likely to be affected by inductance of the first drive connection member. Accordingly, the effect of counter electromotive force due to the inductance of the first drive connection member imposed on the control voltage of the switching element is reduced in the second path.

According to one aspect of the present disclosure, a semiconductor laser device includes a semiconductor laser element, a switching element, a capacitor, a first drive conductor, a driver circuit, a first drive connection member, and a second drive connection member. The switching element is connected in series to the semiconductor laser element. The switching element includes a control electrode, a first drive electrode, and a second drive electrode and controls a current flowing to the semiconductor laser element in accordance with a voltage applied to the control electrode. The capacitor is connected in parallel to the semiconductor laser element and the switching element. The first drive conductor is connected to a first terminal of the capacitor. The driver circuit is configured to apply a voltage to the control electrode of the switching element. The first drive connection member connects the first drive conductor and the second drive electrode. The second drive connection member connects the driver circuit and the second drive electrode.

In this structure, a first path of current flowing from the second drive electrode of the switching element through the first drive connection member to the first drive conductor is formed separately from a second path of current flowing from the second drive electrode of the switching element through the second drive connection member to the driver circuit. Thus, variations in the current flowing through the first path are less likely to affect the second path. That is, the second path is less likely to be affected by inductance of the first drive connection member. Accordingly, the effect of counter electromotive force due to the inductance of the first drive connection member imposed on the control voltage of the switching element is reduced in the second path.

The semiconductor laser device reduces the effect of counter electromotive force due to inductance on the control voltage of the switching element.

DESCRIPTION OF EMBODIMENTS

Embodiments of a semiconductor laser device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

Figure 1:
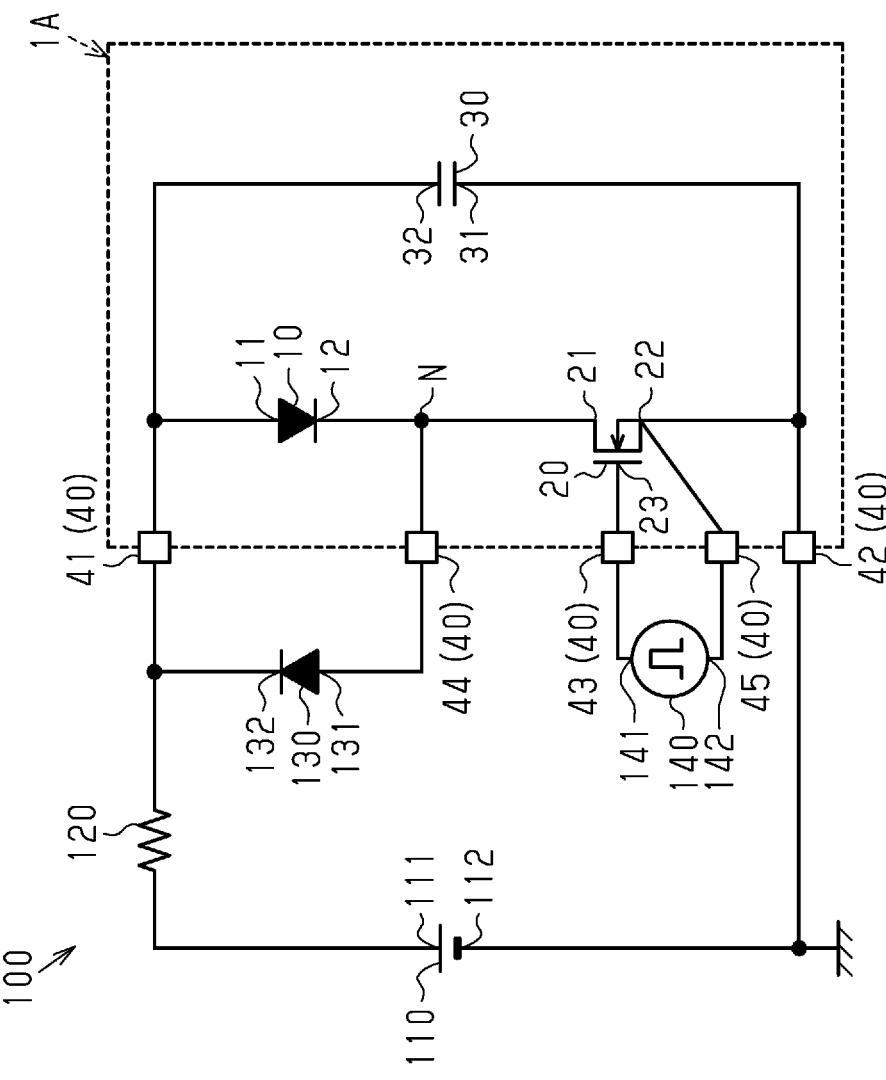
FIG. 1 is a schematic circuit diagram of a laser system including a first embodiment of a semiconductor laser device.

A first embodiment of a semiconductor laser device will now be described with reference to FIGS. 1 to 16.
Circuit Configuration of Semiconductor Laser Device and Laser System As shown in FIG. 1, a semiconductor laser device 1A includes parts surrounded by broken lines in FIG. 1 and is used as a pulsed laser beam source of LiDAR, which is an example of three-dimensional distance measurement. FIG. 1 shows a configuration in which the semiconductor laser device 1A is used in a laser system 100 corresponding to LiDAR. The semiconductor laser device 1A includes a semiconductor laser element 10, a switching element 20, a capacitor 30, and terminals 40. In FIG. 1, the semiconductor laser device 1A includes five terminals 40. The semiconductor laser device 1A may be used in a laser system for two-dimensional distance measurement. The number of terminals 40 may be changed in any manner.

The laser system 100 includes a power supply 110, a current limiting resistor 120, a diode 130, and a driver circuit 140. The power supply 110 includes a positive electrode 111 and a negative electrode 112 and supplies power to the semiconductor laser element 10. The current limiting resistor 120 is disposed between the positive electrode 111 of the power supply 110 and the semiconductor laser element 10 to limit the current flowing from the power supply 110 to the semiconductor laser element 10. The diode 130 has an anode electrode 131 and a cathode electrode 132 and is connected in antiparallel to the semiconductor laser element 10 to prevent a reverse flow to the semiconductor laser element 10. In the laser system 100 shown in FIG. 1, the diode 130 is a Schottky diode. The driver circuit 140 has an output electrode 141 and an input electrode 142 and outputs a control signal to the switching element 20 to control the switching on and off of the switching element 20.

The semiconductor laser element 10 is a light source of the semiconductor laser device 1A and is, for example, a pulsed laser diode. The material of the semiconductor laser element 10 is, for example, gallium arsenide (GaAs). The semiconductor laser element 10 has an anode electrode 11 and a cathode electrode 12. The switching element 20 is configured to permit and stop the current to the semiconductor laser element 10. The specifications of the semiconductor laser element 10 are such that, for example, the oscillation wavelength is 905 nm, the output of light is 75 W or greater, and the pulse width is a few dozen nanoseconds or less. Preferably, the specifications of the semiconductor laser element 10 are such that the output of light is 150 W or greater and the pulse width is 10 ns or less. More preferably, the specifications of the semiconductor laser element 10 are such that the pulse width is 5 ns or less.

The switching element 20 is, for example, a transistor formed from silicon (S), silicon carbide (SiC), or gallium nitride (GaN). When the switching element 20 is formed from GaN or SiC, it is suitable for high-speed switching. In the present embodiment, the switching element 20 is an N-type metal-oxide-semiconductor field-effect-transistor (MOSFET) formed from Si. The switching element 20 includes a drain electrode 21, which is an example of a first drive electrode, a source electrode 22, which is an example of a second drive electrode, and a gate electrode 23, which is an example of a control electrode.

The capacitor 30 includes a capacitor bank configured to temporarily accumulate electric charge, which will become current flowing to the semiconductor laser element 10. The capacitor 30, for example, stores power when the switching element 20 is switched off, and discharges to the semiconductor laser element 10 when the switching element 20 is switched on. The number of capacitors 30 may be one or more. For example, the number of capacitors 30 and the capacitance of each capacitor 30 are set in accordance with output of the semiconductor laser element 10. The capacitor 30 includes a first terminal 31 and a second terminal 32.

As shown in FIG. 1, the semiconductor laser element 10 and the switching element 20 are connected in series. More specifically, the cathode electrode 12 of the semiconductor laser element 10 is electrically connected to the drain electrode 21 of the switching element 20. The anode electrode 11 of the semiconductor laser element 10 is electrically connected to a first power terminal 41. The source electrode 22 of the switching element 20 is electrically connected to a second power terminal 42. The anode electrode 131 of the diode 130 is electrically connected to a node N between the cathode electrode 12 of the semiconductor laser element 10 and the drain electrode 21 of the switching element 20.

The capacitor 30 is connected in parallel to the semiconductor laser element 10 and the switching element 20. More specifically, the first terminal 31 of the capacitor 30 is electrically connected to the source electrode 22 of the switching element 20. The second terminal 32 of the capacitor 30 is electrically connected to the anode electrode 11 of the semiconductor laser element 10.

The terminals 40 include the first power terminal 41, the second power terminal 42, a control terminal 43, a diode connection terminal 44, and a driver connection terminal 45. As shown in FIG. 1, the first power terminal 41 is electrically connected to the positive electrode 111 of the power supply 110 and the cathode electrode 132 of the diode 130. The first power terminal 41 is also electrically connected to the anode electrode 11 of the semiconductor laser element 10 and the second terminal 32 of the capacitor 30. The second power terminal 42 is electrically connected to the negative electrode 112 of the power supply 110. The second power terminal 42 is also electrically connected to the source electrode 22 of the switching element 20 and the first terminal 31 of the capacitor 30. The control terminal 43 is connected to the output electrode 141 of the driver circuit 140. The diode connection terminal 44 is connected to the anode electrode 131 of the diode 130. The diode connection terminal 44 is also connected to the node N between the cathode electrode 12 of the semiconductor laser element 10 and the drain electrode 21 of the switching element 20. Thus, the anode electrode 131 of the diode 130 and the cathode electrode 12 of the semiconductor laser element 10 are electrically connected by the diode connection terminal 44. The driver connection terminal 45 is electrically connected to the input electrode 142 of the driver circuit 140.

The laser system 100 having the above configuration operates as follows. When the switching element 20 is switched off by a control signal of the driver circuit 140, the power supply 110 stores power in the capacitor 30. When the switching element 20 is switched on by a control signal of the driver circuit 140, the capacitor 30 is discharged so that a current flows to the semiconductor laser element 10. As a result, the semiconductor laser element 10 outputs a pulsed laser beam.

Structure of Semiconductor Laser Device

The semiconductor laser device 1A is modularized. More specifically, the semiconductor laser device 1A has a structure of a single package accommodating the semiconductor laser element 10, the switching element 20, and the capacitor 30. The structure of the semiconductor laser device 1A will be described below in detail.

The semiconductor laser device 1A includes a support substrate 50 that supports the semiconductor laser element 10, the switching element 20, and the capacitor 30, and a sealing member 90 that seals the semiconductor laser element 10, the switching element 20, and the capacitor 30. Each of the support substrate 50 and the sealing member 90 is a part of the package. In the present embodiment, the support substrate 50 and the sealing member 90 form the package of the semiconductor laser device 1A. The semiconductor laser device 1A includes two capacitors 30A and 30B as the capacitors 30.

The support substrate 50 includes conductive paths of the semiconductor laser element 10, the switching element 20, and the capacitors 30 (30A, 30B) and supports the semiconductor laser element 10, the switching element 20, and the capacitor 30. The support substrate 50 includes a base member 51 and a conductor 60.

The base member 51 is formed of an electrically insulative material. In an example, the base member 51 is formed of an epoxy resin or a ceramic. In the present embodiment, a glass-epoxy resin is used as the material forming the base member 51. The base member 51 includes a base main surface 51a, a base back surface 51b, a first base side surface 51c, a second base side surface 51d, a third base side surface 51e, and a fourth base side surface 51f. In the description hereafter, the thickness-wise direction of the base member 51 is referred to as "the thickness-wise direction Z." In a direction orthogonal to the thickness-wise direction Z, directions that are orthogonal to each other are referred to as "the width-wise direction X" and "the length-wise direction Y" The length-wise direction Y corresponds to a first direction. The width-wise direction X corresponds to a second direction.

The base main surface 51a and the base back surface 51b face in opposite directions in the thickness-wise direction Z. The first base side surface 51c, the second base side surface 51d, the third base side surface 51e, and the fourth base side surface 51f are disposed between the base main surface 51a and the base back surface 51b in the thickness-wise direction Z and extend in a direction intersecting the base main surface 51a and the base back surface 51b. The first base side surface 51c and the second base side surface 51d face in opposite directions. The third base side surface 51e and the fourth base side surface 51f face in opposite directions. In the present embodiment, the first base side surface 51c and the second base side surface 51d face in opposite directions in the length-wise direction Y and extend in the width-wise direction X. The third base side surface 51e and the fourth base side surface 51f face in opposite directions in the width-wise direction X and extend in the length-wise direction Y.

In a plan view of the semiconductor laser device 1A (hereafter, simply referred to as "plan view"), the base member 51 is rectangular. In the present embodiment, in plan view, the base member 51 is rectangular such that the first base side surface 51c and the second base side surface 51d extend along the long sides and the third base side surface 51e and the fourth base side surface 51f extend along the short sides.

The conductor 60 is disposed on the base member 51 and forms the conductive paths to the semiconductor laser element 10, the switching element 20, and the capacitors 30. Although not particularly limited, the material of the conductor 60 is, for example, metal such as copper (Cu), nickel (Ni), titanium (Ti), or gold (Au). The conductor 60 is formed by, for example, plating. However, the forming process is not particularly limited. The conductor 60 includes a main surface conductor 60A corresponding to a drive conductor, a back surface conductor 60B corresponding to a terminal conductor, and a joints 60C.

The main surface conductor 60A is formed on the base main surface 51a of the base member 51. The main surface conductor 60A includes two first drive conductors 61A and 61B, a second drive conductor 62, a third drive conductor 63, two fourth drive conductors 64A and 64B, and a control conductor 65.

The two first drive conductors 61A and 61B are located at opposite ends of the base main surface 51a in the width-wise direction X on a center of the base main surface 51a in the length-wise direction Y. In plan view, the first drive conductor 61A is disposed on the base main surface 51a at a position closer to the third base side surface 51e and separate from the third base side surface 51e in the width-wise direction X. In plan view, the first drive conductor 61B is disposed on the base main surface 51a at a position closer to the fourth base side surface 51f and separate from the fourth base side surface 51f in the width-wise direction X. In plan view, each of the first drive conductors 61A and 61B is rectangular such that the long sides extend in the length-wise direction Y and the short sides extend in the width-wise direction X. In the present embodiment, the first drive conductors 61A and 61B are identical in shape in plan view. The planar shape of each of the first drive conductors 61A and 61B may be changed in any manner. For example, in plan view, the shape of the first drive conductor 61A may differ from the shape of the first drive conductor 61B.

The third drive conductor 63 is disposed on the base main surface 51*a* at a position between the two first drive conductors 61A and 61B in the width-wise direction X. In plan view, the third drive conductor 63 is inverted-T-shaped. The third drive conductor 63 may be divided into a portion sandwiched between the two first drive conductors 61A and 61B, defining a switching element mount portion 63*a*, and a portion projecting from the switching element mount portion 63*a* in the length-wise direction Y, defining a semiconductor laser element mount portion 63*b*.

The switching element mount portion 63*a* is disposed on the base main surface 51*a* at a position closer to the second base side surface 51*d* in the length-wise direction Y. The switching element mount portion 63*a* are spaced apart from the two first drive conductors 61A and 61B in the width-wise direction X. In plan view, the switching element mount portion 63*a* is square. The dimension of the switching element mount portion 63*a* in the width-wise direction X is greater than the dimension of each of the two first drive conductors 61A and 61B in the width-wise direction X. Although not particularly limited, in the present embodiment, the dimension of the switching element mount portion 63*a* in the length-wise direction Y is equal to the dimension of each of the two first drive conductors 61A and 61B in the length-wise direction Y. When a difference in the dimension in the length-wise direction Y between the switching element mount portion 63*a* and the two first drive conductors 61A and 61B is within 5% of the dimension of the two first drive conductors 61A and 61B in the length-wise direction Y, it is considered that the dimension of the switching element mount portion 63*a* in the length-wise direction Y is equal to the dimension of the two first drive conductors 61A and 61B in the length-wise direction Y.

Figure 2:
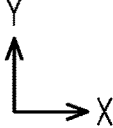
FIG. 2 is a plan view of the semiconductor laser device of the first embodiment showing an internal structure of the semiconductor laser device with a sealing member removed.
Figure 4:
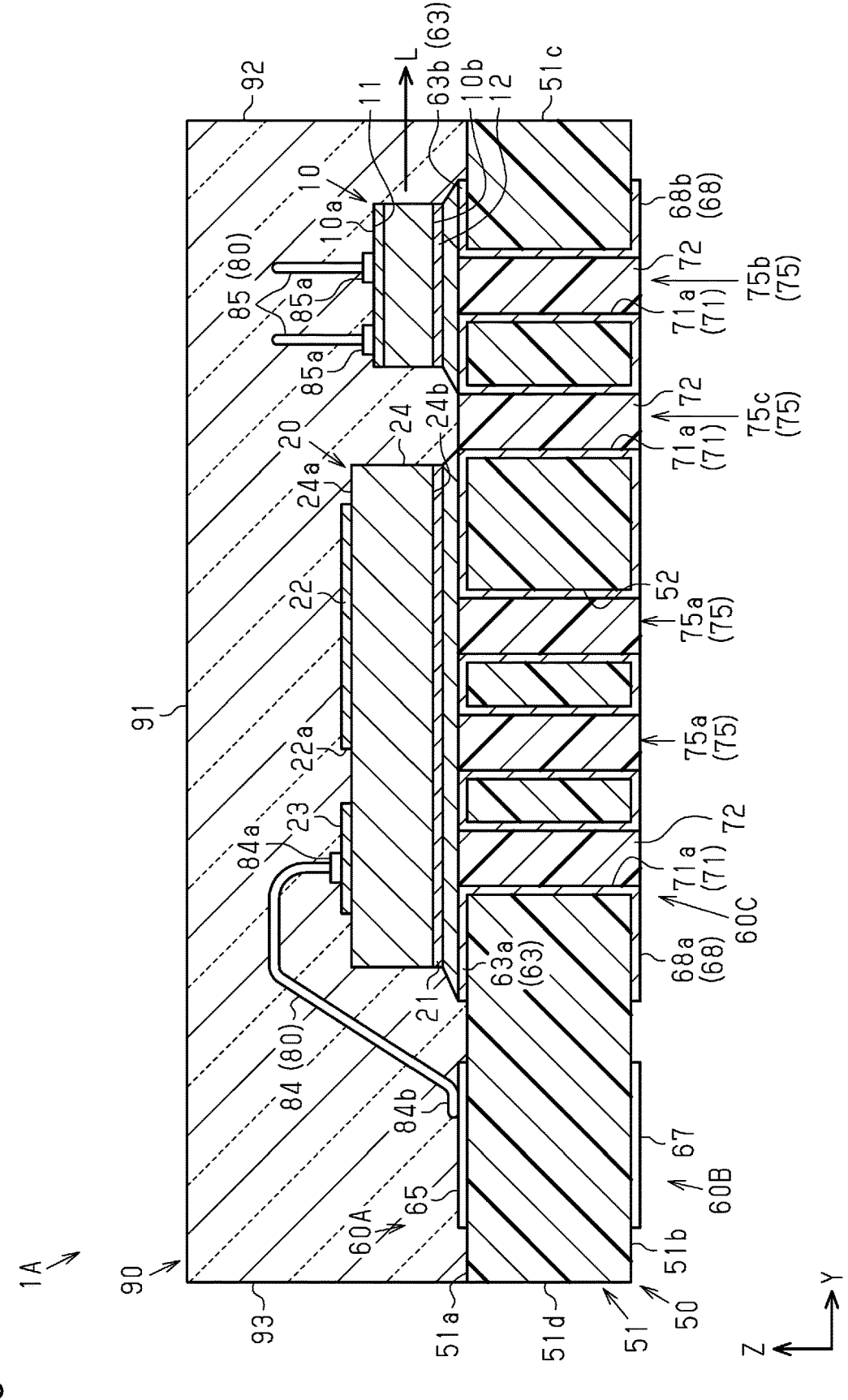
FIG. 4 is a cross-sectional view taken along line 4-4 in FIG. 2.

The switching element 20 is mounted on the switching element mount portion 63*a*. As shown in FIGS. 2 and 4, the switching element 20 is flat. The switching element 20 includes an element main body 24 formed of a semiconductor material such as Si or SiC. The element main body 24 includes an element main surface 24*a* and an element back surface 24*b* facing in opposite directions in the thickness-wise direction Z. The element main surface 24*a* faces in the same direction as a laser element main surface 10*a* of the semiconductor laser element 10. The element back surface 24*b* faces in the same direction as a laser element back surface 10*b*.

The source electrode 22 and the gate electrode 23 are formed on the element main surface 24*a*. The source electrode 22 is formed on a substantial portion of the element main surface 24*a*. In plan view, the source electrode 22 has the shape of a recess that is open toward the second base side surface 51*d*. In the present embodiment, in plan view, the source electrode 22 includes a recess 22*a* that is recessed in the length-wise direction Y. The recess 22*a* is formed in an end of the source electrode 22 located close to the second base side surface 51*d* at a center of the source electrode 22 in the width-wise direction X. The gate electrode 23 is formed in the recess 22*a*.

The drain electrode 21 is formed on the element back surface 24*b*. For example, the drain electrode 21 is formed on the entirety of the element back surface 24*b*. Thus, the switching element 20 of the present embodiment is a transistor having a vertical structure.

The semiconductor laser element mount portion 63*b* is disposed on an end of the switching element mount portion 63*a* located close to the first base side surface 51*c* in the length-wise direction Y at a center of the switching element mount portion 63*a* in the width-wise direction X. In plan view, the semiconductor laser element mount portion 63*b* is rectangular such that the long sides extend in the length-wise direction Y and the short sides extend in the width-wise direction X. The dimension of the semiconductor laser element mount portion 63*b* in the width-wise direction X is less than the dimension of the switching element mount portion 63*a* in the width-wise direction X. The dimension of the semiconductor laser element mount portion 63*b* in the width-wise direction X is also less than the dimension of the two first drive conductors 61A and 61B in the width-wise direction X. The dimension of the semiconductor laser element mount portion 63*b* in the length-wise direction Y is less than the dimension of the switching element mount portion 63*a* in the length-wise direction Y. The dimension of the semiconductor laser element mount portion 63*b* in the length-wise direction Y is also less than the dimension of the two first drive conductors 61A and 61B in the length-wise direction Y.

The semiconductor laser element 10 is mounted on the semiconductor laser element mount portion 63*b*. As shown in FIGS. 2 and 4, the semiconductor laser element 10 is flat. In plan view, the semiconductor laser element 10 is rectangular such that the long sides extend in the length-wise direction Y and the short sides extend in the width-wise direction X. The semiconductor laser element 10 includes the laser element main surface 10*a* and the laser element back surface 10*b* facing in opposite directions in the thickness-wise direction Z. In the present embodiment, the anode electrode 11 is formed on the laser element main surface 10*a*, and the cathode electrode 12 is formed on the laser element back surface 10*b*.

In plan view, the shape of the switching element mount portion 63*a* may be changed in any manner. For example, in plan view, the switching element mount portion 63*a* may be rectangular such that the long sides extend in one of the width-wise direction X and the length-wise direction Y and the short sides extend in the other one of the width-wise direction X and the length-wise direction Y. In plan view, the shape of the semiconductor laser element mount portion 63*b* may be changed in any manner. For example, in plan view, the shape of the semiconductor laser element mount portion 63*b* may be square or rectangular such that the long sides extend in the width-wise direction X and the short sides extend in the length-wise direction Y.

The two fourth drive conductors 64A and 64B are disposed on an end of the base main surface 51*a* located close to the first base side surface 51*c* in the length-wise direction Y. The two fourth drive conductors 64A and 64B are located separate from the first base side surface 51*c* in the length-wise direction Y. The fourth drive conductor 64A is disposed on an end of the base main surface 51*a* located close to the third base side surface 51*e*. The fourth drive conductor 64A is located separate from the third base side surface 51*e* in the width-wise direction X. The fourth drive conductor 64B is disposed on an end of the base main surface 51*a* located close to the fourth base side surface 51*f*. The fourth drive conductor 64B is located separate from the fourth base side surface 51*f* in the width-wise direction X. The two fourth drive conductors 64A and 64B are spaced apart from the semiconductor laser element mount portion 63*b* in the width-wise direction X at opposite sides of the semiconductor laser element mount portion 63*b* in the width-wise direction X. As viewed in the length-wise direction Y, the fourth drive conductor 64A is located overlapping the first drive conductor 61A. As viewed in the length-wise direction Y, an end of the fourth drive conductor 64A located close to the semiconductor laser element mount portion 63b is located overlapping an end of the switching element mount portion 63a located close to the third base side surface 51e. As viewed in the length-wise direction Y, the fourth drive conductor 64B is located overlapping the first drive conductor 61B. As viewed in the length-wise direction Y, an end of the fourth drive conductor 64B located close to the semiconductor laser element mount portion 63b is located overlapping an end of the switching element mount portion 63a located close to the fourth base side surface 51f As viewed in the width-wise direction X, the two fourth drive conductors 64A and 64B are located overlapping the semiconductor laser element mount portion 63b.

In plan view, each of the two fourth drive conductors 64A and 64B is rectangular such that the long sides extend in the width-wise direction X and the short sides extend in the length-wise direction Y. The dimension of the two fourth drive conductors 64A and 64B in the width-wise direction X is greater than the dimension of the two first drive conductors 61A and 61B in the width-wise direction X. The dimension of the two fourth drive conductors 64A and 64B in the length-wise direction Y is less than the dimension of the two first drive conductors 61A and 61B in the length-wise direction Y. The dimension of the two fourth drive conductors 64A and 64B in the length-wise direction Y is also less than the dimension of the semiconductor laser element mount portion 63b in the length-wise direction Y. In the present embodiment, the fourth drive conductors 64A and 64B are identical in shape in plan view. The planar shape of each of the fourth drive conductors 64A and 64B may be changed in any manner. For example, in plan view, the shape of the fourth drive conductor 64A may differ from the shape of the fourth drive conductor 64B.

The second drive conductor 62 and the control conductor 65 are disposed on an end of the base main surface 51a located close to the second base side surface 51d in the length-wise direction Y. The second drive conductor 62 and the control conductor 65 are separated from each other in the width-wise direction X and arranged in order in the width-wise direction X. The second drive conductor 62 and the control conductor 65 are located separate from the second base side surface 51d in the length-wise direction Y. The second drive conductor 62 is disposed on an end of the base main surface 51a located close to the fourth base side surface 51f in the width-wise direction X. The second drive conductor 62 is located separate from the fourth base side surface 51f in the width-wise direction X. The control conductor 65 is disposed on an end of the base main surface 51a located close to the third base side surface 51e in the width-wise direction X. The control conductor 65 is located separate from the third base side surface 51e in the width-wise direction X.

In plan view, the second drive conductor 62 is rectangular such that the long sides extend in the width-wise direction X and the short sides extend in the length-wise direction Y. The dimension of the second drive conductor 62 in the length-wise direction Y is less than the dimension of the two first drive conductors 61A and 61B and the switching element mount portion 63a in the length-wise direction Y. The dimension of the second drive conductor 62 in the width-wise direction X is greater than the dimension of the two first drive conductors 61A and 61B in the width-wise direction X. The dimension of the second drive conductor 62 in the width-wise direction X is greater than the dimension of the two fourth drive conductors 64A and 64B in the width-wise direction X. The planar shape of the second drive conductor

62 may be changed in any manner. In an example, in plan view, the second drive conductor 62 may be square or may be rectangular such that the long sides extend in the length-wise direction Y and the short sides extend in the width-wise direction X.

In plan view, the control conductor 65 is rectangular such that the long sides extend in the width-wise direction X and the short sides extend in the length-wise direction Y. The dimension of the control conductor 65 in the length-wise direction Y is less than the dimension of the two first drive conductors 61A and 61B in the length-wise direction Y. The dimension of the control conductor 65 in the width-wise direction X is greater than the dimension of the two first drive conductors 61A and 61B in the width-wise direction X. The dimension of the control conductor 65 in the width-wise direction X is greater than the dimension of the two fourth drive conductors 64A and 64B in the width-wise direction X. The planar shape of the control conductor 65 may be changed in any manner. In an example, in plan view, the control conductor 65 may be square or may be rectangular such that the long sides extend in the length-wise direction Y and the short sides extend in the width-wise direction X.

As viewed in the length-wise direction Y, the second drive conductor 62 is located overlapping the first drive conductor 61B, the fourth drive conductor 64B, and an end of the switching element mount portion 63a located close to the fourth base side surface 51f As viewed in the length-wise direction Y, the control conductor 65 is located overlapping the first drive conductor 61A, the fourth drive conductor 64A, and an end of the switching element mount portion 63a located close to the third base side surface 51e.

Figure 3:
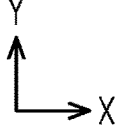
FIG. 3 is a back view of the semiconductor laser device of the first embodiment.

As shown in FIG. 3, the back surface conductor 60B is formed on the base back surface 51b of the base member 51. The back surface conductor 60B includes two first terminal conductors 66A and 66B, a second terminal conductor 67, the third terminal conductor 68, two fourth terminal conductors 69A and 69B, and a control terminal conductor 70. Thus, in the present embodiment, the semiconductor laser device 1A is a front surface mount type of a package.

The back surface conductor 60B is used as terminals used to mount the semiconductor laser device 1A on a wiring substrate (not shown) or the like, that is, the terminals 40 shown in FIG. 1. As shown in FIGS. 1 and 3, the two first terminal conductors 66A and 66B form the second power terminal 42. The second terminal conductor 67 forms the driver connection terminal 45. The third terminal conductor 68 forms the diode connection terminal 44. The fourth terminal conductors 69A and 69B form the first power terminal 41.

As shown in FIG. 3, the two first terminal conductors 66A and 66B are located at opposite ends of the base back surface 51b in the width-wise direction X on a center of the base back surface 51b in the length-wise direction Y. In plan view, the first terminal conductor 66A is disposed on the base back surface 51b at a position closer to the third base side surface 51e and separate from the third base side surface 51e in the width-wise direction X. In plan view, the first terminal conductor 66B is disposed on the base back surface 51b at a position closer to the fourth base side surface 51f and separate from the fourth base side surface 51f in the width-wise direction X. As viewed in the thickness-wise direction Z, the first terminal conductor 66A is located overlapping the first drive conductor 61A.

In plan view, each of the first terminal conductors 66A and 66B is rectangular such that the long sides extend in the length-wise direction Y and the short sides extend in the width-wise direction X. The dimension of the first terminal conductors 66A and 66B in the width-wise direction X is less than the dimension of the first drive conductors 61A and 61B in the width-wise direction X. The dimension of the first terminal conductors 66A and 66B in the length-wise direction Y is less than the dimension of the first drive conductors 61A and 61B in the length-wise direction Y. In the present embodiment, the first terminal conductors 66A and 66B are identical in shape in plan view. The planar shape of each of the first terminal conductors 66A and 66B may be changed in any manner. For example, in plan view, the shape of the first terminal conductor 66A may differ from the shape of the first terminal conductor 66B.

The third terminal conductor 68 is disposed on the base back surface 51*b* at a position between the two first terminal conductors 66A and 66B in the width-wise direction X. The third terminal conductor 68 is disposed on the base back surface 51*b* at a position closer to the first base side surface 51*c* in the length-wise direction Y. As viewed in the thickness-wise direction Z, the third terminal conductor 68 is located overlapping the third drive conductor 63.

In plan view, the third terminal conductor 68 is rectangular such that the long sides extend in the length-wise direction Y and the short sides extend in the width-wise direction X. For the sake of convenience, the third terminal conductor 68 is separated by a border line Lb into a first terminal portion 68*a* and a second terminal portion 68*b*, which respectively overlap the switching element mount portion 63*a* and the semiconductor laser element mount portion 63*b* of the third drive conductor 63 in the thickness-wise direction Z.

Figure 6:
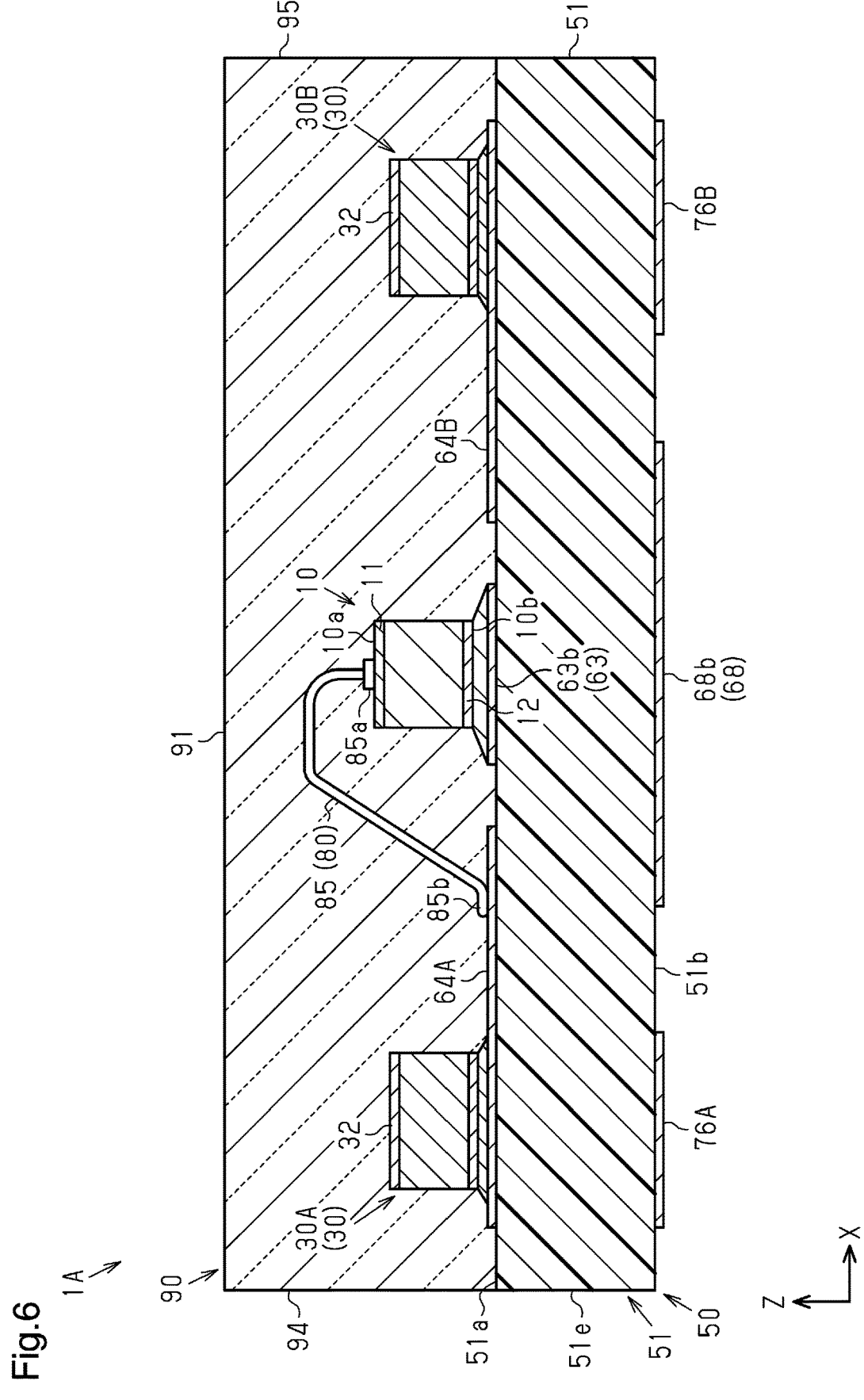
FIG. 6 is a cross-sectional view taken along line 6-6 in FIG. 2.
Figure 7:
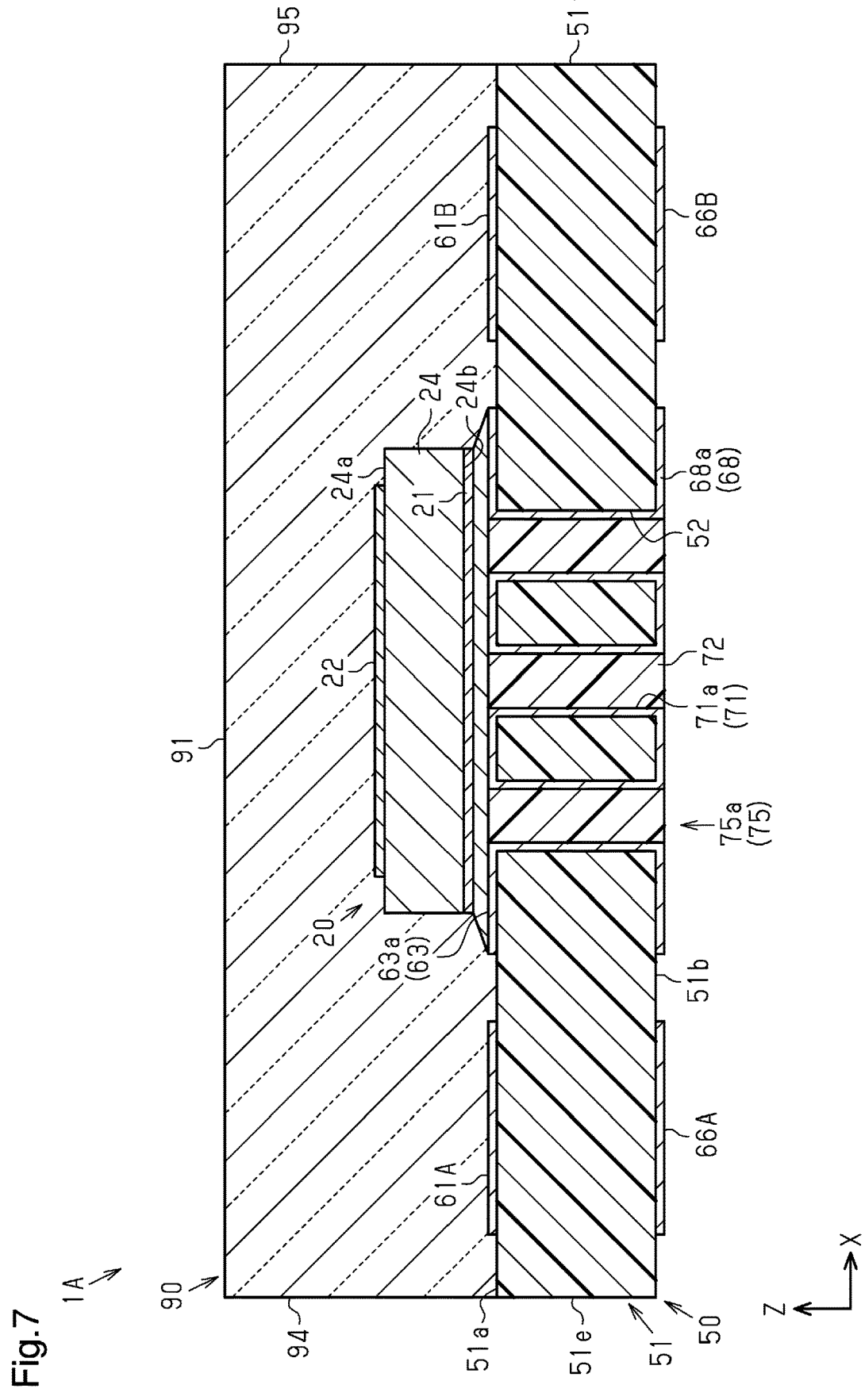
FIG. 7 is a cross-sectional view taken along line 7-7 in FIG. 2.

The dimension of the first terminal portion 68*a* in the width-wise direction X is less than the dimension of the switching element mount portion 63*a* in the width-wise direction X. The dimension of the first terminal portion 68*a* in the length-wise direction Y is less than the dimension of the switching element mount portion 63*a* in the length-wise direction Y. The dimension of the second terminal portion 68*b* in the width-wise direction X is greater than the dimension of the semiconductor laser element mount portion 63*b* in the width-wise direction X. The dimension of the second terminal portion 68*b* in the length-wise direction Y is equal to the dimension of the semiconductor laser element mount portion 63*b* in the length-wise direction Y. As shown in FIG. 6, the second terminal portion 68*b* overlaps with the fourth drive conductors 64A and 64B in the thickness-wise direction Z.

As shown in FIG. 3, the two fourth terminal conductors 69A and 69B are disposed on an end of the base back surface 51*b* located close to the first base side surface 51*c* in the length-wise direction Y. The two fourth terminal conductors 69A and 69B are located separate from the first base side surface 51*c* in the length-wise direction Y. The fourth terminal conductor 69A is disposed on an end of the base back surface 51*b* located close to the third base side surface 51*e*. The fourth terminal conductor 69A is located separate from the third base side surface 51*e* in the width-wise direction X. The fourth terminal conductor 69B is disposed on an end of the base back surface 51*b* located close to the fourth base side surface 51*f*. The fourth terminal conductor 69B is located separate from the fourth base side surface 51*f* in the width-wise direction X. The two fourth terminal conductors 69A and 69B are spaced apart from the second terminal portion 68*b* in the width-wise direction X at opposite sides of the second terminal portion 68*b* in the width-wise direction X. As viewed in the length-wise direction Y, the fourth terminal conductor 69A is located overlapping the first terminal conductor 66A. As viewed in the length-wise direction Y, the fourth terminal conductor 69B is located overlapping the first terminal conductor 66B. As viewed in the width-wise direction X, the two fourth terminal conductors 69A and 69B are located overlapping the second terminal portion 68*b*. As viewed in the thickness-wise direction Z, the fourth terminal conductor 69A is located overlapping the fourth drive conductor 64A, and the fourth terminal conductor 69B overlaps the fourth drive conductor 64B.

In plan view, each of the two fourth terminal conductors 69A and 69B is rectangular such that the long sides extend in the width-wise direction X and the short sides extend in the length-wise direction Y. The dimension of the two fourth terminal conductors 69A and 69B in the width-wise direction X is greater than the dimension of the two first terminal conductors 66A and 66B in the width-wise direction X. The dimension of the two fourth terminal conductors 69A and 69B in the width-wise direction X is less than the dimension of the two fourth drive conductors 64A and 64B in the width-wise direction X. The dimension of the two fourth terminal conductors 69A and 69B in the length-wise direction Y is less than the dimension of the two first terminal conductors 66A and 66B in the length-wise direction Y. The dimension of the two fourth terminal conductors 69A and 69B in the length-wise direction Y is equal to the dimension of the two fourth drive conductors 64A and 64B in the length-wise direction Y. When a difference in the dimension in the length-wise direction Y between the two fourth terminal conductors 69A and 69B and the two fourth drive conductors 64A and 64B is, for example, within 5% of the dimension of the two fourth drive conductors 64A and 64B in the length-wise direction Y, it is considered that the dimension of the two fourth terminal conductors 69A and 69B in the length-wise direction Y is equal to the dimension of the two fourth drive conductors 64A and 64B in the length-wise direction Y. In the present embodiment, the fourth terminal conductors 69A and 69B are identical in shape in plan view. The planar shape of each of the fourth terminal conductors 69A and 69B may be changed in any manner. For example, in plan view, the shape of the fourth terminal conductor 69A may differ from the shape of the fourth terminal conductor 69B.

The second terminal conductor 67 and the control terminal conductor 70 are disposed on an end of the base back surface 51*b* located close to the second base side surface 51*d* in the length-wise direction Y. The second terminal conductor 67 and the control terminal conductor 70 are separated from each other in the width-wise direction X and arranged in order in the width-wise direction X. The second terminal conductor 67 and the control terminal conductor 70 are located separate from the second base side surface 51*d* in the length-wise direction Y.

The second terminal conductor 67 is disposed on an end of the base back surface 51*b* located close to the fourth base side surface 51*f* in the width-wise direction X. The second terminal conductor 67 is located separate from the fourth base side surface 51*f* in the width-wise direction X. As viewed in the length-wise direction Y, the second terminal conductor 67 is located overlapping the first terminal conductor 66B, the fourth terminal conductor 69B, and an end of the third terminal conductor 68 located close to the fourth base side surface 51*f*. As viewed in the thickness-wise direction Z, the second terminal conductor 67 is located overlapping the second drive conductor 62, which is shown in FIG. 2.

In plan view, the second terminal conductor 67 is rectangular such that the long sides extend in the width-wise direction X and the short sides extend in the length-wise direction Y. The dimension of the second drive conductor 62 in the length-wise direction Y is less than the dimension of the two first terminal conductors 66A and 66B and the third terminal conductor 68 in the length-wise direction Y. The dimension of the second terminal conductor 67 in the width-wise direction X is greater than the dimension of the two first terminal conductors 66A and 66B in the width-wise direction X. The dimension of the second terminal conductor 67 in the width-wise direction X is greater than the dimension of the two fourth terminal conductors 69A and 69B in the width-wise direction X. The planar shape of the second drive conductor 62 may be changed in any manner. In an example, in plan view, the second drive conductor 62 may be square or may be rectangular such that the long sides extend in the length-wise direction Y and the short sides extend in the width-wise direction X.

The control terminal conductor 70 is disposed on an end of the base back surface 51b located close to the third base side surface 51e in the width-wise direction X. The control terminal conductor 70 is located separate from the third base side surface 51e in the width-wise direction X. As viewed in the length-wise direction Y, the control terminal conductor 70 is located overlapping the first terminal conductor 66A, the fourth terminal conductor 69A, and an end of the third terminal conductor 68 located close to the third base side surface 51e. As viewed in the thickness-wise direction Z, the control terminal conductor 70 is located overlapping the control conductor 65.

In plan view, the control terminal conductor 70 is rectangular such that the long sides extend in the width-wise direction X and the short sides extend in the length-wise direction Y. The dimension of the control terminal conductor 70 in the length-wise direction Y is less than the dimension of the two first terminal conductors 66A and 66B in the length-wise direction Y The dimension of the control terminal conductor 70 in the width-wise direction X is greater than the dimension of the two first terminal conductors 66A and 66B in the width-wise direction X. The dimension of the control terminal conductor 70 in the width-wise direction X is greater than the dimension of the two fourth terminal conductors 69A and 69B in the width-wise direction X. The planar shape of the control terminal conductor 70 may be changed in any manner. In an example, in plan view, the control terminal conductor 70 may be square or may be rectangular such that the long sides extend in the length-wise direction Y and the short sides extend in the width-wise direction X.

Referring to FIGS. 2 and 3, a gap Gs1 between the first drive conductor 61A and the fourth drive conductor 64A in the length-wise direction Y and a gap Gs1 between the first drive conductor 61B and the fourth drive conductor 64B in the length-wise direction Y are smaller than a gap Gr1 between the first terminal conductor 66A and the fourth terminal conductor 69A in the length-wise direction Y and a gap Gr1 between the first terminal conductor 66B and the fourth terminal conductor 69B in the length-wise direction Y. In other words, the gaps Gr1 are larger than the gaps Gs1. A gap Gs2 between the third drive conductor 63 and each of the first drive conductors 61A and 61B in the width-wise direction X is smaller than a gap Gr2 between the third terminal conductor 68 and each of the first terminal conductors 66A and 66B in the width-wise direction X. In other words, the gaps Gr2 are larger than the gaps Gs2. A gap Gs3 between the second drive conductor 62 and each of the first drive conductors 61A and 61B and the switching element mount portion 63a of the third drive conductor 63 in the length-wise direction Y is less than a gap Gr3 between the second terminal conductor 67 and each of the first terminal conductor 66A and the first terminal portion 68a of the third terminal conductor 68 in the length-wise direction Y In other words, the gaps Gr3 are larger than the gaps Gs3. A gap Gs4 between the semiconductor laser element mount portion 63b of the third drive conductor 63 and each of the fourth drive conductors 64A and 64B in the width-wise direction X is smaller than a gap Gr4 between the second terminal portion 68b of the third terminal conductor 68 and each of the fourth terminal conductors 69A and 69B in the width-wise direction X. In other words, the gaps Gr4 are larger than the gaps Gs4. A gap Gs5 between the control conductor 65 and each of the first drive conductor 61B and the switching element mount portion 63a of the third drive conductor 63 in the length-wise direction Y is smaller than a gap Gr5 between the control terminal conductor 70 and each of the first terminal conductor 66B and the first terminal portion 68a of the third terminal conductor 68 in the length-wise direction Y In other words, the gaps Gr5 are larger than the gaps Gs5. A gap Gs6 between the second drive conductor 62 and the control conductor 65 in the width-wise direction X is equal to a gap Gr6 between the second terminal conductor 67 and the control terminal conductor 70 in the width-wise direction X. When a difference between the gap Gs6 and the gap Gr6 is within, for example, 5% of the gap Gs6, it is considered that the gap Gs6 is equal to the gap Gr6. The gap Gr6 may be larger than the gap Gs6.

As shown in FIGS. 2 to 5, 7, and 8, multiple joints 60C are arranged to join the main surface conductor 60A and the back surface conductor 60B. The joints 60C have identical structures and each include a through hole 71 and a conductive portion 72 embedded in the through hole 71. The through hole 71 is defined by a metal film 71a formed on the entire wall surface defining a through hole 52 that extends through the base member 51 in the thickness-wise direction Z. One end of the metal film 71a is located close to the base main surface 51a of the base member 51 and joined to the main surface conductor 60A. Another end of the metal film 71a is located close to the base back surface 51b of the base member 51 and joined to the back surface conductor 60B. In the present embodiment, the material forming the metal film 71a is the same as the material forming the main surface conductor 60A and the back surface conductor 60B. The material forming the conductive portions 72 is, for example, a metal. In the present embodiment, Cu (copper) is used.

As shown in FIG. 3, the joints 60C include first drive joints 73A and 73B, second drive joints 74, third drive joints 75, fourth drive joints 76A and 76B, and control joints 77. In the present embodiment, the through holes 71 (for example, refer to FIG. 4) of the first drive joints 73, the second drive joints 74, the third drive joints 75, the fourth drive joints 76, and the control joints 77 are equal to each other in the outer diameter and the inner diameter.

As shown in FIGS. 2 to 4, the third drive joints 75 connect the third drive conductor 63 and the third terminal conductor 68. The third drive joints 75 include multiple (in the present embodiment, nine) switching element joints 75a, one semiconductor laser element joint 75b, and one intermediate joint 75c. The number of each of switching element joints 75a, semiconductor laser element joints 75b, and intermediate joints 75c is not limited to the above number and may be changed in any manner.

The switching element joints 75a are disposed on the switching element mount portion 63a of the third drive conductor 63. Eight out of the nine switching element joints 75a are located overlapping the source electrode 22 of the switching element 20 as viewed in the thickness-wise direction Z. The remaining one switching element joint 75a is located overlapping the gate electrode 23 of the switching element 20 as viewed in the thickness-wise direction Z. As viewed in the thickness-wise direction Z, the nine switching element joints 75a are located overlapping the drain electrode 21 of the switching element 20.

The semiconductor laser element joint 75b is disposed on the semiconductor laser element mount portion 63b of the third drive conductor 63. As viewed in the thickness-wise direction Z, the semiconductor laser element joint 75b is located overlapping the semiconductor laser element 10.

The intermediate joint 75c is disposed across the border (the border line Lb shown in FIGS. 2 and 3) between the switching element mount portion 63a and the semiconductor laser element mount portion 63b of the third drive conductor 63. That is, the intermediate joint 75c is disposed between the semiconductor laser element joint 75b and the switching element joints 75a in the length-wise direction Y. In other words, the intermediate joint 75c is disposed between the semiconductor laser element 10 and the switching element 20 in the length-wise direction Y.

Figure 5:
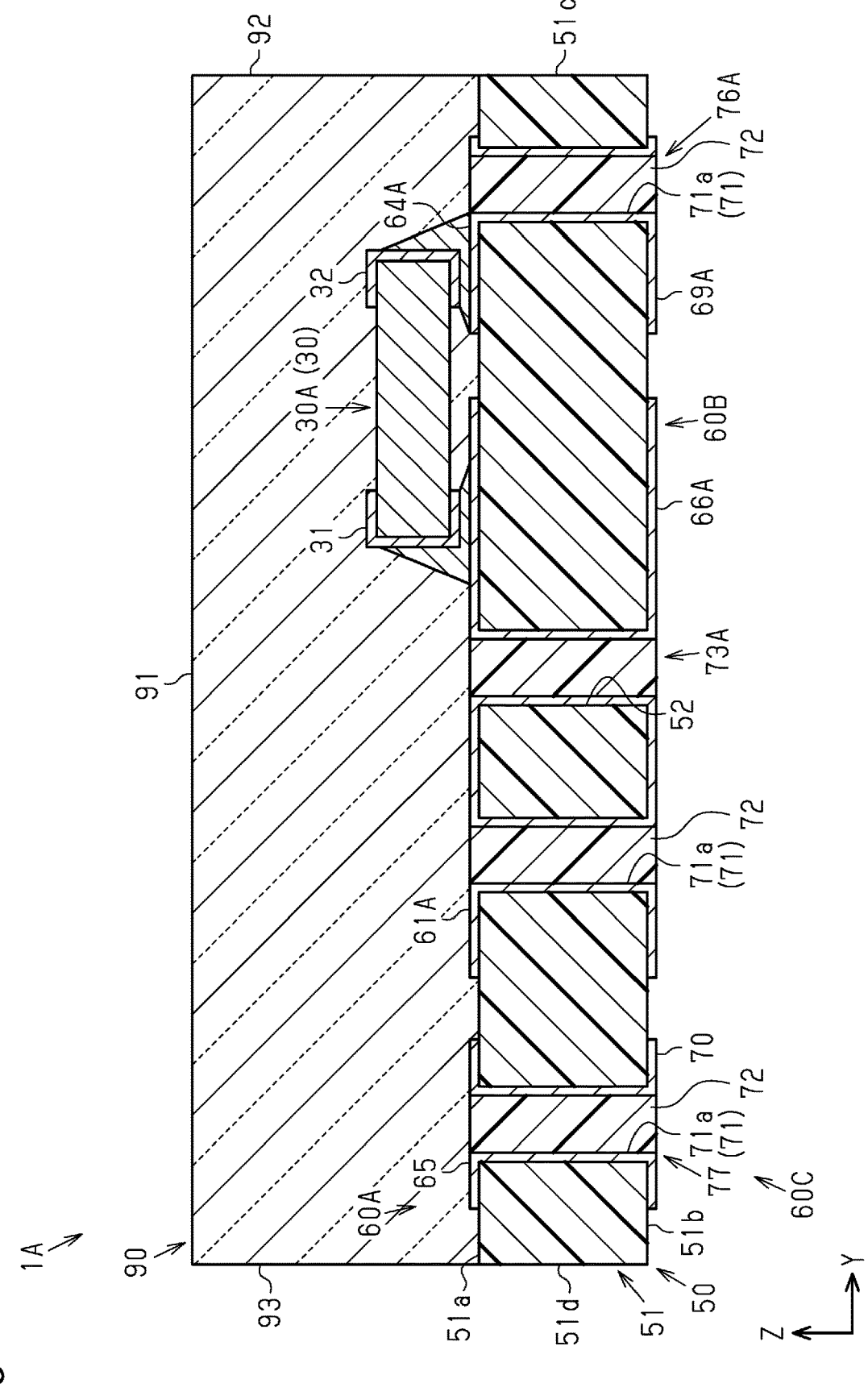
FIG. 5 is a cross-sectional view taken along line 5-5 in FIG. 2.

As shown in FIGS. 2, 3, and 5, the multiple (in the present embodiment, two) first drive joints 73A connect the first drive conductor 61A and the first terminal conductor 66A. The first drive joints 73A are arranged to be separate from each other in the length-wise direction Y. The first drive joints 73A are disposed on the first drive conductor 61A and the first terminal conductor 66A at a position close to the third base side surface 51e in the width-wise direction X. The first drive joints 73A are located closer to the second drive conductor 62 (the second terminal conductor 67) than the capacitor 30A in the length-wise direction Y.

The multiple (in the present embodiment, two) first drive joints 73B connect the first drive conductor 61B and the first terminal conductor 66B. The first drive joints 73B are separated from each other in the length-wise direction Y and arranged at the same positions as the first drive joints 73A in the length-wise direction Y. The first drive joints 73B are disposed on the first drive conductor 61B and the first terminal conductor 66B at a position close to the fourth base side surface 51f in the width-wise direction X. The first drive joints 73B are located closer to the control conductor 65 (the control terminal conductor 70) than the capacitor 30B in the length-wise direction Y. The number of first drive joints 73A and 73B is not limited to the above number and may be changed in any manner.

As shown in FIGS. 2, 3, and 6, the fourth drive joint 76A connects the fourth drive conductor 64A and the fourth drive joints 76A. As viewed in the length-wise direction Y, the fourth drive joint 76A is located overlapping the capacitor 30A. The fourth drive joint 76A is disposed on the fourth drive conductor 64A at a position closer to the first base side surface 51c than the capacitor 30A in the length-wise direction Y.

The fourth drive joint 76B connects the fourth drive conductor 64B and the fourth drive joint 76B. As viewed in the length-wise direction Y, the fourth drive joint 76A is located overlapping the capacitor 30B. The fourth drive joint 76B is disposed on the fourth drive conductor 64B at a position closer to the first base side surface 51c than the capacitor 30B in the length-wise direction Y. Multiple fourth drive joints 76A and multiple fourth drive joints 76B may be provided.

Figure 8:
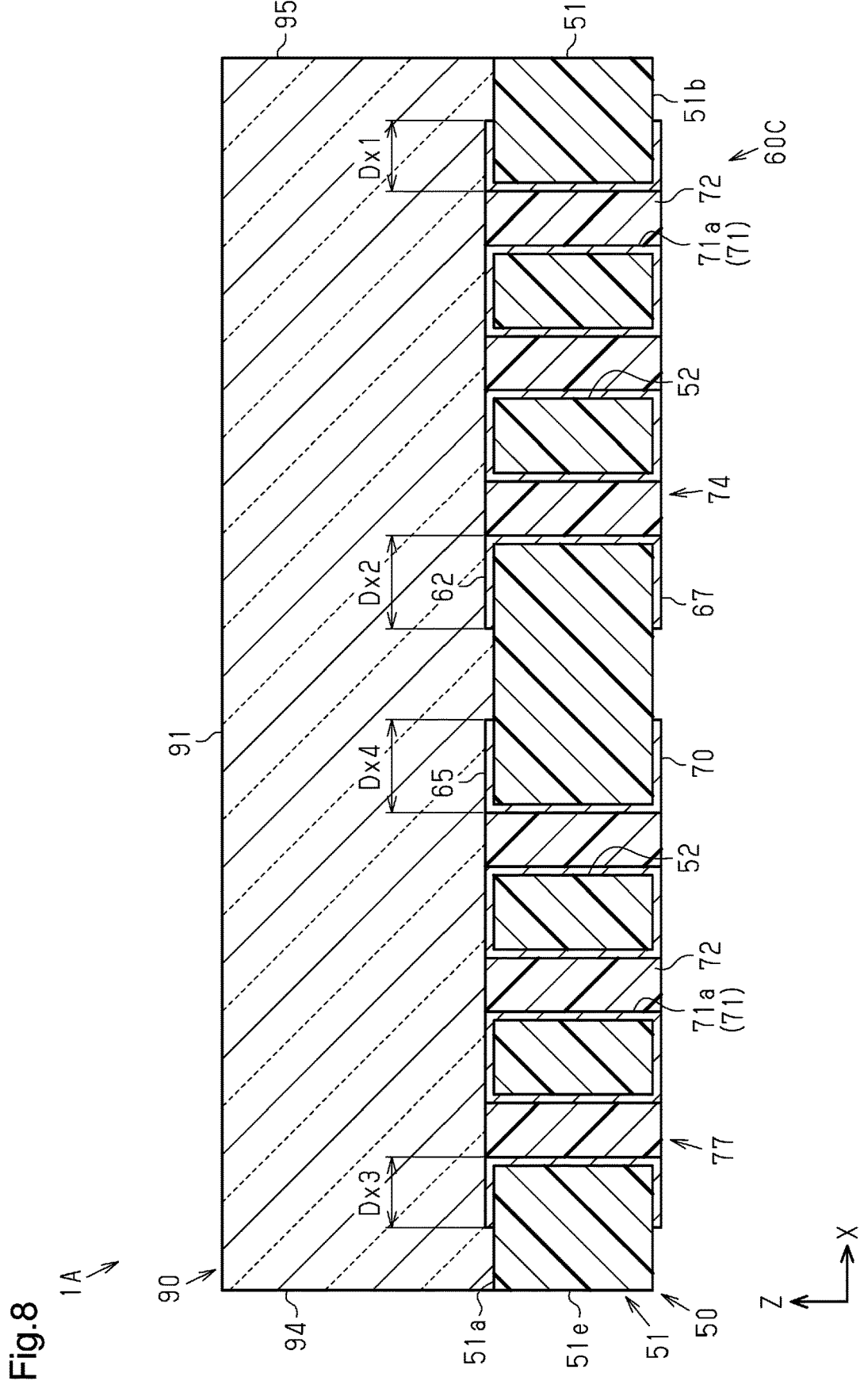
FIG. 8 is a cross-sectional view taken along line 8-8 in FIG. 2.

As shown in FIGS. 2, 3, and 8, the multiple (in the present embodiment, three) second drive joints 74 connect the second drive conductor 62 and the second terminal conductor 67. The second drive joints 74 are arranged to be separate from each other in the width-wise direction X. Among the three second drive joints 74, the second drive joint 74 located the closest to the third base side surface 51e is separated by a distance Dx2 in the width-wise direction X from an edge of the second drive conductor 62 located close to the third base side surface 51e. Among the three second drive joints 74, the second drive joint 74e located the closest to the fourth base side surface 51f is separated by a distance Dx1 in the width-wise direction X from an edge of the second drive conductor 62 located close to the fourth base side surface 51f. The distance Dx2 is greater than the distance Dx1. The number of second drive joints 74 is not limited to the above number and may be changed in any manner.

The multiple (in the present embodiment, three) control joints 77 connect the control conductor 65 and the control terminal conductor 70. The control joints 77 are arranged to be separate from each other in the width-wise direction X. Among the three control joints 77, the control joint 77 located the closest to the fourth base side surface 51f is separated by a distance Dx4 in the width-wise direction X from an edge of the control conductor 65 located close to the fourth base side surface 51f. Among the three control joints 77, the control joint 77 located the closest to the third base side surface 51e is separated by a distance Dx3 in the width-wise direction X from an edge of the control conductor 65 located close to the third base side surface 51e. The distance Dx4 is greater than the distance Dx3. The number of control joints 77 is not limited to the above number and may be changed in any manner.

The connection structure of the semiconductor laser element 10, the switching element 20, the capacitors 30A and 30B, and the conductor 60 will now be described. The capacitor 30A is connected to the first drive conductor 61A and the fourth drive conductor 64A. The capacitor 30A is located extending over the gap between the first drive conductor 61A and the fourth drive conductor 64A in the length-wise direction Y. In the present embodiment, the capacitor 30A is located so that the first terminal 31 and the second terminal 32 are arranged in the length-wise direction Y. The first terminal 31 of the capacitor 30A is bonded to the first drive conductor 61A by a conductive bonding material such as Ag paste or solder. The second terminal 32 of the capacitor 30A is bonded to the fourth drive conductor 64A by a conductive bonding material. The second terminal 32 is disposed on the fourth drive conductor 64A at a position closer to the first drive conductor 61A than the fourth drive joint 76A in the length-wise direction Y.

The capacitor 30B is connected to the first drive conductor 61B and the fourth drive conductor 64B. The capacitor 30B is located extending over the gap between the first drive conductor 61B and the fourth drive conductor 64B in the length-wise direction Y. In the present embodiment, the capacitor 30B is located so that the first terminal 31 and the second terminal 32 are arranged in the length-wise direction Y. The first terminal 31 of the capacitor 30B is bonded to the first drive conductor 61B by a conductive bonding material. The second terminal 32 of the capacitor 30B is bonded to the fourth drive conductor 64B by a conductive bonding material. The second terminal 32 is disposed on the fourth drive conductor 64B at a position closer to the first drive conductor 61B than the fourth drive joint 76B in the length-wise direction Y.

As shown in FIGS. 2 and 4, the semiconductor laser element 10 is bonded to the third drive conductor 63 by a conductive bonding material such as silver (Ag) paste or solder. More specifically, the semiconductor laser element 10 is disposed on the semiconductor laser element mount portion 63b of the third drive conductor 63 at a position closer to the first base side surface 51c than the intermediate joint 75c. As viewed in the width-wise direction X, the semiconductor laser element 10 overlaps the fourth drive conductors 64A and 64B and the second terminals 32 of the capacitors 30A and 30B. The semiconductor laser element 10 is located so that the cathode electrode 12 faces toward the third drive conductor 63 in the thickness-wise direction Z. The cathode electrode 12 of the semiconductor laser element 10 is bonded to the third drive conductor 63 by a conductive bonding material.

The switching element 20 is bonded to the third drive conductor 63 by a conductive bonding material such as Ag paste or solder. More specifically, the semiconductor laser element 10 is mounted on the switching element mount portion 63a of the third drive conductor 63 at a position closer to the second base side surface 51d than the intermediate joint 75c. As viewed in the width-wise direction X, the switching element 20 overlaps the first drive conductors 61A and 61B and the first terminals 31 of the capacitors 30A and 30B. The switching element 20 is located so that the drain electrode 21 faces toward the third drive conductor 63 in the thickness-wise direction Z. The drain electrode 21 is bonded to the third drive conductor 63 by a conductive bonding material. Thus, the drain electrode 21 is electrically connected to the cathode electrode 12 of the semiconductor laser element 10 by the third drive conductor 63.

As shown in FIG. 2, the anode electrode 11 of the semiconductor laser element 10 and the source electrode 22 and the gate electrode 23 of the switching element 20 face a side opposite from the side of the support substrate 50 in the thickness-wise direction Z. The anode electrode 11, the source electrode 22, and the gate electrode 23 are electrically connected to the first drive conductors 61A and 61B, the second drive conductor 62, the fourth drive conductors 64A and 64B, and the control conductor 65 by connection members 80.

The connection members 80 include first drive connection members 81 and 82, a second drive connection member 83, a control connection member 84, and laser connection members 85 and 86. The connection members 80 are wires formed of metal such as, for example, gold (Au), copper (Cu), or aluminum (Al). In the present embodiment, the connection members 80 are formed by wire bonding.

The first drive connection members 81 connect the source electrode 22 and the first drive conductor 61A. Although not particularly limited, the number of first drive connection members 81 is three in the present embodiment. The three first drive connection members 81 are arranged to be separate from each other in the length-wise direction Y. Each first drive connection member 81 includes a first end 81a and a second end 81b. The first end 81a is bonded to the source electrode 22. The second end 81b is bonded to the first drive conductor 61A. The first end 81a of each of the three first drive connection members 81 is disposed on the source electrode 22 at a position closer to the semiconductor laser element 10 than the gate electrode 23 in the length-wise direction Y and closer to the first drive conductor 61A than the gate electrode 23 in the width-wise direction X. The second end 81b of each of the three first drive connection members 81 is disposed on the first drive conductor 61A at a position closer to the control conductor 65 than the capacitor 30A in the length-wise direction Y and closer to the switching element 20 than the first drive joints 73A in the width-wise direction X. As viewed in the length-wise direction Y, the second end 81b is located overlapping a portion of the capacitor 30A located closer to the switching element 20 than the center in the width-wise direction X.

The first drive connection members 82 connect the source electrode 22 and the first drive conductor 61B. Although not particularly limited, the number of first drive connection members 82 is three in the present embodiment. That is, the number of first drive connection members 82 is equal to the number of first drive connection members 81. The three first drive connection members 82 are arranged to be separate from each other in the length-wise direction Y. Each first drive connection member 82 includes a first end 82a and a second end 82b. The first end 82a is bonded to the source electrode 22. The second end 82b is bonded to the first drive conductor 61B. The first end 82a of each of the three first drive connection members 82 is disposed on the source electrode 22 at a position closer to the semiconductor laser element 10 than the gate electrode 23 in the length-wise direction Y and closer to the first drive conductor 61B than the gate electrode 23 in the width-wise direction X. The second end 82b of each of the three first drive connection members 82 is disposed on the first drive conductor 61B at a position closer to the second drive conductor 62 than the capacitor 30B in the length-wise direction Y and closer to the switching element 20 than the first drive joints 73B in the width-wise direction X. As viewed in the length-wise direction Y, the second end 82b is located overlapping a portion of the capacitor 30B located closer to the switching element 20 than the center in the width-wise direction X.

The second drive connection member 83 connects the source electrode 22 and the second drive conductor 62. Although not particularly limited, the number of second drive connection members 83 is one in the present embodiment. The second drive connection member 83 is disposed closer to the second base side surface 51d than the three first drive connection members 81. The second drive connection member 83 includes a first end 83a and a second end 83b. The first end 83a is bonded to the source electrode 22. The second end 83b is bonded to the second drive conductor 62. The first end 83a is disposed on an end of the source electrode 22 located close to the second drive conductor 62 in the length-wise direction Y. The second end 83b is disposed on a portion of the second drive conductor 62 overlapping the source electrode 22 as viewed in the length-wise direction Y at an end of the second drive conductor 62 located close to the switching element 20 in the length-wise direction Y. In the present embodiment, the second end 83b is disposed on the second drive conductor 62 at a position closer to the control conductor 65 than the three second drive joints 74.

The control connection member 84 connects the gate electrode 23 and the control conductor 65. Although not particularly limited, the number of control connection members 84 is one in the present embodiment. The control connection member 84 includes a first end 84a and a second end 84b. The first end 84a is bonded to the gate electrode 23. The second end 84b is disposed on an end of the control conductor 65 located close to the second drive conductor 62 in the width-wise direction X. In the present embodiment, the second end 84b is disposed on the control conductor 65 at a position closer to the second drive conductor 62 than the three control joints 77.

The laser connection members 85 connect the anode electrode 11 of the semiconductor laser element 10 and the fourth drive conductor 64A. Although not particularly limited, the number of laser connection members 85 is two in the present embodiment. The two laser connection members 85 are arranged to be separate from each other in the length-wise direction Y. Each laser connection member 85 includes a first end 85a and a second end 85b. The first end 85a is connected to the anode electrode 11. More specifically, the first end 85a is disposed on a center of the anode electrode 11 in the width-wise direction X. The second end 85b is connected to the fourth drive conductor 64A. More specifically, the second end 85b is disposed on the fourth drive conductor 64A at a position closer to the semiconductor laser element 10 in the width-wise direction X than the center of the fourth drive conductor 64A in the width-wise direction X.

The laser connection members 86 connect the anode electrode 11 and the fourth drive conductor 64B. Although not particularly limited, the number of laser connection members 86 is two in the present embodiment. The two laser connection members 86 are arranged to be separate from each other in the length-wise direction Y. Each laser connection member 86 includes a first end 86a and a second end 86b. The first end 86a is connected to the anode electrode 11. More specifically, the first end 86a is disposed on a center of the anode electrode 11 in the width-wise direction X. In plan view, the first ends 85a of the laser connection members 85 alternate with the first ends 86a of the laser connection members 86 in the length-wise direction Y. The second end 86b is connected to the fourth drive conductor 64B. More specifically, the second end 86b is disposed on the fourth drive conductor 64B at a position closer to the semiconductor laser element 10 in the width-wise direction X than the center of the fourth drive conductor 64B in the width-wise direction X.

As shown in FIGS. 4 to 8, the sealing member 90 is stacked on the base main surface 51a of the base member 51 of the support substrate 50 in the thickness-wise direction Z. The sealing member 90 is transmissive to the pulsed laser beam of the semiconductor laser element 10 and seals the main surface conductor 60A, the semiconductor laser element 10, the switching element 20, the capacitor 30, and the connection members 80. More specifically, the sealing member 90 includes a transparent or semitransparent portion to which the pulsed laser beam of the semiconductor laser element 10 is emitted. The sealing member 90 does not necessarily have to be transparent or semitransparent in a portion other than the portion to which the pulsed laser beam is emitted. Thus, the sealing member 90 may include two types of members, that is, the transparent or semitransparent portion and a non-transparent portion. In the present embodiment, the entirety is transparent or semitransparent. The material forming the sealing member 90 may be, for example, a transparent epoxy resin or silicone resin.

The sealing member 90 includes a sealing main surface 91, a first sealing side surface 92, a second sealing side surface 93, a third sealing side surface 94, and a fourth sealing side surface 95. The sealing main surface 91 is a surface of the sealing member 90 facing a side opposite from the support substrate 50 in the thickness-wise direction Z. That is, the sealing main surface 91 and the element main surface 24a of the switching element 20 face in the same direction. Each of the sealing side surfaces 92 to 95 is formed between the sealing main surface 91 and the support substrate 50 in the thickness-wise direction Z and extends in a direction intersecting the sealing main surface 91. The first sealing side surface 92 and the second sealing side surface 93 face in opposite directions in the length-wise direction Y. The first sealing side surface 92 and the first base side surface 51c of the base member 51 face in the same direction in the length-wise direction Y. The second sealing side surface 93 and the second base side surface 51d of the base member 51 face in the length-wise direction Y. The third sealing side surface 94 and the fourth sealing side surface 95 face in opposite directions in the width-wise direction X. The third sealing side surface 94 and the third base side surface 51e of the base member 51 face in the same direction in the width-wise direction X. The fourth sealing side surface 95 and the fourth base side surface 51f of the base member face in the same direction in the width-wise direction X. In the present embodiment, a laser beam L from the semiconductor laser element 10 is emitted through the first sealing side surface 92 of the sealing member 90. In the present embodiment, the first sealing side surface 92 of the sealing member 90 is flat and smooth. This limits diffusion of the laser beam L, thereby increasing the output efficiency of the laser beam.

An example of the detailed structure of the semiconductor laser element 10 will be described.

Figure 9:
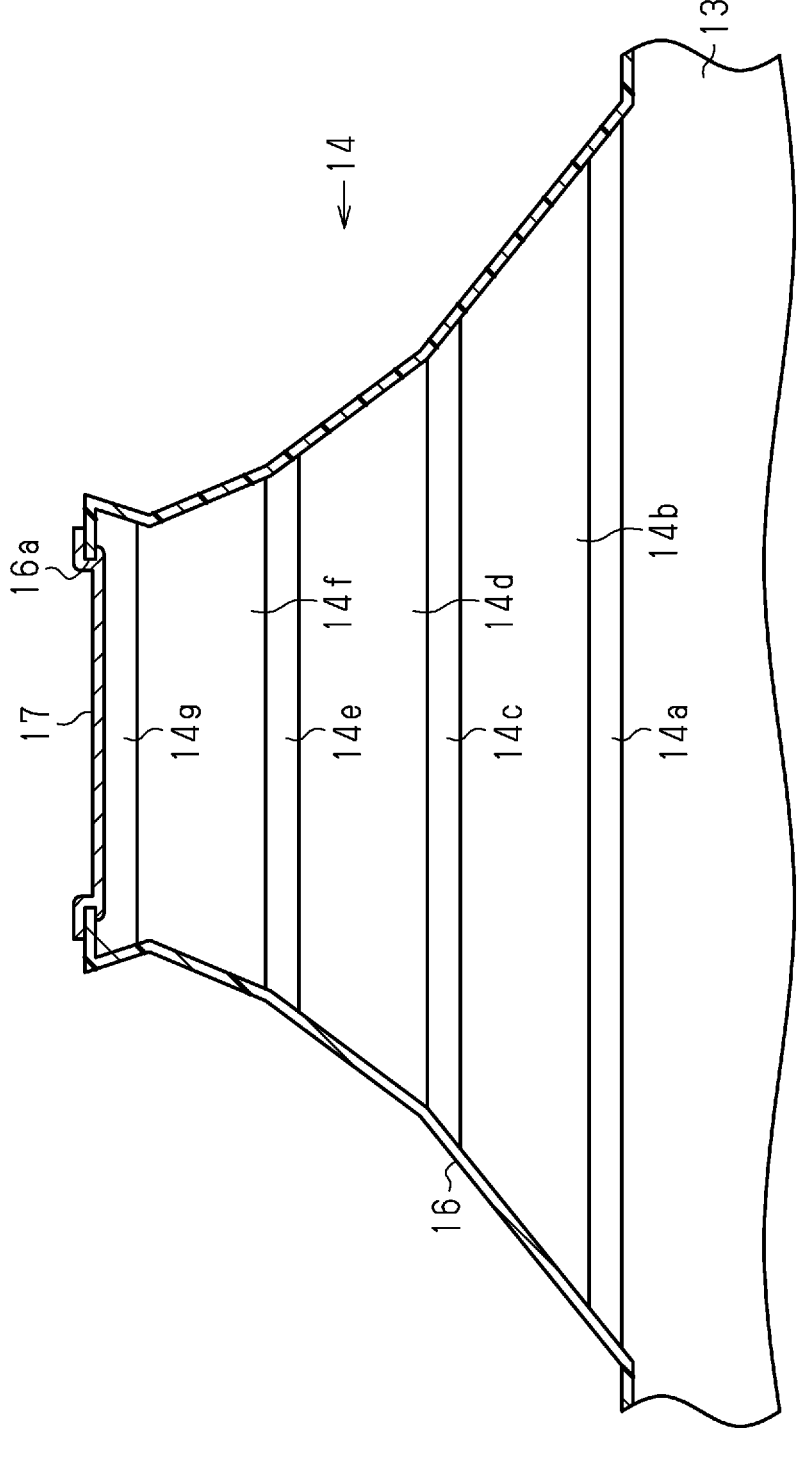
FIG. 9 is a cross-sectional view of a semiconductor laser element of the first embodiment showing a schematic cross-sectional structure of the element.
Figure 9:
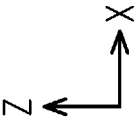
Figure 10:
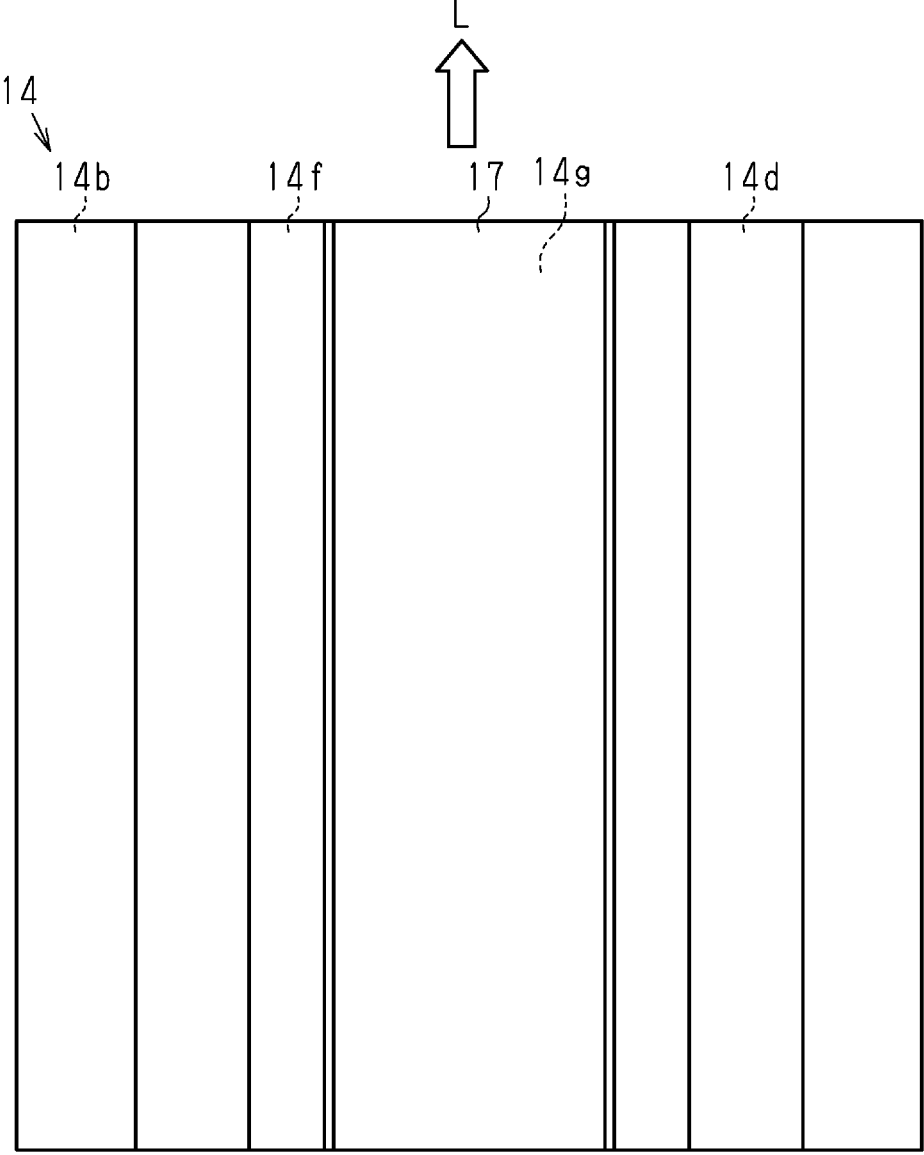
FIG. 10 is a schematic plan view of the semiconductor laser element of the first embodiment.
Figure 10:
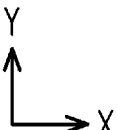

As shown in FIGS. 9 and 10, the semiconductor laser element 10 includes a substrate 13 and a mesa semiconductor light-emitting layer 14 stacked on the substrate 13 in the thickness-wise direction Z. The semiconductor light-emitting layer 14 corresponds to a light-emitting portion.

The substrate 13 is formed of an n-type semiconductor substrate including gallium arsenide (GaAs). The n-type impurity includes at least one of silicon (Si), tellurium (Te), and selenium (Se).

The semiconductor light-emitting layer 14 generates the laser beam L. The semiconductor light-emitting layer 14 generates the laser beam L having a peak wavelength of 0.7 $\mu$m or greater and 2.5 $\mu$m or less. That is, the semiconductor light-emitting layer 14 generates a laser beam L in a near-infrared region. Preferably, the semiconductor light-emitting layer 14 generates a laser beam L having a peak wavelength of 800 nm or greater and 1000 nm or less. That is, the semiconductor light-emitting layer 14 generates a laser beam L in an infrared region. The semiconductor light-emitting layer 14 has a mesa structure 15 including an n-type buffer layer 14a, a first light-emitting unit layer 14b, a first tunnel junction layer 14c, a second light-emitting unit layer 14d, a second tunnel junction layer 14e, a third light-emitting unit layer 14f, and a p-type contact layer 14g.

The n-type buffer layer 14a is stacked on the substrate 13. The n-type buffer layer 14a includes GaAs. The n-type buffer layer 14a includes at least one of Si, Te, and Se as an n-type impurity. The concentration of the n-type impurity in the n-type buffer layer 14a is, for example, $1\times10^{18}$ cm$^{-3}$ or greater and $1\times10^{19}$ cm$^{-3}$ or less.

The light-emitting unit layers 14b, 14d, and 14f generate the laser beam L by combining holes and electrons. The first light-emitting unit layer 14b, the second light-emitting unit layer 14d, and the third light-emitting unit layer 14f are stacked on the n-type buffer layer 14a in order. As indicated by the white arrow in FIG. 10, a laser beam is emitted from the light-emitting unit layers 14b, 14d, and 14f in the width-wise direction X.

The first tunnel junction layer 14c and the second tunnel junction layer 14e are disposed between the light-emitting units that are adjacent to each other in the stacking direction. More specifically, the first tunnel junction layer 14c is disposed between the first light-emitting unit layer 14b and the second light-emitting unit layer 14d. The second tunnel junction layer 14e is disposed between the second light-emitting unit layer 14d and the third light-emitting unit layer 14f. The tunnel junction layers 14c and 14e generate a tunneling current caused by a tunneling effect. The tunneling current flows to the light-emitting unit layers 14b, 14d, and 14f.

The p-type contact layer 14g is formed on the third light-emitting unit layer 14f. The p-type contact layer 14g includes GaAs. The p-type contact layer 14g includes carbon (C) as a p-type impurity.

The semiconductor light-emitting layer 14 is covered by an insulation layer 16. The insulation layer 16 is film-shaped. The insulation layer 16 may include silicon nitride (Si₃N₄) or silicon oxide such as SiO₂ and SiO. In the present embodiment, the insulation layer 16 includes silicon nitride. A contact opening 16a is formed in a portion of the insulation layer 16 covering the top of the mesa structure 15 to expose the semiconductor light-emitting layer 14. A contact electrode 17 is formed in the contact opening 16a. The contact electrode 17 is electrically connected to the semiconductor light-emitting layer 14. The contact electrode 17 extends from the contact opening 16a onto the insulation layer 16. The anode electrode 11 (refer to FIGS. 4 and 6) is formed on the contact electrode 17. In the thickness-wise direction of the substrate 13, the cathode electrode 12 (refer to FIGS. 4 and 6) is formed on a substrate back surface that is located at the opposite side of the substrate 13 from the mesa structure.

Operation

The operation of the semiconductor laser device 1A of the present embodiment will now be described.

Figure 11:
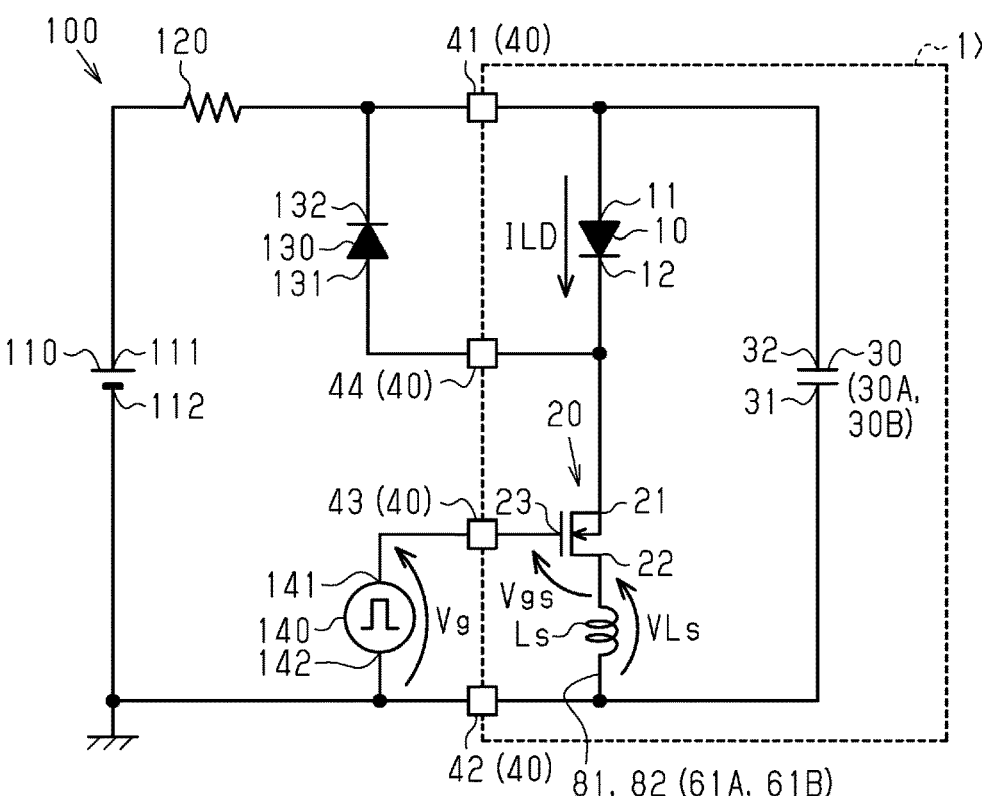
FIG. 11 is a schematic circuit diagram of a laser system including a comparative example of a semiconductor laser device.

FIG. 11 is a schematic circuit diagram of a laser system 100 including a comparative example of a semiconductor laser device 1X. The semiconductor laser device 1X of the comparative example differs from the semiconductor laser device 1A of the present embodiment in that the input electrode 142 of the driver circuit 140 is connected to the negative electrode of the power supply 110 and the capacitor 30 on the circuit.

Figure 12:
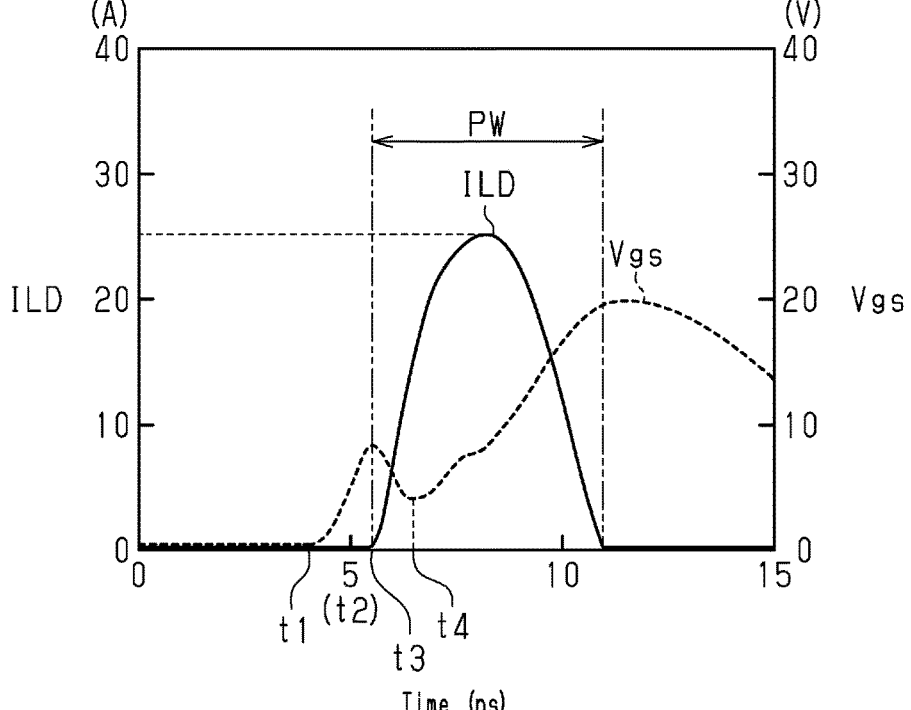
FIG. 12 is a graph showing changes in the current flowing to a semiconductor laser element and the voltage applied to a gate electrode of a switching element in the semiconductor laser device of the comparative example.
Figure 13:
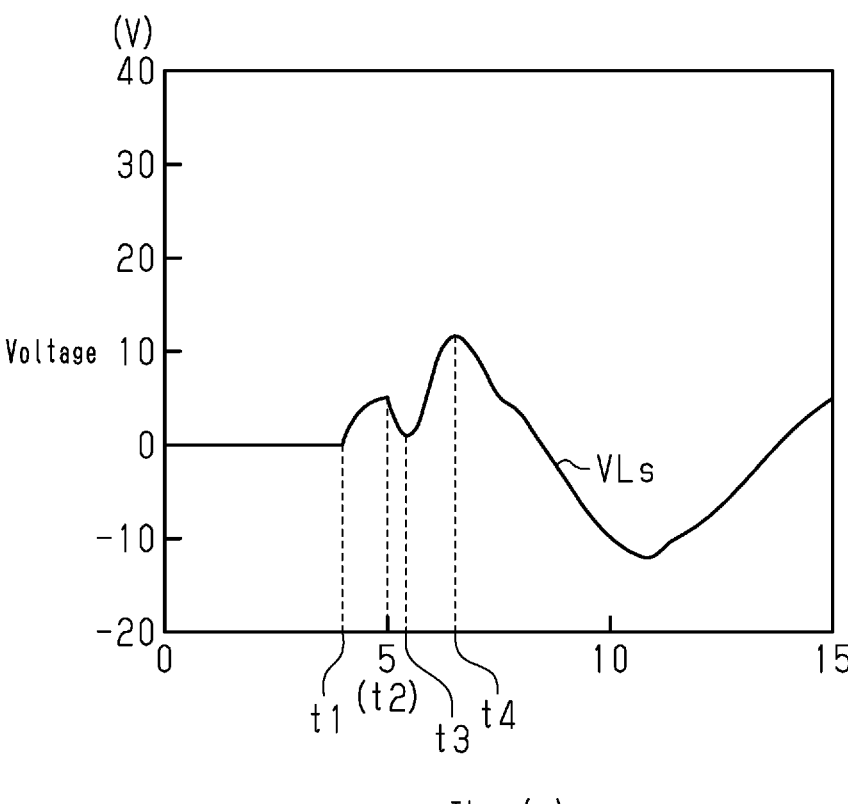
FIG. 13 is a graph showing changes in the electromotive force of parasitic inductance in the semiconductor laser device of the comparative example.

FIG. 12 is a graph showing changes in the current flowing to the semiconductor laser element 10 and the voltage applied to the gate electrode 23 of the switching element 20 when the laser system 100 including the semiconductor laser device 1X of the comparative example is driven. FIG. 13 is a graph showing changes in the voltage applied to the first drive connection members 81 and 82 when the laser system 100 including the semiconductor laser device 1X of the comparative example is driven.

As shown in FIG. 11, when the power supply 110 of the laser system 100 including the semiconductor laser device 1X of the comparative example supplies power to the semiconductor laser device 1X, the capacitor 30 stores the power if the switching element 20 is switched off, and the electric charge stored in the capacitor 30 flows to the semiconductor laser element 10 and the switching element 20 if the switching element 20 is switched on. In this case, for example, when the laser beam is emitted with a small pulse width of 10 ns, the current flowing to the semiconductor laser element 10 sharply rises. As a result, a large electromotive force is produced in parasitic inductance of the semiconductor laser device lx. Accordingly, a large pulse current flows to the switching element 20 and produces an electromotive force VLs in inductance between the source electrode 22 and the first terminal 31 of the capacitor 30 (30A, 30B), that is, the parasitic inductance caused by the first drive connection members 81 and 82. In this case, due to the electromotive force VLs, the voltage Vgs (control voltage) that is actually applied to the gate electrode 23 of the switching element 20 is a voltage Vg-VLs instead of a voltage Vg between the input electrode 142 and the output electrode 141 of the driver circuit 140. Such a decrease in the voltage Vgs hinders on-resistance of the switching element 20 from sufficiently decreasing, and the electric charge flows from the capacitor 30 to the semiconductor laser element 10 and the switching element 20. As a result, current ILD flowing to the semiconductor laser element 10 is decreased. More specifically, as shown in FIGS. 12 and 13, from time t1 to t2, when the voltage Vgs rises, the gate current flows and produces the electromotive force VLs. From time t2 to t3, the electromotive force VLs temporarily decreases in a range where the gate current is stable. From time t3 to t4, when the current ILD sharply rises, the electromotive force VLs greatly increases. This causes the voltage Vgs to greatly decrease from time t3 to t4. As a result, the peak value of the current ILD is not increased.

Figure 14:
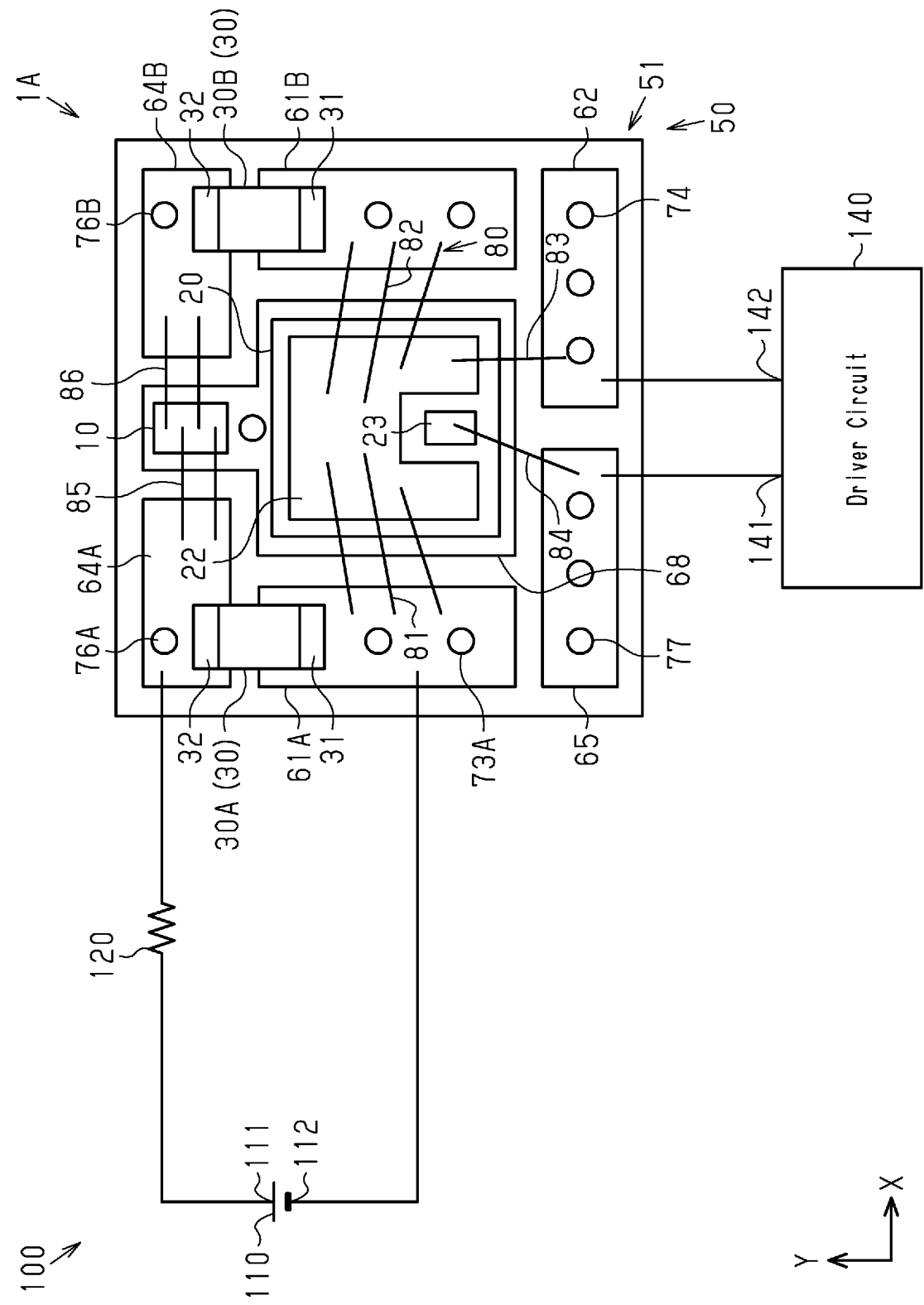
FIG. 14 is a schematic diagram showing a connection configuration when the semiconductor laser device of the first embodiment is used in a laser system.
Figure 15:
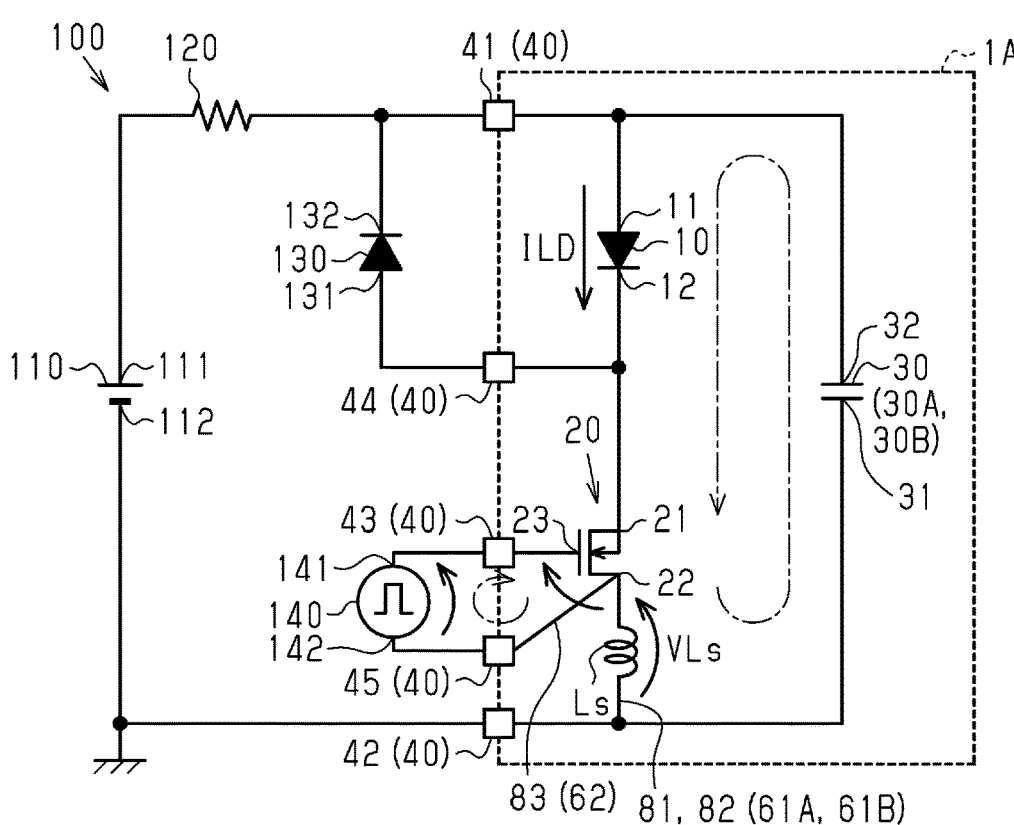
FIG. 15 is a schematic circuit diagram of the laser system including the semiconductor laser device of the first embodiment.
Figure 16:
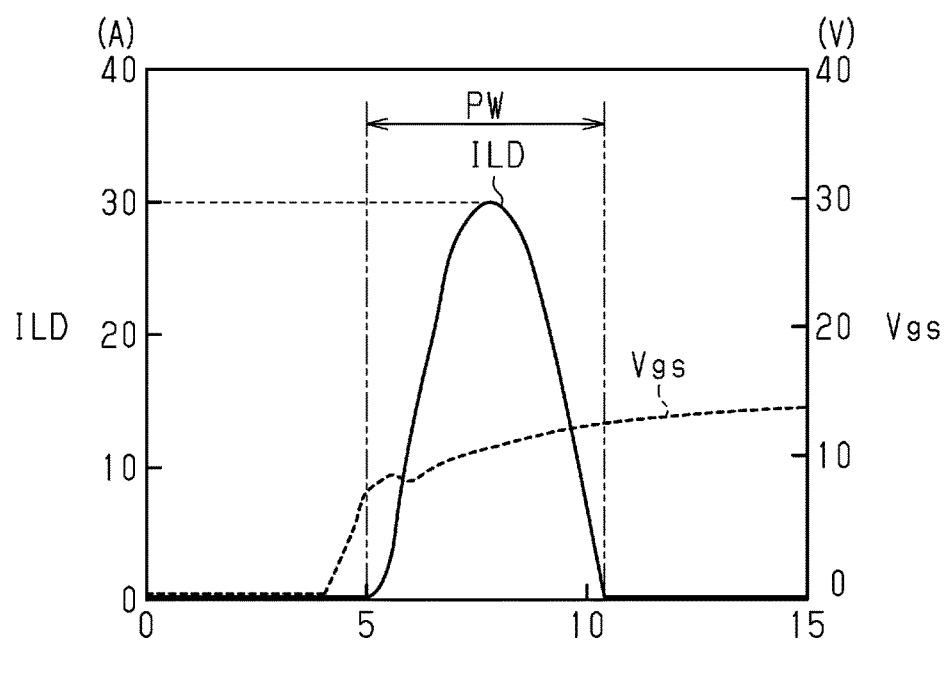
FIG. 16 is a graph showing changes in the current flowing to a semiconductor laser element and the voltage applied to a gate electrode of a switching element in the semiconductor laser device of the first embodiment.

In this regard, in the present embodiment, as shown in FIG. 14, when the semiconductor laser device 1A is used in the laser system 100, the positive electrode 111 of the power supply 110 is connected to the fourth drive conductor 64A by the fourth terminal conductor 69A and the fourth drive joint 76A (refer to FIG. 3), and the negative electrode 112 of the power supply 110 is connected to the first drive conductor 61A by the first terminal conductor 66A and the first drive joints 73A (refer to FIG. 3). The output electrode 141 of the driver circuit 140 is connected to the control conductor 65 by the control terminal conductor 70 and the control joints 77 (refer to FIG. 3). The input electrode 142 is connected to the second drive conductor 62 by the second terminal conductor 67 and the second drive joints 74 (refer to FIG. 3). With this connection configuration, as shown in FIG. 15, when the power supply 110 supplies power to the semiconductor laser device 1A, the capacitors 30A and 30B store the power if the switching element 20 is switched off, and the electric charge stored in the capacitors 30A and 30B flows to the semiconductor laser element 10 and the switching element 20 if the switching element 20 is switched on. More specifically, a first drive loop of current flowing to the semiconductor laser element 10 and the switching element 20 based on the charge stored in the capacitor 30A is formed separately from a second drive loop of current flowing to the semiconductor laser element 10 and the switching element 20 based on the electric charge stored in the capacitor 30B. More specifically, in the first drive loop, the current flows in the order of the second terminal 32 of the capacitor 30A, the fourth drive conductor 64A, the laser connection members 85, the anode electrode 11 of the semiconductor laser element 10, the cathode electrode 12, the third drive conductor 63, the drain electrode 21 of the switching element 20, the source electrode 22, the first drive connection members 81, and the first terminal 31 of the capacitor 30A. In the second drive loop, the current flows in the order of the second terminal 32 of the capacitor 30A, the fourth drive conductor 64B, the laser connection members 86, the anode electrode 11 of the semiconductor laser element 10, the cathode electrode 12, the third drive conductor 63, the drain electrode 21 of the switching element 20, the source electrode 22, the first drive connection members 82, and the first terminal 31 of the capacitor 30B. Then, the current flows from the source electrode 22 of the switching element 20 through the first drive conductor 61A to the negative electrode of the power supply 110.

When the voltage Vg is generated between the input electrode 142 and the output electrode 141 of the driver circuit 140, the voltage Vgs, that is, the gate-source voltage, is applied to the gate electrode 23 of the switching element 20. More specifically, a control loop is formed between the driver circuit 140 and the switching element 20. In the control loop, current flows in the order of the output electrode 141 of the driver circuit 140, the control terminal conductor 70, the control joints 77, the control conductor 65, the control connection member 84, the gate electrode 23, the source electrode 22, the second drive connection member 83, the second drive conductor 62, the second drive joints 74, the second terminal conductor 67, and the input electrode 142. Thus, since the input electrode 142 and the source electrode 22 are electrically connected separately from the first drive loop and the second drive loop, the voltage Vgs applied to the gate electrode 23 is generated based on the electric potential of the source electrode 22 joined to the input electrode 142.

As described above, the first drive loop and the second drive loop for current flowing between through the power supply 110 and the semiconductor laser element 10 and the switching element 20 are formed separately from the control loop for current flowing between the driver circuit 140 and the switching element 20. Therefore, the voltage Vg applied to the input electrode 142 of the driver circuit 140 and the voltage Vgs applied to the gate electrode 23 are less likely to be affected by the first drive loop and the second drive loop. More specifically, since the second drive connection member 83 electrically connects the input electrode 142 and the source electrode 22, the driver circuit 140 is less likely to be affected by the electromotive force VLs due to parasitic inductance Ls caused by the first drive connection members 81 and 82.

Thus, as shown in FIG. 15, the voltage Vgs rises more quickly than the voltage Vgs in the semiconductor laser device 1X of the comparative example with a subtle voltage drop caused by the electromotive force VLs. Accordingly, the current ILD flowing to the semiconductor laser element 10 of the present embodiment has a larger peak value than the current ILD flowing to the semiconductor laser element 10 of the semiconductor laser device 1X of the comparative example. In addition, the current ILD sharply rises. Moreover, in the present embodiment, the voltage Vgs quickly rises, and the voltage Vgs is not greatly decreased. Therefore, the current ILD of the present embodiment has a smaller pulse width PW than the current ILD of the semiconductor laser device 1X of the comparative example.

Advantages

The semiconductor laser device 1A of the present embodiment has the following advantages.

(1-1) The semiconductor laser device 1A includes the first drive connection members 81 and 82, which connect the source electrode 22 of the switching element 20 and the first drive conductors 61A and 61B, and the second drive connection member 83, which connects the source electrode 22 and the second drive conductor 62. In this structure, the first drive loop and the second drive loop, each of which is a first path of current flowing from the source electrode 22 of the switching element 20 through the first drive connection members 81 and 82 to the first drive conductors 61A and 61B, are formed separately from the control loop, which is a second path of current flowing from the source electrode 22 through the second drive connection member 83 to the second drive conductor 62. Thus, the effect of variations in the current in the first drive loop and the second drive loop on the control loop is reduced. That is, the control loop is less likely to be affected by inductance of the first drive connection members 81 and 82. Accordingly, in the control loop, the effect of counter electromotive force (the electromotive force VLs) due to inductance of the first drive connection members 81 and 82 imposed on the voltage Vgs applied to the gate electrode 23 of the switching element 20 is reduced.

(1-2) In the length-wise direction Y, the second drive conductor 62 and the semiconductor laser element 10 are located at opposite sides of the switching element 20. In this structure, the control loop is located far from the first drive loop and the second drive loop. Thus, the control loop is further less likely to be affected by the first drive loop and the second drive loop.

(1-3) The semiconductor laser device 1A includes the capacitors 30A and 30B. With this structure, in which the capacitors 30A and 30B are connected in parallel, the effect of parasitic inductance of the capacitors 30A and 30B is reduced as compared to a structure that includes one capacitor. This allows the current flowing to the semiconductor laser element 10 to have a larger peak and a smaller pulse width. Thus, the semiconductor laser element 10 having a high output may be used.

(1-4) The capacitors 30A and 30B are located closer to the semiconductor laser element 10 than the switching element 20 in the length-wise direction Y. In this structure, the first drive loop and the second drive loop are located far from the control loop. Thus, the control loop is further less likely to be affected by the first drive loop and the second drive loop. In addition, current paths in the first drive loop and the second drive loop are shortened, thereby reducing inductance of the semiconductor laser device 1A.

(1-5) The capacitors 30A and 30B are located at opposite sides of the switching element 20 in the width-wise direction X. The first drive conductors 61A and 61B are located at opposite sides of the switching element 20 in the width-wise direction X. The first drive connection members 81 connect the source electrode 22 of the switching element 20 and the first drive conductor 61A. The first drive connection members 82 connect the source electrode 22 and the first drive conductor 61B. In this structure, two drive loops, namely, the first drive loop and the second drive loop, are formed as paths for current. As compare to a structure having one drive loop, the first drive loop and the second drive loop are shortened, and the current is balanced between the first drive loop and the second drive loop.

(1-6) The semiconductor laser device 1A includes the third drive conductor 63 connecting the drain electrode 21 of the switching element 20 and the cathode electrode 12 of the semiconductor laser element 10. In this structure, the drain electrode 21 and the cathode electrode 12 are connected at the shortest distance by the third drive conductor 63. In addition, the third drive conductor 63 has a larger cross-sectional area than a wire. Thus, inductance between the cathode electrode 12 and the drain electrode 21 is reduced.

(1-7) The control conductor 65 and the second drive conductor 62 are located adjacent to each other in the width-wise direction X. In this structure, the current path forming the control loop is shortened, so that the inductance in the control loop is reduced.

In addition, the second drive conductor 62 is located closer to the control conductor 65 than the first drive connection member 82 that is located closest to the capacitors 30A and 30B among the first drive connection members 82. In this structure, the control loop is less likely to be affected by the second drive loop.

(1-8) The first drive connection members 81 and 82 are each formed of multiple wires. In this structure, inductance between the first drive conductor 61A and the source electrode 22 of the switching element 20 and inductance between the first drive conductor 61B and the source electrode 22 are reduced.

(1-9) The diameter of the first drive connection members 81 and 82 is equal to the diameter of the second drive connection member 83. In this structure, when the first drive connection members 81 and 82 and the second drive connection member 83 are formed by wire bonding, the wire material does not have to be changed. This simplifies the process for forming the first drive connection members 81 and 82 and the second drive connection member 83.

(1-10) The diameter of the first drive connection members 81 and 82, the diameter of the second drive connection member 83, and the diameter of the laser connection members 85 and 86 are equal to each other. In this structure, when the drive connection members 81 to 83 and the laser connection members 85 and 86 are formed by wire bonding, the wire material does not have to be changed. This simplifies the process for forming the drive connection members 81 to 83 and the laser connection members 85 and 86.

(1-11) The diameter of the first drive connection members 81 and 82, the diameter of the second drive connection member 83, the diameter of the control connection member 84, and the diameter of the laser connection members 85 and 86 are equal to each other. In this structure, when the connection members 81 to 86 are formed by wire bonding, the wire material does not have to be changed. This simplifies the process for forming the connection members 81 to 86.

(1-12) The end of each of the fourth drive conductors 64A and 64B located close to the semiconductor laser element 10 is disposed in the proximity of the semiconductor laser element 10 in plan view. The laser connection members 85 are bonded to the end of the fourth drive conductor 64A located close to the semiconductor laser element 10. The laser connection members 86 are bonded to the end of the fourth drive conductor 64B located close to the semiconductor laser element 10. In this structure, the laser connection members 85 and 86 are shortened, so that inductance caused by the laser connection members 85 and 86 is reduced.

(1-13) In the base member 51 of the support substrate 50, the gaps between adjacent conductors of the back surface conductor 60B on the base back surface 51b are larger than the gaps between adjacent conductors of the main surface conductor 60A on the base main surface 51a. Thus, the adjacent portions of the back surface conductor 60B are less likely to be joined by the conductive bonding member such as solder when mounted on a wiring substrate. This limits formation of a short circuit.

In other words, the gaps between adjacent conductors of the main surface conductor 60A on the base main surface 51a are smaller than the gaps between adjacent conductors of the back surface conductor 60B on the base back surface 51b. Thus, the first drive connection members 81 and 82, which respectively connect the switching element 20 and the first drive conductors 61A and 61B, are shortened. Also, the first drive connection members 82, which connect the switching element 20 and the second drive conductor 62, are shortened. Also, the control connection member 84, which connects the switching element 20 and the control conductor 65, is shortened. Also, the laser connection members 85 and 86, which connect the semiconductor laser element 10 and the fourth drive conductors 64A and 64B, are shortened. As a result, inductance caused by the connection members 81 to 86 is reduced. In addition, since the control connection member 84 is shortened, noise is less likely to occur in a signal from the driver circuit 140.

(1-14) The semiconductor laser element 10 is disposed in the center of the base member 51 in the width-wise direction X. In this structure, there is no imbalance of the semiconductor laser element 10 on the support substrate 50 in the width-wise direction X, so that wiring patterns of the wiring substrate may be designed without considering the imbalance of the semiconductor laser element 10. This improves the versatility of the semiconductor laser device 1A.

(1-15) The semiconductor laser element 10 is configured to emit a laser beam having a pulse width of 10 ns or less. This structure increases the accuracy of two-dimensional or three-dimensional distance measurement that uses the semiconductor laser device 1A.

However, in the semiconductor laser element 10 having the above structure, since the pulse width is small, the current ILD flowing to the semiconductor laser element 10 is likely to be sharply changed in accordance with time. That is, the effect of the inductance Ls between the source electrode 22 of the switching element 20 and the first terminals 31 of the capacitors 30A and 30B on the voltage Vg applied to the gate electrode 23 of the switching element 20 is increased. In this regard, in the present embodiment, as described above, the first drive loop and the second drive loop are formed separately from the control loop. This reduces the effect of the inductance Ls on the voltage Vg and allows for an increase in the current ILD flowing to the semiconductor laser element 10.

Modified Examples of First Embodiment

The semiconductor laser device 1A of the first embodiment may be modified, for example, as follows. The modified examples described below may be combined with one another as long as there is no technical inconsistency. In the modified examples, the same reference characters are given to those components that are the same as the corresponding components of the first embodiment. Such components will not be described in detail.

In the first embodiment, the semiconductor laser device 1A includes one semiconductor laser element 10. However, the number of semiconductor laser elements 10 is not particularly limited and may be changed in any manner. That is, the semiconductor laser device 1A may include multiple semiconductor laser elements 10. In an example, as shown in FIG. 17, the semiconductor laser device 1A includes two semiconductor laser elements 10A and 10B.

Figure 17:
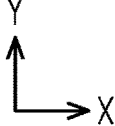
FIG. 17 is a plan view of a modified example of the semiconductor laser device of the first embodiment showing an internal structure of the semiconductor laser device with a sealing member removed.

As shown in FIG. 17, in plan view, the shapes of the third drive conductor 63 and the fourth drive conductors 64A and 64B differ from the shapes of the third drive conductor 63 and the fourth drive conductors 64A and 64B of the first embodiment. More specifically, the dimension of the semiconductor laser element mount portion 63b of the third drive conductor 63 in the width-wise direction X is increased so that the semiconductor laser elements 10A and 10B are mounted. In accordance with the increase in the dimension of the semiconductor laser element mount portion 63b in the width-wise direction X, the dimension of the fourth drive conductors 64A and 64B in the width-wise direction X is decreased. This limits increases in the size of the semiconductor laser device 1A including the semiconductor laser elements 10A and 10B.

The semiconductor laser elements 10A and 10B are mounted on the semiconductor laser element mount portion 63b using a conductive bonding material. The semiconductor laser elements 10A and 10B are aligned in the length-wise direction Y and are separated from each other in the width-wise direction X. The semiconductor laser elements 10A and 10B are located so that the cathode electrodes 12 (not shown in FIG. 17) face the semiconductor laser element mount portion 63b. Thus, the cathode electrodes 12 of the semiconductor laser elements 10A and 10B are electrically connected to the semiconductor laser element mount portion 63b. In other words, the cathode electrode 12 of the semiconductor laser element 10A is electrically connected to the cathode electrode 12 of the semiconductor laser element 10B.

The semiconductor laser element 10A is disposed on the semiconductor laser element mount portion 63*b* at a position close to the fourth drive conductor 64A in the width-wise direction X. The anode electrode 11 of the semiconductor laser element 10A is electrically connected to the fourth drive conductor 64A by four laser connection members 85. The four laser connection members 85 are arranged to be separate from each other in the length-wise direction Y.

The semiconductor laser element 10B is disposed on the semiconductor laser element mount portion 63*b* at a position close to the fourth drive conductor 64B in the width-wise direction X. The anode electrode 11 of the semiconductor laser element 10B is electrically connected to the fourth drive conductor 64B by four laser connection members 86. The four laser connection members 86 are arranged to be separate from each other in the length-wise direction Y.

Figure 18:
FIG. 18 is a back view of the semiconductor laser device shown in FIG. 17.

As shown in FIG. 18, the shape of the back surface conductor 60B as viewed in the thickness-wise direction Z, that is, the shape of the terminal conductors 66A, 66B, 67, 68, 69A, 69B, and 70 as viewed in the thickness-wise direction Z, is the same as the shape of the terminal conductors 66A, 66B, 67, 68, 69A, 69B, and 70 in the first embodiment as viewed in the thickness-wise direction Z.

With regard to the joints 60C, the number of third drive joints 75 and the arrangement of the third drive joints 75 differ from those of the third drive joints 75 in the first embodiment. More specifically, the number of switching element joints 75*a* is less than the number of switching element joints 75*a* in the first embodiment. In FIG. 18, four switching element joints 75*a* are located overlapping the switching element 20 in the thickness-wise direction Z. The number of semiconductor laser element joints 75*b* is greater than the number of semiconductor laser element joints 75*b* in the first embodiment. In FIG. 18, the semiconductor laser element joints 75*b* are located overlapping the semiconductor laser element 10A in the thickness-wise direction Z and the semiconductor laser element 10B in the thickness-wise direction Z.

As described above, in the semiconductor laser device 1A including multiple semiconductor laser elements 10 as shown in FIGS. 17 and 18, the intensity of a laser beam emitted from the semiconductor laser device 1A is increased.

Figure 19:
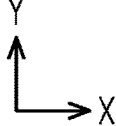
FIG. 19 is a plan view of a modified example of the semiconductor laser device of the first embodiment showing an internal structure of the semiconductor laser device with a sealing member removed.

In the modified example shown in FIG. 17, as shown in FIG. 19, an element connection member 87 may be added to connect the anode electrode 11 of the semiconductor laser element 10A and the anode electrode 11 of the semiconductor laser element 10B. The element connection member 87 is a wire formed of metal such as, for example, gold (Au), copper (Cu), or aluminum (Al). The element connection member 87 is formed by wire bonding. Although not particularly limited, the number of element connection members 87 is one in FIG. 19. The diameter of the element connection member 87 is not particularly limited and may be, for example, equal to the diameter of the laser connection members 85 and 86. When a difference in the diameter between the element connection member 87 and the laser connection members 85 and 86 is, for example, within 5% of the diameter of the laser connection members 85 and 86, it is considered that the diameter of the element connection member 87 is equal to the diameter of the laser connection members 85 and 86. The structure and shape of the back surface conductor 60B of the semiconductor laser device 1A shown in FIG. 19 are the same as those of the back surface conductor 60B of the semiconductor laser device 1A in the modified example shown in FIG. 18.

In the semiconductor laser device 1A shown in FIG. 19, the element connection member 87 connects the anode electrode 11 of the semiconductor laser element 10A and the anode electrode 11 of the semiconductor laser element 10B, so that the fourth drive conductors 64A and 64B are electrically connected by the semiconductor laser elements 10A and 10B. As a result, when the positive electrode of the power supply 110 is connected to the semiconductor laser device 1A, the positive electrode of the power supply 110 may be connected to only the fourth drive conductor 64A. This simplifies the connection structure of the power supply 110 and the semiconductor laser device 1A.

Figure 20:
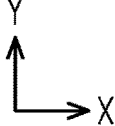
FIG. 20 is a plan view of a modified example of the semiconductor laser device of the first embodiment showing an internal structure of the semiconductor laser device with a sealing member removed.

In the modified example shown in FIG. 17, the semiconductor laser device 1A may include a semiconductor laser element that includes semiconductor light-emitting layers 14 arranged next to each other in the width-wise direction X and a single electrode connecting the semiconductor light-emitting layers 14. In an example, as shown in FIG. 20, the semiconductor laser device 1A may include a semiconductor laser element 10C including two semiconductor light-emitting layers 14A and 14B (refer to FIG. 21). As shown in FIG. 20, in plan view, the semiconductor laser element 10C is rectangular such that the long sides extend in the width-wise direction X and the short sides extend in the length-wise direction Y The dimension of the semiconductor laser element 10C in the width-wise direction X is greater than the dimension of the semiconductor laser element 10 of the first embodiment in the width-wise direction X.

Figure 21:
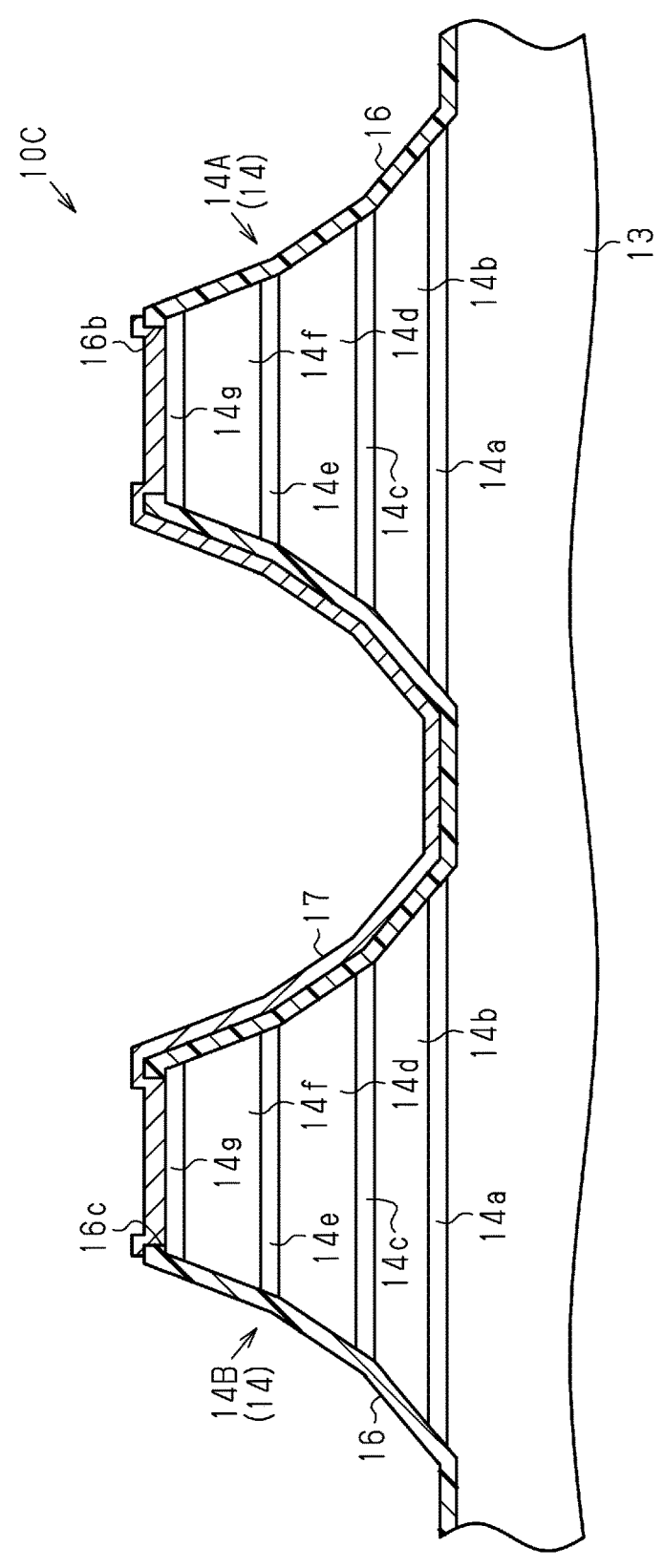
FIG. 21 is a cross-sectional view of a semiconductor laser element of the semiconductor laser device showing FIG. 20 showing a schematic cross-sectional structure of the element.
Figure 21:
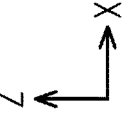

As shown in FIG. 21, the semiconductor laser element 10C includes the substrate 13 and the semiconductor light-emitting layers 14A and 14B arranged on the substrate 13 in the width-wise direction X. The semiconductor light-emitting layers 14A and 14B have the same structure as the semiconductor light-emitting layer 14 of the first embodiment. The insulation layer 16 covers both the semiconductor light-emitting layers 14A and 14B. A contact opening 16*b* is formed in the insulation layer 16 at the top of the semiconductor light-emitting layer 14A. A contact opening 16*c* is formed in the insulation layer 16 at the top of the semiconductor light-emitting layer 14B. The contact opening 16*b* exposes the semiconductor light-emitting layer 14A. The contact opening 16*c* exposes the semiconductor light-emitting layer 14B. The contact electrode 17 is formed in the contact openings 16*b* and 16*c*. The contact electrode 17 is formed on the insulation layer 16 from the contact opening 16*b* to the contact opening 16*c*. Thus, the contact electrode 17 is electrically connected to both the semiconductor light-emitting layers 14A and 14B. More specifically, the contact electrode 17 corresponds to a single electrode that connects the semiconductor light-emitting layers 14. The anode electrode 11 (refer to FIG. 20) is formed on the contact electrode 17.

In contrast to the semiconductor laser device 1A shown in FIGS. 17 to 19, in the semiconductor laser device 1A shown in FIGS. 20 and 21, the semiconductor laser element is one chip, and there is no need for a connection member that connects the anode electrodes of two semiconductor laser elements. Thus, the structure of the semiconductor laser device 1A is simplified.

Figure 22:
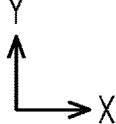
FIG. 22 is a back view showing a modified example of the semiconductor laser device of the first embodiment.

The structure of the back surface conductor 60B may be changed in any manner. In an example, in the back surface conductor 60B, the first terminal conductor 66B may be integrated with the third terminal conductor 68. For example, as shown in FIG. 22, the semiconductor laser device 1A may include a terminal conductor 78 in which the first terminal conductor 66B, the third terminal conductor 68, and the fourth terminal conductor 69B (refer to FIG. 3) are integrated with each other. In this case, in plan view, the terminal conductor 78 is rectangular such that the long sides extend in the width-wise direction X and the short sides extend in the length-wise direction Y. The planar shape of the terminal conductor 78 may be changed in any manner. For example, in plan view, the terminal conductor 78 may be square. In plan view, the area of the terminal conductor 78 is greater than the sum of the areas of the first terminal conductor 66B, the third terminal conductor 68, and the fourth terminal conductor 69B in the first embodiment. Thus, the terminal conductor 78 improves the heat dissipation property of the semiconductor laser device 1A.

In addition, in the terminal conductor 78, the third terminal conductor 68, the first terminal conductor 66B, and the fourth terminal conductor 69B are electrically connected, so that the first drive joints 73B and the fourth drive joint 76B (refer to FIG. 3) may be omitted. This simplifies the structure of the semiconductor laser device 1A. Further, a first drive joint 73B that joins the terminal conductor 78 to the first drive conductor 61B and a fourth drive joint 76B that joins the terminal conductor 78 to the fourth drive conductor 64B may be added.

Figure 23:
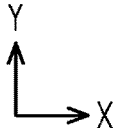
FIG. 23 is a plan view of a modified example of the semiconductor laser device of the first embodiment showing an internal structure of the semiconductor laser device with a sealing member removed.
Figure 24:
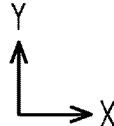
FIG. 24 is a back view of the semiconductor laser device shown in FIG. 23.

The structure that joints the main surface conductor 60A to the back surface conductor 60B is not limited to the through holes 71. For example, as shown in FIGS. 23 and 24, some of the joints 60C may be replaced with side surface joints 60D. The side surface joints 60D are formed in each of the second base side surface 51d, the third base side surface 51e, and the fourth base side surface 51f of the base member 51. In this case, the main surface conductor 60A and the back surface conductor 60B on the base member 51 have a different layout.

More specifically, the second drive conductor 62 and the control conductor 65 with the second terminal conductor 67 and the control terminal conductor 70 have a different layout. More specifically, as viewed in the width-wise direction X, the second drive conductor 62 and the control conductor 65 overlap the third drive conductor 63. The second drive conductor 62 is located closer to the fourth base side surface 51f than the third drive conductor 63 in the width-wise direction X. The control conductor 65 is located closer to the third base side surface 51e than the third drive conductor 63 in the width-wise direction X. The second terminal conductor 67 is located overlapping the second drive conductor 62 in the thickness-wise direction Z. The control terminal conductor 70 is located overlapping the control conductor 65 in the thickness-wise direction Z. Thus, as viewed in the width-wise direction X, the second terminal conductor 67 and the control terminal conductor 70 overlap the third terminal conductor 68. The second terminal conductor 67 is located closer to the fourth base side surface 51f than the third terminal conductor 68 in the width-wise direction X. The control terminal conductor 70 is located closer to the third base side surface 51e than the third terminal conductor 68 in the width-wise direction X.

In addition, the main surface conductor 60A and the back surface conductor 60B extend to be continuous with the second base side surface 51d, the third base side surface 51e, and the fourth base side surface 51f More specifically, the first drive conductor 61A, the fourth drive conductor 64A, and the control conductor 65 are continuous with the third base side surface 51e. The first drive conductor 61B, second drive conductor 62, and the fourth drive conductor 64B are continuous with the fourth base side surface 51f. The third drive conductor 63 is continuous with the second base side surface 51d. The first terminal conductor 66A, fourth terminal conductor 69A, and the control terminal conductor 70 are continuous with the third base side surface 51e. The first terminal conductor 66B, the second terminal conductor 67, and the fourth terminal conductor 69B are continuous with the fourth base side surface 51f. The third terminal conductor 68 is continuous with the second base side surface 51d.

The second base side surface 51d includes recesses 53A and 53B where the third drive conductor 63 and the third terminal conductor 68 are disposed. In plan view, the recesses 53A and 53B are recessed from the second base side surface 51d and curved toward the first base side surface 51c. The recesses 53A and 53B are arranged to be separate from each other in the width-wise direction X.

The third base side surface 51e includes recesses 54A, 54B, and 54C. In plan view, the recesses 54A, 54B, and 54C are recessed from the third base side surface 51e and curved toward the fourth base side surface 51f The recesses 54A, 54B, and 54C are arranged to be separate from each other in the length-wise direction Y. The recess 54A is disposed in a portion of the base member 51 where the first drive conductor 61A and the first terminal conductor 66A are located. The recess 54B is disposed in a portion of the base member 51 where the control conductor 65 and the control terminal conductor 70 are located. The recess 54C is disposed in a portion of the base member 51 where the fourth drive conductor 64A and the fourth terminal conductor 69A are located.

The fourth base side surface 51f includes recesses 55A, 55B, and 55C. In plan view, the recesses 55A, 55B, and 55C are recessed from the fourth base side surface 51f and curved toward the third base side surface 51e. The recesses 55A, 55B, and 55C are arranged to be separate from each other in the length-wise direction Y. As viewed in the width-wise direction X, the recess 55A is located overlapping the recess 54A, the recess 55B is located overlapping the recess 54B, and the recess 55C is located overlapping the recess 54C. The recess 55A is disposed in a portion of the base member 51 where the first drive conductor 61B and the first terminal conductor 66B are located. The recess 55B is disposed in a portion of the base member 51 where the second drive conductor 62 and the second terminal conductor 67 are located. The recess 55C is disposed in a portion of the base member 51 where the fourth drive conductor 64B and the fourth terminal conductor 69B are located.

Each of the recesses 53A, 53B, 54A to 54C, and 55A to 55C extends from the base main surface 51a to the base back surface 51b of the base member 51. The recesses 53A, 53B, 54A to 54C, and 55A to 55C are identical to each other in shape and size.

Figure 25:
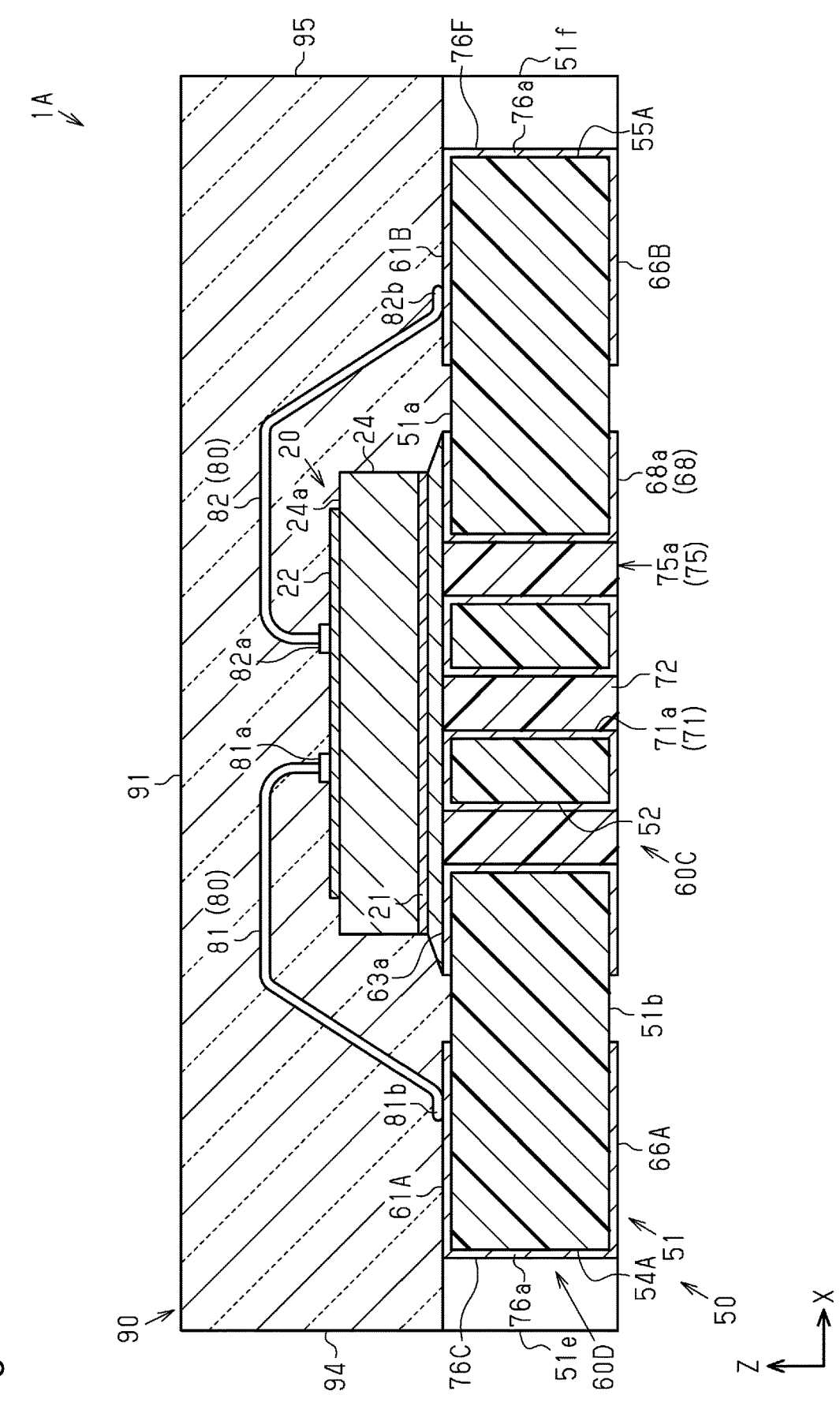
FIG. 25 is a cross-sectional view taken along line 25-25 in FIG. 23.

The side surface joints 60D are disposed in the recesses 53A, 53B, 54A to 54C, and 55A to 55C. The side surface joints 60D are formed along the side surface defining each of the recesses 53A, 53B, 54A to 54C, and 55A to 55C. The side surface joints 60D include side surface joints 76A to 76H. As shown in FIG. 25, the side surface joints 76C and 76F are formed of a metal film 76a. Although not shown in the drawings, the side surface joints 76A, 76B, 76D, 76E, 76G, and 76H are formed of the metal film 76a in the same manner as the side surface joints 76C and 76F. One end of the metal film 76a is located close to the base main surface 51a of the base member 51 and joined to the main surface conductor 60A. Another end of the metal film 76a is located close to the base back surface 51b of the base member 51 and joined to the back surface conductor 60B. In the present embodiment, the material forming the metal film 76a is the same as the material forming the main surface conductor 60A and the back surface conductor 60B.

As shown in FIGS. 23 and 24, the side surface joint 76A is disposed in the recess 53A and joints the third drive conductor 63 to the third terminal conductor 68. The side surface joint 76B is disposed in the recess 53B and joins the third drive conductor 63 to the third terminal conductor 68. The side surface joint 76C is disposed in the recess 54A and joins the first drive conductor 61A to the first terminal conductor 66A. The side surface joint 76D is disposed in the recess 54B and joins the second drive conductor 62 to the second terminal conductor 67. The side surface joint 76E is disposed in the recess 54C and joins the fourth drive conductor 64A to the fourth terminal conductor 69A. The side surface joint 76F is disposed in the recess 55A and joins the first drive conductor 61B to the first terminal conductor 66B. The side surface joint 76G is disposed in the recess 55B and joins the control conductor 65 to the control terminal conductor 70. The side surface joint 76H is disposed in the recess 55C and joins the fourth drive conductor 64B to the fourth terminal conductor 69B.

With this structure, when the semiconductor laser device 1A is bonded to a wiring substrate or the like using, for example, solder, solder fillets are formed on the side surface joints 60D. This allows the operator to visually check the solder fillets formed on the side surface joints 60D to determine the bonding state of the semiconductor laser device 1A.

In the semiconductor laser device 1A of the modified example shown in FIGS. 23 and 24, the first drive joints 73A and 73B (refer to FIG. 3) are omitted due to the disposition of the side surface joints 76C and 76F, the second drive joints 74 (refer to FIG. 3) are omitted due to the disposition of the side surface joint 76B, the fourth drive joints 76A and 76B (refer to FIG. 3) are omitted due to the disposition of the side surface joints 76E and 76H, and the control joints 77 (refer to FIG. 3) are omitted due to the disposition of the side surface joint 76G.

At least one of the first drive joints 73A and 73B, the second drive joints 74, the fourth drive joints 76A and 76B, and the control joints 77 may be added to the semiconductor laser device 1A of the modified example shown in FIGS. 23 and 24.

The number of capacitors 30A bonded to the first drive conductor 61A and the fourth drive conductor 64A and the number of capacitors 30B bonded to the first drive conductor 61B and the fourth drive conductor 64B may be changed in any manner. Multiple capacitors 30A and multiple capacitors 30B may be provided. The number of capacitors 30A and 30B may be set in accordance with, for example, output of the semiconductor laser element 10.

Second Embodiment

A second embodiment of a semiconductor laser device 1B will now be described with reference to FIGS. 26 and 27. The semiconductor laser device 1B of the present embodiment differs from the semiconductor laser device 1A of the first embodiment in the structure of the conductor 60 and the layout of the semiconductor laser element 10, the switching element 20, and the capacitors 30A and 30B. In the present embodiment, for the sake of convenience, the same reference characters are given to those elements that are the same as the corresponding elements of the first embodiment. Such elements may not be described in detail.

Figure 26:
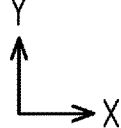
FIG. 26 is a plan view of a second embodiment of a semiconductor laser device showing an internal structure of the semiconductor laser device with a sealing member removed.

As shown in FIG. 26, in the semiconductor laser device 1B of the present embodiment, the semiconductor laser element 10 and the switching element 20 are not located in the center of the support substrate 50 in the width-wise direction X but are located closer to the fourth base side surface 51f than the center of the support substrate 50 in the width-wise direction X. In the semiconductor laser device 1B of the present embodiment, the capacitors 30A and 30B are not located at opposite sides of the switching element 20 but are located closer to the third base side surface 51e than the switching element 20 in the width-wise direction X. In accordance with the layout of the semiconductor laser element 10, the switching element 20, and the capacitors 30A and 30B described above, the conductor 60 differs in structure from the first embodiment of the conductor 60.

More specifically, the main surface conductor 60A includes a first drive conductor 61, the second drive conductor 62, the third drive conductor 63, a fourth drive conductor 64, and the control conductor 65. That is, one first drive conductor 61 and one fourth drive conductor 64 are provided.

The first drive conductor 61 is disposed on the base member 51 at a position toward the third base side surface 51e in the width-wise direction X. The first drive conductor 61 is disposed on the base member 51 at a position toward the second base side surface 51d in the length-wise direction Y. That is, the first drive conductor 61 is disposed on the base member 51 so that the center of the first drive conductor 61 in the length-wise direction Y is located closer to the second base side surface 51d than the center of the base member 51 in the length-wise direction Y. In plan view, the first drive conductor 61 is rectangular such that the long sides extend in the length-wise direction Y and the short sides extend in the width-wise direction X.

The fourth drive conductor 64 is disposed on the base member 51 at a position toward the third base side surface 51e in the width-wise direction X and toward the first base side surface 51c in the length-wise direction Y. In plan view, the fourth drive conductor 64 is rectangular such that the long sides extend in the width-wise direction X and the short sides extend in the length-wise direction Y. As viewed in the length-wise direction Y, the fourth drive conductor 64 overlaps the first drive conductor 61. The dimension of the fourth drive conductor 64 in the width-wise direction X is greater than the dimension of the first drive conductor 61 in the width-wise direction X.

The capacitors 30A and 30B are bonded to the first drive conductor 61 and the fourth drive conductor 64 by a conductive bonding material such as Ag paste or solder. The capacitors 30A and 30B are aligned in the length-wise direction Y and are separated to be adjacent to each other in the width-wise direction X. The first terminals 31 of the capacitors 30A and 30B are disposed on an end of the first drive conductor 61 located close to the fourth drive conductor 64 in the length-wise direction Y. The second terminals 32 of the capacitors 30A and 30B are disposed on an end of the fourth drive conductor 64 located close to the first drive conductor 61 in the length-wise direction Y.

The third drive conductor 63 is disposed on the base member 51 at a position toward the fourth base side surface 51f in the width-wise direction X. The third drive conductor 63 is disposed on the base member 51 at a position toward the first base side surface 51c in the length-wise direction Y. That is, the third drive conductor 63 is disposed on the base member 51 so that the center of the third drive conductor 63 in the length-wise direction Y is located closer to the first base side surface 51c than the center of the base member 51 in the length-wise direction Y. The third drive conductor 63 may be divided into the switching element mount portion 63a and the semiconductor laser element mount portion 63b. The switching element mount portion 63a and the semiconductor laser element mount portion 63b are located next to each other in the length-wise direction Y. The semiconductor laser element mount portion 63b is a portion of the third drive conductor 63 located toward the first base side surface 51c in the length-wise direction Y. In plan view, the semiconductor laser element mount portion 63b is rectangular such that the long sides extend in the width-wise direction X and the short sides extend in the length-wise direction Y. The switching element mount portion 63a is located closer to the second base side surface 51d than the semiconductor laser element mount portion 63b. In plan view, the switching element mount portion 63a is rectangular such that the long sides extend in the length-wise direction Y and the short sides extend in the width-wise direction X. The dimension of the switching element mount portion 63a in the width-wise direction X is greater than the dimension of the semiconductor laser element mount portion 63b in the width-wise direction X. The semiconductor laser element mount portion 63b is located closer to the fourth base side surface 51f than the switching element mount portion 63a. Thus, a cutaway portion 63c is formed in the third drive conductor 63 at a position next to the semiconductor laser element mount portion 63b in the width-wise direction X. The end of the fourth drive conductor 64 located close to the fourth base side surface 51f extends into part of the cutaway portion 63c.

The semiconductor laser element 10 is bonded to the semiconductor laser element mount portion 63b by a conductive bonding material such as Ag paste or solder. The semiconductor laser element 10 is disposed on an end of the semiconductor laser element mount portion 63b located close to the fourth drive conductor 64 in the width-wise direction X. The semiconductor laser element 10 is located so that the cathode electrode 12 (not shown in FIG. 26) of the semiconductor laser element 10 faces the semiconductor laser element mount portion 63b. Thus, the cathode electrode 12 is electrically connected to the semiconductor laser element mount portion 63b (the third drive conductor 63) by the conductive bonding material. The anode electrode 11 of the semiconductor laser element 10 and the third drive conductor 63 face in opposite directions in the thickness-wise direction Z. The anode electrode 11 and the fourth drive conductor 64 are electrically connected by multiple (in the present embodiment, four) laser connection members 85. The four laser connection members 85 are separated from each other in the length-wise direction Y. Each laser connection member 85 includes a first end 85a and a second end 85b. The first end 85a is bonded to the anode electrode 11. More specifically, the first end 85a is bonded to a center of the anode electrode 11 in the width-wise direction X. The second end 85b is bonded to the fourth drive conductor 64. More specifically, the second end 85b is bonded to an end of the fourth drive conductor 64 located close to the semiconductor laser element mount portion 63b.

The switching element 20 is bonded to the switching element mount portion 63a by a conductive bonding material. When the drain electrode 21 of the switching element 20 (not shown in FIG. 26) faces the third drive conductor 63 in the thickness-wise direction Z, the switching element 20 is bonded to the switching element mount portion 63a. Thus, the drain electrode 21 is electrically connected to the third drive conductor 63 by the conductive bonding material. Therefore, the drain electrode 21 is electrically connected to the cathode electrode 12 of the semiconductor laser element 10 by the third drive conductor 63.

The present embodiment of the switching element 20 differs from the first embodiment of the switching element 20 in the shape and arrangement of the source electrode 22 and the gate electrode 23. More specifically, a cutaway portion 25 is formed in the source electrode 22 at a position toward the second base side surface 51d and toward the fourth base side surface 51f. The gate electrode 23 is formed in the cutaway portion 25. Thus, the gate electrode 23 is located on an end of the element main surface 24a of the switching element 20 located close to the second base side surface 51d and close to the fourth base side surface 51f.

The second drive conductor 62 and the control conductor 65 are located closer to the second base side surface 51d than the third drive conductor 63 in the length-wise direction Y. The second drive conductor 62 and the control conductor 65 are located closer to the fourth base side surface 51f than the first drive conductor 61 in the width-wise direction X. The second drive conductor 62 and the control conductor 65 are aligned in the length-wise direction Y and separated from each other in the width-wise direction X.

The source electrode 22 and the first drive conductor 61 are electrically connected by multiple (in the present embodiment, three) first drive connection members 81. The three first drive connection members 81 are arranged to be separate from each other in the length-wise direction Y. The source electrode 22 and the second drive conductor 62 are electrically connected by the second drive connection member 83. The gate electrode 23 and the control conductor 65 are electrically connected by the control connection member 84. The number of first drive connection members 81 may be changed in any manner. The number of first drive connection members 81 may be set in accordance with, for example, output of the semiconductor laser element 10.

Figure 27:
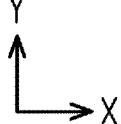
FIG. 27 is a back view of the semiconductor laser device shown in FIG. 26.

As shown in FIG. 27, the back surface conductor 60B includes first terminal conductors 66A and 66B, a second terminal conductor 67, third terminal conductors 68A and 68B, a fourth terminal conductor 69, and a control terminal conductor 70.

The first terminal conductors 66A and 66B are arranged to be separate from each other in the length-wise direction Y. The first terminal conductors 66A and 66B are located overlapping the first drive conductor 61 in the thickness-wise direction Z. In plan view, the first terminal conductor 66A is rectangular such that the long sides extend in the length-wise direction Y and the short sides extend in the width-wise direction X. The first terminal conductor 66B is located closer to the second base side surface 51d than the first terminal conductor 66A. In plan view, the first terminal conductor 66B is rectangular such that the long sides extend in the width-wise direction X and the short sides extend in the length-wise direction Y The dimension of the first terminal conductor 66B in the length-wise direction Y is less than the dimension of the first terminal conductor 66A in the length-wise direction Y.

The second terminal conductor 67 is located overlapping the second drive conductor 62 in the thickness-wise direction Z. The second terminal conductor 67 and the first terminal conductor 66B are aligned in the length-wise direction Y and separated from each other in the width-wise direction X.

The third terminal conductors 68A and 68B are arranged to be separate from each other in the length-wise direction Y. The third terminal conductors 68A and 68B are located overlapping the third drive conductor 63 in the thickness-wise direction Z. In plan view, the third terminal conductor 68A is rectangular such that the long sides extend in the length-wise direction Y and the short sides extend in the width-wise direction X. In plan view, the third terminal conductor 68B is rectangular such that the long sides extend in the width-wise direction X and the short sides extend in the length-wise direction Y. The dimension of the third terminal conductor 68B in the length-wise direction Y is less than the dimension of the third terminal conductor 68A in the length-wise direction Y.

The fourth terminal conductor 69 and the third terminal conductor 68B are aligned in the length-wise direction Y and separated from each other in the width-wise direction X. The fourth terminal conductor 69 is located closer to the third base side surface 51e than the third terminal conductor 68B. The fourth terminal conductor 69 is aligned with the first terminal conductors 66A and 66B in the width-wise direction X and is separated from the first terminal conductor 66A in the length-wise direction Y. The fourth terminal conductor 69 is located closer to the first base side surface 51c than the first terminal conductor 66A in the length-wise direction Y. In the thickness-wise direction Z, the fourth terminal conductor 69 is located overlapping the fourth drive conductor 64.

The control terminal conductor 70 and the second terminal conductor 67 are aligned in the length-wise direction Y and separated from each other in the width-wise direction X. The control terminal conductor 70 is located closer to the fourth base side surface 51f than the second terminal conductor 67 in the width-wise direction X. In the thickness-wise direction Z, the control terminal conductor 70 is located overlapping the control conductor 65.

As shown in FIGS. 26 and 27, the joints 60C include first drive joints 73A and 73B, a second drive joint 74, third drive joints 75A and 75B, fourth drive joints 76, and a control joint 77. In the same manner as the first embodiment, each of the joints 73A, 73B, 74, 75A, 75B, 76, and 77 includes a through hole 71 and a conductive portion 72 (not shown in FIGS. 26 and 27).

The first drive joints 73A join the first drive conductor 61 to the first terminal conductor 66A. Although the number of first drive joints 73A is not particularly limited, four first drive joints 73A are provided in the present embodiment.

The first drive joints 73B join the first drive conductor 61 to the first terminal conductor 66B. Although the number of first drive joints 73B is not particularly limited, two first drive joints 73B are provided in the present embodiment.

The second drive joint 74 joins the second drive conductor 62 to the second terminal conductor 67.

The third drive joints 75A join the switching element mount portion 63a of the third drive conductor 63 to the third terminal conductor 68A. Although the number of third drive joints 75A is not particularly limited, nine third drive joints 75A are provided in the present embodiment.

The third drive joints 75B join the semiconductor laser element mount portion 63b of the third drive conductor 63 to the third terminal conductor 68B. Although the number of third drive joints 75B is not particularly limited, two third drive joints 75B are provided in the present embodiment. One of the third drive joints 75B is located overlapping the semiconductor laser element 10 in the thickness-wise direction Z.

Operation

The operation of the semiconductor laser device 1B of the present embodiment will now be described.

When the semiconductor laser device 1B is used in the laser system 100, the positive electrode 111 of the power supply 110 is connected to the fourth drive conductor 64. The negative electrode 112 of the power supply 110 is connected to the first drive conductor 61. The output electrode 141 of the driver circuit 140 is connected to the control conductor 65. The input electrode 142 is connected to the second drive conductor 62. In this structure, when the power supply 110 supplies power to the semiconductor laser device 1B, the power is stored in the capacitors 30A and 30B if the switching element 20 is switched off, and the charge stored in the capacitors 30A and 30B flows to the semiconductor laser element 10 and the switching element 20 if the switching element 20 is switched on. Thus, current flows to the semiconductor laser element 10 and the switching element 20. Then, the current flows from the source electrode 22 of the switching element 20 through the first drive conductor 61 to the negative electrode of the power supply 110. More specifically, a drive loop is formed to allow the current based on the power stored in each of the capacitors 30A and 30B to flow to the semiconductor laser element 10 and the switching element 20. More specifically, in the drive loop, the current flows in the order of the second terminals 32 of the capacitors 30A and 30B, the fourth drive conductor 64, the laser connection members 85, the anode electrode 11 of the semiconductor laser element 10, the cathode electrode 12, the third drive conductor 63, the drain electrode 21 of the switching element 20, the source electrode 22, the first drive connection members 81, and the first terminals 31 of the capacitors 30A and 30B.

When the voltage Vg is generated between the input electrode 142 and the output electrode 141 of the driver circuit 140, the voltage Vgs, that is, the gate-source voltage, is applied to the gate electrode 23 of the switching element 20. More specifically, a control loop is formed between the driver circuit 140 and the switching element 20. In the control loop, current flows in the order of the output electrode 141 of the driver circuit 140, the control terminal conductor 70, the control joints 77, the control conductor 65, the control connection member 84, the gate electrode 23, the source electrode 22, the second drive connection member 83, the second drive conductor 62, the second drive joints 74, the second terminal conductor 67, and the input electrode 142. Thus, since the input electrode 142 and the source electrode 22 are electrically connected separately from the first drive loop and the second drive loop, the voltage Vgs applied to the gate electrode 23 is generated based on the electric potential of the source electrode 22 joined to the input electrode 142.

As described above, the drive loop for current flowing between the power supply 110 and the semiconductor laser element 10 and the switching element 20 is formed separately from the control loop for current flowing between the driver circuit 140 and the switching element 20. Therefore, the voltage Vg applied to the input electrode 142 of the driver circuit 140 and the voltage Vgs applied to the gate electrode 23 are less likely to be affected by the drive loop. Accordingly, the semiconductor laser device 1B of the present embodiment obtains the same advantages as the first embodiment.

Modified Examples of Second Embodiment

The semiconductor laser device 1B of the second embodiment may be modified, for example, as follows. The modified examples described below may be combined with one another as long as there is no technical inconsistency. In the modified examples, the same reference characters are given to those components that are the same as the corresponding components of the second embodiment. Such components will not be described in detail.

The second drive conductor 62 and the control conductor 65 may be switched to each other. Accordingly, the second terminal conductor 67 and the control terminal conductor 70 are also switched to each other. In addition, the position of the cutaway portion 25 in the source electrode 22 of the switching element 20 is changed to a position close to the second base side surface 51*d* and close to the third base side surface 51*e*. In this case, the gate electrode 23 is located on the element main surface 24*a* of the switching element 20 at a position close to the second base side surface 51*d* and close to the third base side surface 51*e*.

Instead of the first terminal conductors 66A and 66B, a terminal conductor that integrates the first terminal conductor 66A and the first terminal conductor 66B may be formed on the base back surface 51*b*.

Instead of the third terminal conductors 68A and 68B, a terminal conductor that integrates the third terminal conductor 68A and the third terminal conductor 68B may be formed on the base back surface 51*b*.

Third Embodiment

A third embodiment of a semiconductor laser device 1C will now be described with reference to FIGS. 28 and 29. The semiconductor laser device 1C of the present embodiment differs from the semiconductor laser device 1B of the second embodiment mainly in the shape of part of the conductor 60 and the layout of the electrodes of the switching element 20A. In the present embodiment, for the sake of convenience, the same reference characters are given to those elements that are the same as the corresponding elements of the second embodiment. Such elements may not be described in detail.

Figure 28:
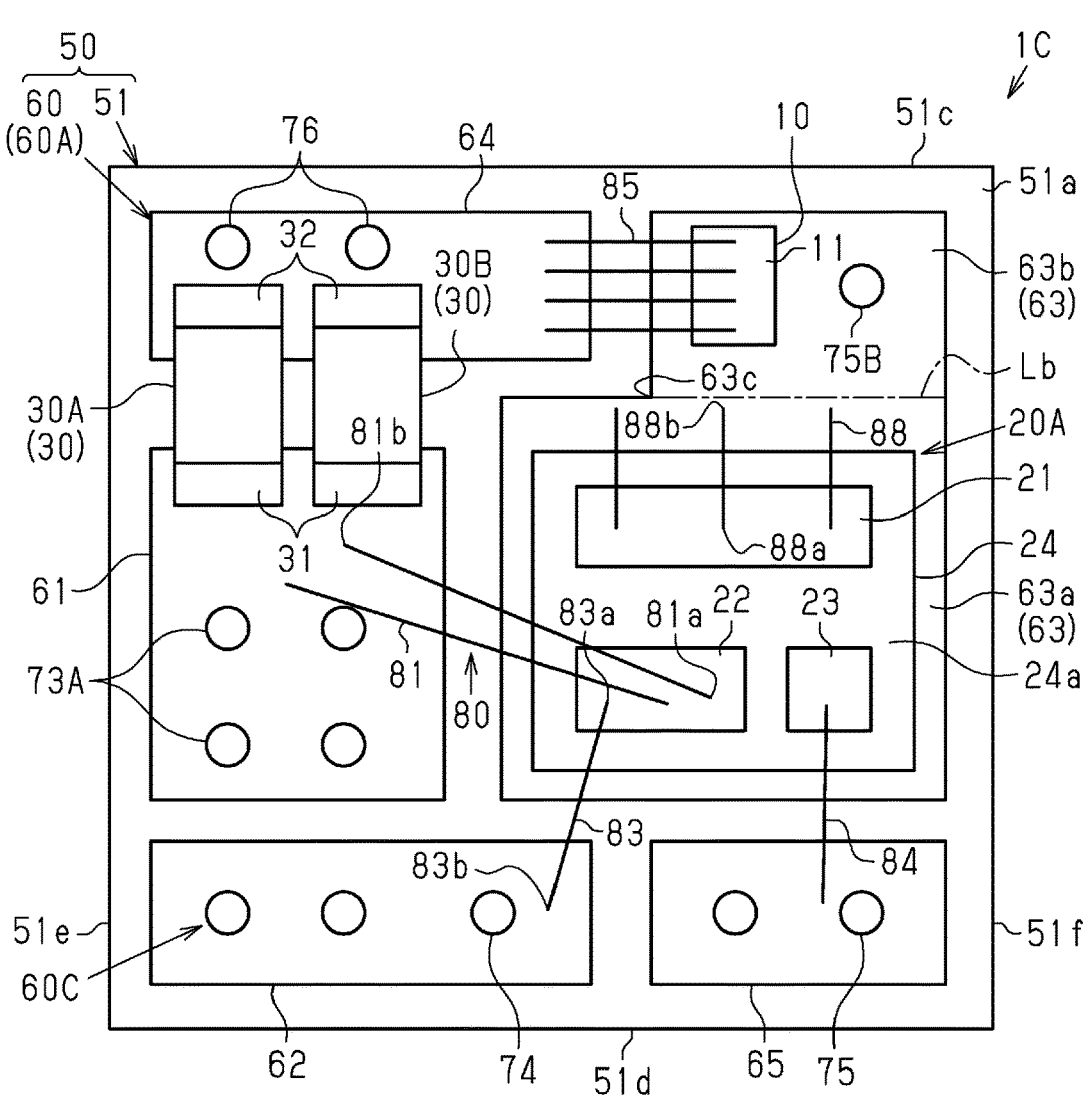
FIG. 28 is a plan view of a third embodiment of a semiconductor laser device showing an internal structure of the semiconductor laser device with a sealing member removed.
Figure 28:
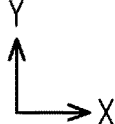

As shown in FIG. 28, the dimension of the first drive conductor 61 in the length-wise direction Y is less than the dimension of the second embodiment of the first drive conductor 61 in the length-wise direction Y. As viewed in the length-wise direction Y, the second drive conductor 62 is located overlapping the first drive conductor 61 and an end of the third drive conductor 63 located close to the first drive conductor 61. The dimension of the second drive conductor 62 in the width-wise direction X is greater than the dimension of the second embodiment of the second drive conductor 62 in the width-wise direction X. The dimension of the control conductor 65 in the width-wise direction X is greater than the dimension of the second embodiment of the control conductor 65 in the width-wise direction X.

Figure 29:
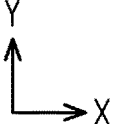
FIG. 29 is a back view of the semiconductor laser device shown in FIG. 28.

As shown in FIG. 29, as viewed in the length-wise direction Y, the second terminal conductor 67 is located overlapping the first terminal conductor 66A and an end of the third terminal conductor 68 located close to the first terminal conductor 66A. The dimension of the second terminal conductor 67 in the width-wise direction X is greater than the dimension of the second embodiment of the second terminal conductor 67 in the width-wise direction X. The dimension of the control terminal conductor 70 in the width-wise direction X is greater than the dimension of the second embodiment of the control terminal conductor 70 in the width-wise direction X.

As shown in FIGS. 28 and 29, in the present embodiment, the first terminal conductor 66B and the first drive joints 73B are omitted. In addition, three second drive joints 74 and two control joints 77 are provided. The three second drive joints 74 are aligned in the length-wise direction Y and arranged to be separate from each other in the width-wise direction X.

The two control joints 77 are aligned in the length-wise direction Y and arranged to be separate from each other in the width-wise direction X.

As shown in FIG. 28, the switching element 20A is bonded to the switching element mount portion 63*a* of the third drive conductor 63 by a bonding material. In the present embodiment, the bonding material is not limited to a conductive bonding material and may be an insulative bonding material. In plan view, the switching element 20A is rectangular such that, for example, the long sides extend in the width-wise direction X and the short sides extend in the length-wise direction Y.

The switching element 20A is, for example, a transistor formed from silicon (S), silicon carbide (SiC), or gallium nitride (GaN). When the switching element 20A is formed from SiC, it is suitable for high-speed switching. In the present embodiment, the switching element 20A is an N-type MOSFET formed from Si.

The switching element 20A includes an element main surface 24*a* that faces in the same direction as the base main surface 51*a* of the base member 51 of the support substrate 50 in the thickness-wise direction Z. The drain electrode 21, the source electrode 22, and the gate electrode 23 are formed on the element main surface 24*a*. That is, in the present embodiment, the drain electrode 21 is not formed on the element back surface. The element back surface is not shown in the drawing. Thus, the switching element 20A of the present embodiment is a transistor having a lateral structure.

The drain electrode 21, the source electrode 22, and the gate electrode 23 are arranged to be separate from each other in the length-wise direction Y. The drain electrode 21 is formed on the element main surface 24*a* at a position close to the semiconductor laser element 10 in the length-wise direction Y. The drain electrode 21 is electrically connected to the third drive conductor 63 by third drive connection members 88. In the present embodiment, the drain electrode 21 and the third drive conductor 63 are connected by three third drive connection members 88. The three third drive connection members 88 are arranged to be separate from each other in the width-wise direction X. Each third drive connection member 88 includes a first end 88*a* and a second end 88*b*.

The first end 88*a* of each third drive connection member 88 is connected to the drain electrode 21. The first ends 88*a* are aligned in the length-wise direction Y and arranged to separate from each other in the width-wise direction X. The second end 88*b* of each third drive connection member 88 is disposed on an end of the switching element mount portion 63*a* of the third drive conductor 63 located close to the semiconductor laser element mount portion 63*b* in the length-wise direction Y. The second ends 88*b* are aligned in the length-wise direction Y and arranged to be separate from each other in the width-wise direction X.

The source electrode 22 and the gate electrode 23 are aligned in the length-wise direction Y and arranged to be separate from each other in the width-wise direction X. The source electrode 22 is located closer to the first drive conductor 61 than the gate electrode 23 in the width-wise direction X.

The source electrode 22 is electrically connected to the first drive conductor 61 by first drive connection members 81. In the present embodiment, the source electrode 22 and the first drive conductor 61 are connected by two first drive connection members 81. The source electrode 22 is also electrically connected to the second drive conductor 62 by a second drive connection member 83. In the present embodiment, the source electrode 22 and the second drive conductor 62 are connected by one second drive connection member 83.

The first ends 81*a* of the two first drive connection members 81, which are connected to the source electrode 22, are located closer to the gate electrode 23 than the first end 83*a* of the second drive connection member 83, which is connected to the source electrode 22. In other words, the first end 83*a* is located closer to the first drive conductor 61 (the second drive conductor 62) than the first ends 81*a*.

The second ends 81*b* of the two first drive connection members 81, which are connected to the first drive conductor 61, are located between a first drive joint 73 and the first terminals 31 of the capacitors 30A and 30B in the length-wise direction Y. The second end 83*b* of the second drive connection member 83, which is connected to the second drive conductor 62, is disposed on an end of the second drive conductor 62 located close to the control conductor 65 in the width-wise direction X. As shown in FIG. 28, the length of the second drive connection member 83 is less than the length of the first drive connection members 81. The second drive connection member 83 is shortened, thereby reducing inductance due to the second drive connection member 83. The semiconductor laser device 1C of the present embodiment obtains the same advantages as the second embodiment.

Modified Examples of Third Embodiment

The semiconductor laser device 1C of the third embodiment may be modified, for example, as follows. The modified examples described below may be combined with one another as long as there is no technical inconsistency. In the modified examples, the same reference characters are given to those components that are the same as the corresponding components of the first and second embodiments. Such components will not be described in detail.

Figure 30:
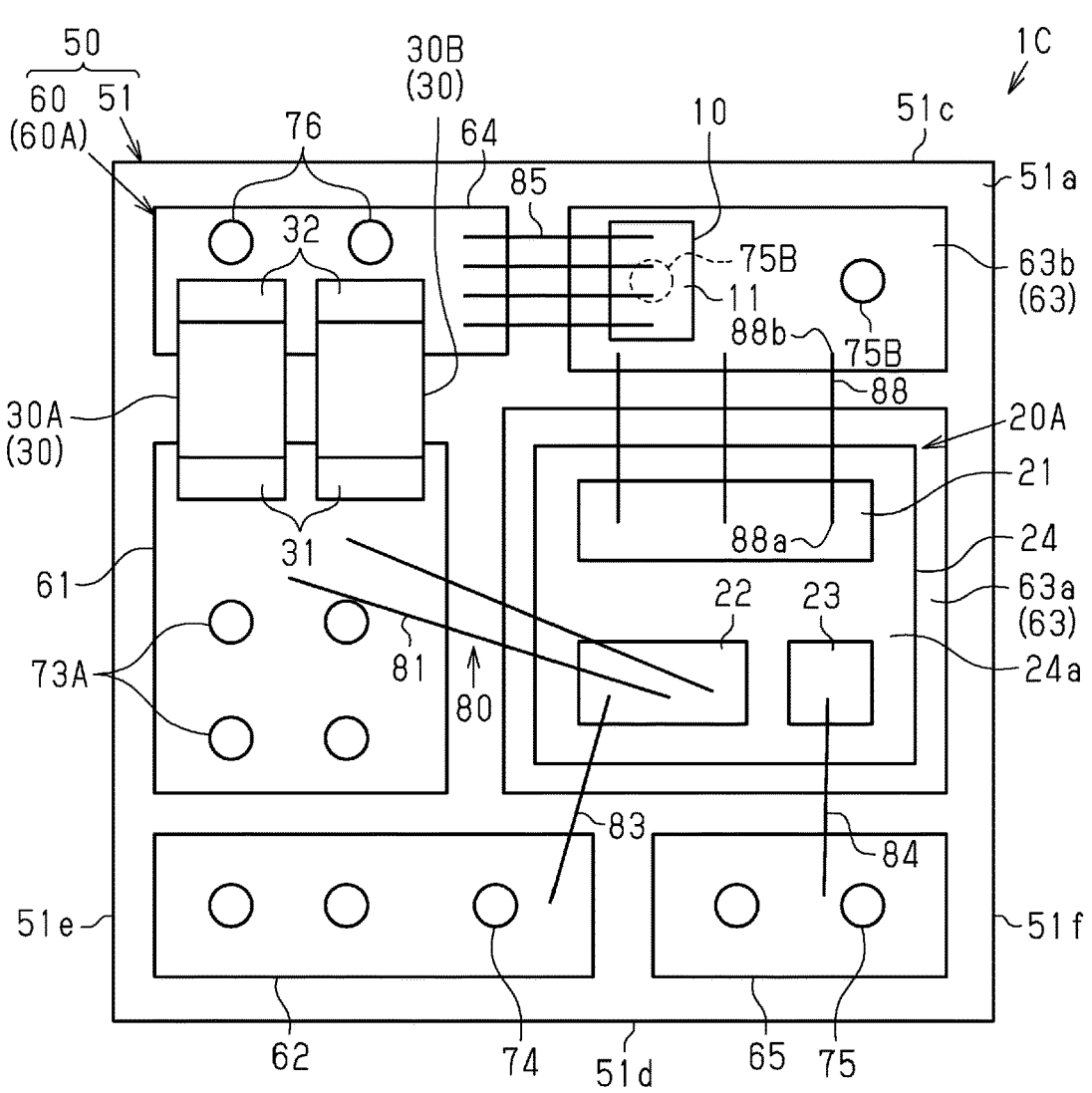
FIG. 30 is a plan view of a modified example of the semiconductor laser device of the third embodiment showing an internal structure of the semiconductor laser device with a sealing member removed.
Figure 30:
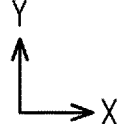

As shown in FIG. 30, the switching element mount portion 63*a* and the semiconductor laser element mount portion 63*b* of the third drive conductor 63 may be located separate from each other in the length-wise direction Y. In this case, the second ends 88*b* of the third drive connection members 88 are disposed on the semiconductor laser element mount portion 63*b*. Thus, the cathode electrode 12 of the semiconductor laser element 10 (not shown in FIG. 30) is electrically connected to the drain electrode 21 of the switching element 20A.

Figure 31:
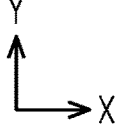
FIG. 31 is a plan view of a modified example of the semiconductor laser device of the third embodiment showing an internal structure of the semiconductor laser device with a sealing member removed.

The semiconductor laser device 1C of the third embodiment is based on the structure of the semiconductor laser device 1B of the second embodiment, and the switching element 20 of the semiconductor laser device 1B is replaced with the switching element 20A. Alternatively, as shown in FIG. 31, the semiconductor laser device 1C of the third embodiment may be based on the structure of the semiconductor laser device 1A of the first embodiment, and the switching element 20 of the semiconductor laser device 1A may be replaced with the switching element 20A. As shown in FIG. 31, the switching element 20A of the semiconductor laser device 1C includes a drain electrode 21, a first source electrode 22A, a second source electrode 22B, and a gate electrode 23 that are formed on the element main surface 24*a*.

The drain electrode 21, the first source electrode 22A, the second source electrode 22B, and the gate electrode 23 are arranged to be separate from each other in the length-wise direction Y. The drain electrode 21 is formed on the element main surface 24*a* at a position toward the semiconductor laser element 10 in the length-wise direction Y. The drain electrode 21 is electrically connected to the third drive conductor 63 by third drive connection members 88. In FIG. 31, the drain electrode 21 and the third drive conductor 63 are connected by three third drive connection members 88. The three third drive connection members 88 are arranged to be separate from each other in the width-wise direction X. The first end 88*a* of each third drive connection member 88 is connected to the drain electrode 21. The first ends 88*a* are aligned in the length-wise direction Y and arranged to separate from each other in the width-wise direction X. The second end 88*b* of each third drive connection member 88 is disposed on an end of the switching element mount portion 63*a* of the third drive conductor 63 located close to the semiconductor laser element mount portion 63*b* in the length-wise direction Y. The second ends 88*b* are aligned in the length-wise direction Y and arranged to be separate from each other in the width-wise direction X.

The first source electrode 22A, the second source electrode 22B, and the gate electrode 23 are aligned in the length-wise direction Y and are separated from each other in the width-wise direction X. The gate electrode 23 is disposed between the first source electrode 22A and the second source electrode 22B in the width-wise direction X. The first source electrode 22A is located closer to the first drive conductor 61A than the gate electrode 23. The second source electrode 22B is located closer to the first drive conductor 61B than the gate electrode 23.

The first source electrode 22A is electrically connected to the first drive conductor 61A by the first drive connection member 81. The second source electrode 22B is electrically connected to the first drive conductor 61B by the first drive connection member 82 and electrically connected to the second drive conductor 62 by the second drive connection member 83. The second end 83*b* of the second drive connection member 83 is disposed on a portion of the second drive conductor 62 overlapping the second source electrode 22B as viewed in the length-wise direction Y. Thus, the second drive connection member 83 is shortened. The gate electrode 23 is connected to the control conductor 65 by the control connection member 84. In this structure, the first drive connection members 81 and 82 are also formed separately from the second drive connection member 83, so that the same advantages as the first embodiment are obtained.

Figure 32:
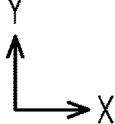
FIG. 32 is a plan view of a modified example of the semiconductor laser device of the third embodiment showing an internal structure of the semiconductor laser device with a sealing member removed.

In the semiconductor laser device 1C shown in FIG. 31, the structure of the source electrode of the switching element 20A may be changed to the structure of the source electrode of the switching element 20A shown in FIG. 32. More specifically, the switching element 20A of the semiconductor laser device 1C shown in FIG. 32 includes a first source electrode 22A, a second source electrode 22B, and a third source electrode 22C as source electrodes. The source electrodes 22A to 22C and the gate electrode 23 are disposed on an end of the element main surface 24*a* of the switching element 20A located close to the second base side surface 51*d* in the length-wise direction Y. The source electrodes 22A to 22C and the gate electrode 23 are aligned in the length-wise direction Y and arranged to be separate from each other in the width-wise direction X.

The first source electrode 22A is located closer to the first drive conductor 61A than the source electrodes 22B and 22C and the gate electrode 23 in the width-wise direction X. The second source electrode 22B is located closer to the first drive conductor 61B than the source electrodes 22A and 22C and the gate electrode 23 in the width-wise direction X. Thus, the third source electrode 22C and the gate electrode 23 are located between the first source electrode 22A and the second source electrode 22B in the width-wise direction X. The third source electrode 22C is located closer to the second source electrode 22B than the gate electrode 23.

The first source electrode 22A is connected to the first drive conductor 61A by the first drive connection member 81. The second source electrode 22B is connected to the first drive conductor 61B by the first drive connection member 82. The third source electrode 22C is connected to the second drive conductor 62 by the second drive connection member 83. The second end 83b of the second drive connection member 83 is disposed on an end of the second drive conductor 62 located close to the control conductor 65 in the width-wise direction X. As a result, the third source electrode 22C and the second end 83b are located close to each other in the width-wise direction X, so that the second drive connection member 83 is shortened. The gate electrode 23 is connected to the control conductor 65 by the control connection member 84. The second end 84b of the control connection member 84 is connected to an end of the control conductor 65 located close to the second drive conductor 62 as viewed in the width-wise direction X. As a result, the gate electrode 23 and the second end 84b are located close to each other in the width-wise direction X, so that the control connection member 84 is shortened. The semiconductor laser device 1C shown in FIG. 32 obtains the same advantages as the first embodiment.

In the semiconductor laser device 1C shown in FIGS. 31 and 32, the shape of the third drive conductor 63 may be changed in any manner. In an example, the switching element mount portion 63a and the semiconductor laser element mount portion 63b of the third drive conductor 63 may be located separate from each other in the length-wise direction Y. In this case, the second ends 88b of the third drive connection members 88 are disposed on the semiconductor laser element mount portion 63b. Thus, the cathode electrode 12 of the semiconductor laser element 10 is electrically connected to the drain electrode 21 of the switching element 20A.

Fourth Embodiment

A fourth embodiment of a semiconductor laser device 1D will now be described with reference to FIGS. 33 and 34. The semiconductor laser device 1D of the present embodiment differs from the semiconductor laser device 1A of the first embodiment in that the driver circuit 140 is incorporated. In the present embodiment, for the sake of convenience, the same reference characters are given to those elements that are the same as the corresponding elements of the first embodiment. Such elements may not be described in detail.

Figure 33:
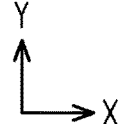
FIG. 33 is a plan view of a fourth embodiment of a semiconductor laser device showing an internal structure of the semiconductor laser device with a sealing member removed.

As shown in FIG. 33, in the present embodiment, the base member 51 of the support substrate 50 is rectangular in plan view such that the long sides extend in the length-wise direction Y and the short sides extend in the width-wise direction X. In the present embodiment, the first drive conductors 61A and 61B and the third drive conductor 63 are disposed on the base member 51 at a position toward the first base side surface 51c in the length-wise direction Y. That is, the center of each of the first drive conductors 61A and 61B and the third drive conductor 63 in the length-wise direction Y is located closer to the first base side surface 51c than the center of the base member 51 in the length-wise direction Y. In the conductor 60 of the present embodiment, the second drive conductor 62 and the control conductor 65 (refer to FIG. 2) are omitted from the main surface conductor 60A, and the second terminal conductor 67 and the control terminal conductor 70 (refer to FIG. 3) are omitted from the back surface conductor 60B.

The main surface conductor 60A includes a driver circuit mount portion 150, a first power conductor 151, a second power conductor 152, a signal conductor 153, and a reference voltage conductor 154, which are formed on the base main surface 51a of the base member 51 at a position closer to the second base side surface 51d than the first drive conductors 61A and 61B and the third drive conductor 63.

As viewed in the length-wise direction Y, the driver circuit mount portion 150 is located overlapping the third drive conductor 63. In plan view, the driver circuit mount portion 150 is rectangular such that the long sides extend in the width-wise direction X and the short sides extend in the length-wise direction Y. The first power conductor 151, the second power conductor 152, the signal conductor 153, and the reference voltage conductor 154 are located at opposite sides of the driver circuit mount portion 150 in the width-wise direction X. More specifically, the first power conductor 151 and the second power conductor 152 are located at a side of the driver circuit mount portion 150 toward the third base side surface 51e, and the signal conductor 153 and the reference voltage conductor 154 are located at a side of the driver circuit mount portion 150 toward the fourth base side surface 51f in the width-wise direction X.

The first power conductor 151 and the second power conductor 152 are aligned in the width-wise direction X and arranged to be separate from each other in the length-wise direction Y. As viewed in the length-wise direction Y, the first power conductor 151 and the second power conductor 152 are located overlapping the first drive conductor 61A. The first power conductor 151 is located closer to the first drive conductor 61A than the second power conductor 152 in the length-wise direction Y.

The signal conductor 153 and the reference voltage conductor 154 are aligned in the width-wise direction X and arranged to be separate from each other in the length-wise direction Y. As viewed in the length-wise direction Y, the signal conductor 153 and the reference voltage conductor 154 are aligned in the width-wise direction X and arranged to be separate from each other in the length-wise direction Y. As viewed in the length-wise direction Y, the signal conductor 153 and the reference voltage conductor 154 are located overlapping the first drive conductor 61B. The signal conductor 153 is located closer to the first drive conductor 61B than the reference voltage conductor 154 in the length-wise direction Y.

In plan view, each of the first power conductor 151, the second power conductor 152, the signal conductor 153, and the reference voltage conductor 154 is square. The planar shape of each of the first power conductor 151, the second power conductor 152, the signal conductor 153, and the reference voltage conductor 154 may be changed in any manner. In an example, in plan view, each of the first power conductor 151, the second power conductor 152, the signal conductor 153, and the reference voltage conductor 154 may be rectangular such that the long sides extend in one of the length-wise direction Y and the width-wise direction X and the short sides extend in the other one of the length-wise direction Y and the width-wise direction X. At least one of the first power conductor 151, the second power conductor 152, the signal conductor 153, and the reference voltage conductor 154 may differ in planar shape from the others.

The driver circuit 140 is mounted on the driver circuit mount portion 150. In the present embodiment, the driver circuit 140 is configured to be, for example, a chip in which an electronic component forming the driver circuit 140 such as a transistor is sealed by a sealing member 143. In the present embodiment, the sealing member 143 is formed from a resin material and covers the entirety of the electronic component. However, the specific structure of the sealing member 143 is not particularly limited. In plan view, the driver circuit 140 is rectangular such that the long sides extend in the width-wise direction X and the short sides extend in the length-wise direction Y.

The sealing member 143 includes a sealing main surface 143a and a sealing back surface (not shown) that face in opposite directions in the thickness-wise direction Z. The sealing main surface 143a faces in the same direction as the element main surface 24a of the switching element 20 in the thickness-wise direction Z. The sealing back surface faces in the same direction as the element back surface 24b of the switching element 20 in the thickness-wise direction Z. The sealing main surface 143a exposes electrodes 144. The electrodes 144 include a first power electrode 144a, a second power electrode 144b, an output electrode 144c, an input electrode 144d, a signal electrode 144e, and a reference voltage output electrode 144f.

The first power electrode 144a is electrically connected to the positive electrode of a control power supply, which is not shown in the drawings. For example, a first power voltage (Vcc) is applied to the first power electrode 114a. The first power electrode 144a is disposed on an end of the sealing main surface 143a located close to the third base side surface 51e in the width-wise direction X and close to the switching element 20 in the length-wise direction Y.

The second power electrode 144b is electrically connected to the negative electrode of the control power supply. For example, a second power voltage (GND) that is lower than the first power voltage (Vcc) is applied to the second power electrode 144b. The second power electrode 144b is disposed on an end of the sealing main surface 143a located close to the third base side surface 51e in the width-wise direction X and close to the second base side surface 51d in the length-wise direction Y.

The output electrode 144c is used to apply the gate voltage to the gate electrode 23 of the switching element 20. The output electrode 144c is disposed on the center of the sealing main surface 143a in the width-wise direction X at an end of the sealing main surface 143a located close to the switching element 20 in the length-wise direction Y. As viewed in the length-wise direction Y, the output electrode 144c is located overlapping the gate electrode 23 of the switching element 20.

The input electrode 144d is configured to be electrically connected to the source electrode 22 of the switching element 20. The input electrode 144d is disposed on an end of the sealing main surface 143a located close to the fourth base side surface 51f in the width-wise direction X and close to the switching element 20 in the length-wise direction Y. As viewed in the length-wise direction Y, the input electrode 144d is located overlapping the source electrode 22 of the switching element 20.

The signal electrode 144e receives a gate signal from a gate signal generation circuit (not shown) arranged outside the semiconductor laser device 1D. The signal electrode 144e is disposed on an end of the sealing main surface 143a located close to the fourth base side surface 51f in the width-wise direction X at the center of the sealing main surface 143a in the length-wise direction Y.

The reference voltage output electrode 144f, for example, changes the first power voltage applied from the control power supply into a reference voltage (e.g., 2.5 V) and outputs the reference voltage. In this case, the driver circuit 140 includes a regulator that generates the reference voltage. The reference voltage output electrode 144f is disposed on an end of the sealing main surface 143a located close to the fourth base side surface 51f in the width-wise direction X and close to the second base side surface 51d in the length-wise direction Y.

The driver circuit 140 is electrically connected to the switching element 20 and the main surface conductor 60A by driver connection members 160. The driver connection members 160 include a first driver connection member 161, a second driver connection member 162, a third driver connection member 163, a fourth driver connection member 164, a fifth driver connection member 165, and a sixth driver connection member 166. The driver connection members 161 to 165 are formed of, for example, the same material as the first drive connection members 81 and 82 and the laser connection members 85 and 86. The driver connection members 161 to 165 are wires formed of metal such as, for example, gold (Au), copper (Cu), or aluminum (Al). In the present embodiment, the driver connection members 161 to 165 are formed by wire bonding. The diameter of the driver connection members 161 to 165 is equal to the diameter of the first drive connection members 81 and 82 and the laser connection members 85 and 86. When a difference in the diameter between the driver connection members 161 to 165 and the first drive connection members 81 and 82 and the laser connection members 85 and 86 is within, for example, 5% of the diameter of the first drive connection members 81, it is considered that the diameter of the driver connection members 161 to 165 is equal to the diameter of the first drive connection members 81 and 82 and the laser connection members 85 and 86.

The first driver connection member 161 connects the first power electrode 144a and the first power conductor 151. The second driver connection member 162 connects the second power electrode 144b and the second power conductor 152. The third driver connection member 163 connects the signal electrode 144e and the signal conductor 153. The fourth driver connection member 164 connects the reference voltage output electrode 144f and the reference voltage conductor 154. The fifth driver connection member 165 connects the output electrode 144c and the gate electrode 23 of the switching element 20. Thus, the fifth driver connection member 165 corresponds to a control connection member that connects the driver circuit and the control electrode of the switching element. The sixth driver connection member 166 connects the input electrode 144d and the source electrode 22 of the switching element 20. Thus, the sixth driver connection member 166 corresponds to a second drive connection member that connects the driver circuit to the second drive electrode of the switching element. The sixth driver connection member 166 includes a first end 166a and a second end 166b. The first end 166a is connected to the source electrode 22. The second end 166b is connected to the input electrode 144d. The first end 166a is connected to a portion of the source electrode 22 overlapping the input electrode 144d as viewed in the length-wise direction Y at an end of the source electrode 22 located close to the input electrode 144d in the length-wise direction Y.

Figure 34:
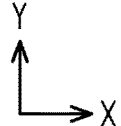
FIG. 34 is a back view of the semiconductor laser device shown in FIG. 33.

As shown in FIG. 34, the back surface conductor 60B includes a driver terminal conductor 155, a first power terminal conductor 156, a second power terminal conductor 157, a signal terminal conductor 158, and a reference voltage terminal conductor 159.

As shown in FIGS. 33 and 34, the driver terminal conductor 155 is disposed on a portion of the base back surface 51*b* of the base member 51 overlapping the driver circuit mount portion 150 as viewed in the thickness-wise direction Z. The driver terminal conductor 155 is identical in shape and size to the driver circuit mount portion 150. The first power terminal conductor 156 is disposed on a portion of the base back surface 51*b* overlapping the first power conductor 151 as viewed in the thickness-wise direction Z. The first power terminal conductor 156 is identical in shape and size to the first power conductor 151. The second power terminal conductor 157 is disposed on a portion of the base back surface 51*b* overlapping the second power conductor 152 as viewed in the thickness-wise direction Z. The second power terminal conductor 157 is identical in shape and size to the second power conductor 152. The signal terminal conductor 158 is disposed on a portion of the base back surface 51*b* overlapping the signal conductor 153 as viewed in the thickness-wise direction Z. The signal terminal conductor 158 is identical in shape and size to the signal conductor 153. The reference voltage terminal conductor 159 is disposed on a portion of the base back surface 51*b* overlapping the reference voltage conductor 154 as viewed in the thickness-wise direction Z. The reference voltage terminal conductor 159 is identical in shape and size to the reference voltage conductor 154.

As shown in FIG. 34, a gap Gr7 between the driver terminal conductor 155 and each of the power terminal conductors 156 and 157 in the width-wise direction X is smaller than a gap Gr2 between the third terminal conductor 68 and the first terminal conductor 66A in the width-wise direction X. Also, a gap Gr8 between the driver terminal conductor 155 and each of the signal terminal conductor 158 and the reference voltage terminal conductor 159 in the width-wise direction X is smaller than a gap Gr2 between the third terminal conductor 68 and the first terminal conductor 66 in the width-wise direction X. The gaps Gr7 and the gaps Gr8 are smaller than a gap Gr9 between the driver terminal conductor 155 and the third terminal conductor 68 in the length-wise direction Y.

As shown in FIGS. 33 and 34, the joints 60C include multiple (in the present embodiment, four) driver joints 170, a first power joint 171, a second power joint 172, a signal joint 173, and a reference voltage joint 174. Each of the joints 170 to 174 includes a through hole 71 and a conductive portion 72 (not shown in FIGS. 33 and 34) in the same manner as the other joints.

The four driver joints 170 are disposed in a portion of the base member 51 overlapping the driver circuit mount portion 150 and the driver terminal conductor 155 in the thickness-wise direction Z. The driver joints 170 join the driver circuit mount portion 150 to the driver terminal conductor 155.

The first power joint 171 is disposed in a portion of the base member 51 overlapping the first power conductor 151 and the first power terminal conductor 156 in the thickness-wise direction Z. The first power joint 171 joins the first power conductor 151 to the first power terminal conductor 156.

The second power joint 172 is disposed in a portion of the base member 51 overlapping the second power conductor 152 and the second power terminal conductor 157 in the thickness-wise direction Z. The second power joint 172 joins the second power conductor 152 to the second power terminal conductor 157.

The signal joint 173 is disposed in a portion of the base member 51 overlapping the signal conductor 153 and the signal terminal conductor 158 in the thickness-wise direction Z. The signal joint 173 joins the signal conductor 153 to the signal terminal conductor 158.

The reference voltage joint 174 is disposed in a portion of the base member 51 overlapping the reference voltage conductor 154 and the reference voltage terminal conductor 159 in the thickness-wise direction Z. The reference voltage joint 174 joins the reference voltage conductor 154 to the reference voltage terminal conductor 159.

The number of joints 170 to 174 may be changed in any manner. The semiconductor laser device 1D may include at least one of each of the joints 170 to 174. The position of the driver joints 170 relative to the driver circuit mount portion 150 (the driver terminal conductor 155), the position of the first power joint 171 relative to the first power conductor 151 (the first power terminal conductor 156), the position of the second power joint 172 relative to the second power conductor 152 (the second power terminal conductor 157), the position of the signal joint 173 relative to the signal conductor 153 (the signal terminal conductor 158), and the position of the reference voltage joint 174 relative to the reference voltage conductor 154 (the reference voltage terminal conductor 159) may be changed in any manner.

The semiconductor laser device 1D of the present embodiment has the following advantages in addition to the advantages of the first embodiment.

(4-1) The semiconductor laser device 1D includes the driver circuit 140. In this structure, the first drive loop and the second drive loop, each of which is a first path of current flowing from the source electrode 22 of the switching element 20 through the first drive connection members 81 and 82 to the first drive conductors 61A and 61B, are formed separately from the control loop, which is a second path of current flowing from the source electrode 22 through the sixth driver connection member 166 to the driver circuit 140. Thus, variations in the current in the first drive loop and the second drive loop are less likely to affect the control loop. That is, the control loop is less likely to be affected by inductance of the first drive connection members 81 and 82. Accordingly, in the control loop, the voltage Vgs applied to the gate electrode 23 of the switching element 20 is less likely to be affected by counter electromotive force due to inductance of the first drive connection members 81 and 82.

In addition, the driver circuit 140 is incorporated in the semiconductor laser device 1D. This decreases the distance between the source electrode 22 of the switching element 20 and the input electrode 142 of the driver circuit 140 and the distance between the gate electrode 23 of the switching element 20 and the output electrode 141 of the driver circuit 140. Thus, inductance is reduced in the control loop.

(4-2) The driver circuit 140 and the semiconductor laser element 10 are located at opposite sides of the switching element 20 in the length-wise direction Y. In this structure, the control loop is located far from the first drive loop and the second drive loop. Thus, the control loop is less likely to be affected by inductance of the first drive loop and the second drive loop.

(4-3) The gate electrode 23 of the switching element 20 is located toward the driver circuit 140. In this structure, the distance between the gate electrode 23 and the output electrode 141 of the driver circuit 140 is decreased. Thus, inductance is reduced in the control loop.

(4-4) The sixth driver connection member 166 is connected to an end of the source electrode 22 of the switching element 20 located close to the driver circuit 140 in the length-wise direction Y In this structure, the sixth driver connection member 166 is shortened, so that inductance is reduced in the control loop.

Modified Examples of Fourth Embodiment

The semiconductor laser device 1D of the fourth embodiment may be modified, for example, as follows. The modified examples described below may be combined with one another as long as there is no technical inconsistency. In the modified examples, the same reference characters are given to those components that are the same as the corresponding components of the first to fourth embodiments. Such components will not be described in detail.

The semiconductor laser device 1D of the fourth embodiment is based on the structure of the semiconductor laser device 1A of the first embodiment, and the driver circuit 140 is incorporated in the semiconductor laser device 1A. Alternatively, for example, the semiconductor laser device 1D may be based on the structure of the semiconductor laser device 1B of the second embodiment or the semiconductor laser device 1C of the third embodiment, and the driver circuit 140 may be incorporated in the semiconductor laser device 1B or 1C.

Figure 35:
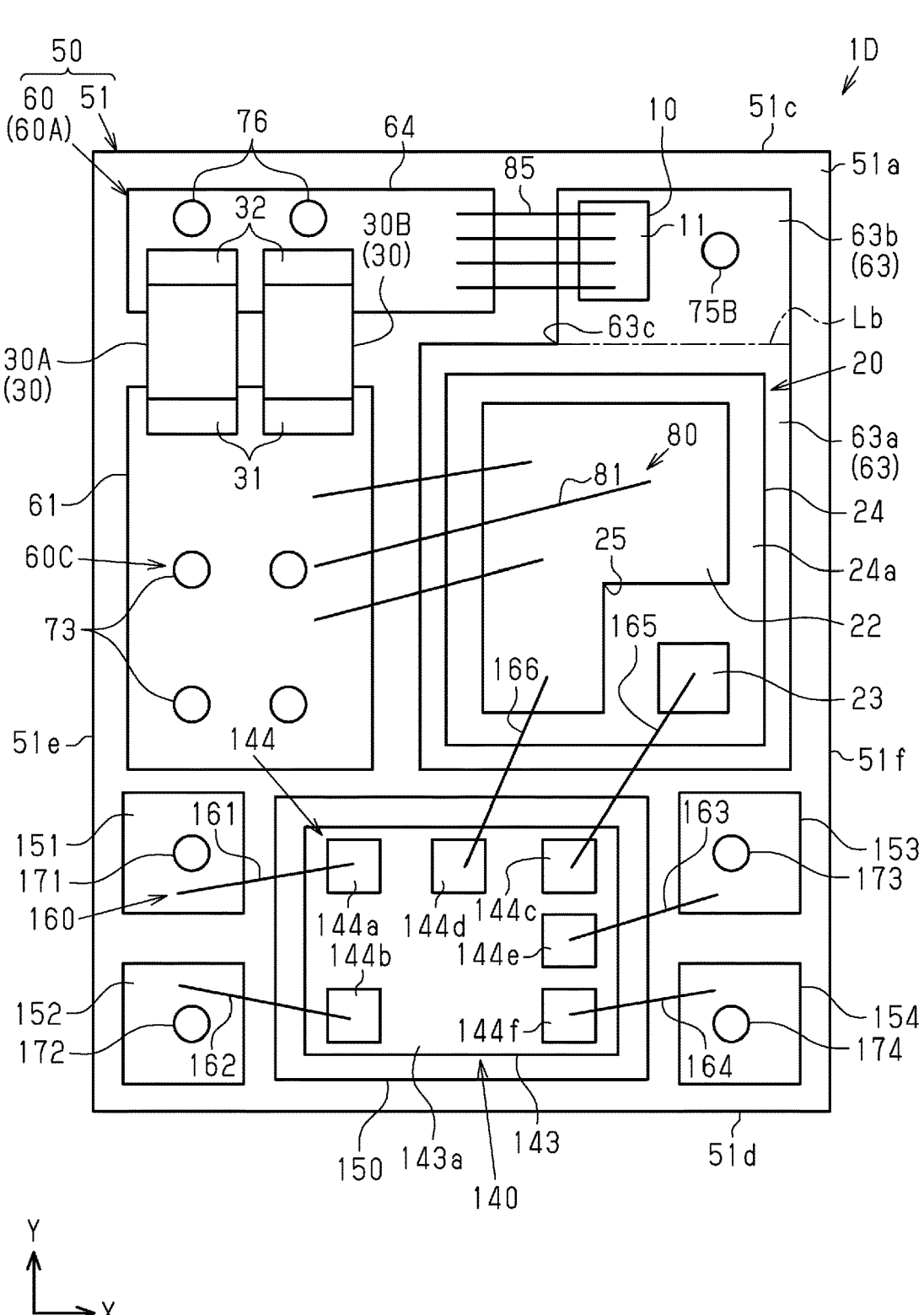
FIG. 35 is a plan view of a modified example of the semiconductor laser device of the fourth embodiment showing an internal structure of the semiconductor laser device with a sealing member removed.
Figure 36:
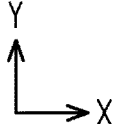
FIG. 36 is a back view of the semiconductor laser device shown in FIG. 35.

FIGS. 35 and 36 show a first example of a semiconductor laser device 1D in which the driver circuit 140 is incorporated in the semiconductor laser device 1B of the second embodiment. As shown in FIG. 35, in the present embodiment, the base member 51 of the support substrate 50 is rectangular in plan view such that the long sides extend in the length-wise direction Y and the short sides extend in the width-wise direction X. In the present embodiment, the first drive conductor 61 and the third drive conductor 63 are disposed on the base member 51 at a position toward the first base side surface 51c in the length-wise direction Y That is, the center of each of the first drive conductor 61 and the third drive conductor 63 in the length-wise direction Y is located closer to the first base side surface 51c than the center of the base member 51 in the length-wise direction Y. In the conductor 60 of the present embodiment, the second drive conductor 62 and the control conductor 65 are omitted from the main surface conductor 60A, and the second terminal conductor 67 and the control terminal conductor 70 (refer to FIG. 3) are omitted from the back surface conductor 60B.

The driver circuit mount portion 150, the first power conductor 151, the second power conductor 152, the signal conductor 153, and the reference voltage conductor 154 are formed on the base main surface 51a of the base member 51 at a position closer to the second base side surface 51d than the first drive conductor 61 and the third drive conductor 63. The shape and layout of the driver circuit mount portion 150 and the conductors 151 to 154 are the same as those of the fourth embodiment of the driver circuit mount portion 150 and the conductors 151 to 154 and thus will not be described in detail.

The driver circuit 140 mounted on the driver circuit mount portion 150 differs from the fourth embodiment of the driver circuit 140 in only the layout of the output electrode 144c and the input electrode 144d. The output electrode 144c is disposed on an end of the sealing main surface 143a of the sealing member 143 located close to the fourth base side surface 51f in the width-wise direction X and close to the switching element 20 in the length-wise direction Y. As viewed in the length-wise direction Y, the output electrode 144c is located overlapping the source electrode 22 of the switching element 20. The output electrode 144c is located closer to the third base side surface 51e than the gate electrode 23 of the switching element 20. The input electrode 144d is disposed on a portion of the sealing main surface 143a located closer to the fourth base side surface 51f than the center in the width-wise direction X at an end of the sealing main surface 143a located close to the switching element 20 in the length-wise direction Y. The distance between the input electrode 144d and the output electrode 144c in the width-wise direction X is less than the distance between the input electrode 144d and the first power electrode 144a in the width-wise direction X. As viewed in the length-wise direction Y, the input electrode 144d is located partially overlapping the source electrode 22.

The first to fourth driver connection members 161 to 164 are connected in the same manner as the fourth embodiment of the first to fourth driver connection members 161 to 164. The fifth driver connection member 165 connects the output electrode 144c and the gate electrode 23. In plan view, the fifth driver connection member 165 is inclined toward the fourth base side surface 51f extending from the output electrode 144c toward the gate electrode 23. The sixth driver connection member 166 connects the input electrode 144d and the source electrode 22. The sixth driver connection member 166 is connected to an end of the source electrode 22 located close to the driver circuit 140 in the length-wise direction Y. As shown in FIG. 35, the length of the sixth driver connection member 166 is less than the length of the fifth driver connection member 165.

As shown in FIG. 36, the back surface conductor 60B includes a first terminal conductor 66, a third terminal conductor 68, a fourth terminal conductor 69, a driver terminal conductor 155, a first power terminal conductor 156, a second power terminal conductor 157, a signal terminal conductor 158, and a reference voltage terminal conductor 159. The structure and layout of the driver terminal conductor 155, the first power terminal conductor 156, the second power terminal conductor 157, the signal terminal conductor 158, and the reference voltage terminal conductor 159 are the same as those of the fourth embodiment and thus will not be described in detail.

The first terminal conductor 66 is located on a portion of the base back surface 51b overlapping the first drive conductor 61 in the thickness-wise direction Z. The dimension of the first terminal conductor 66 in the length-wise direction Y is less than the dimension of the first drive conductor 61 in the length-wise direction Y.

The fourth terminal conductor 69 is located on a portion of the base back surface 51b overlapping the fourth drive conductor 64 in the thickness-wise direction Z. The fourth terminal conductor 69 is located overlapping the first terminal conductor 66 as viewed in the length-wise direction. The dimension of the fourth terminal conductor 69 in the width-wise direction X is less than the dimension of the fourth drive conductor 64 in the width-wise direction X.

The third terminal conductor 68 is located on a portion of the base back surface 51b overlapping the third drive conductor 63 in the thickness-wise direction Z. The dimension of the third terminal conductor 68 in the width-wise direction X is less than the dimension of the third drive conductor 63 in the width-wise direction X. The third terminal conductor 68 of the present embodiment is formed by integrating the third terminal conductors 68A and 68B in the semiconductor laser device 1B of the second embodiment.

As shown in FIGS. 35 and 36, the joints 60C include first drive joints 73, third drive joints 75A and 75B, fourth drive joints 76, driver joints 170, a first power joint 171, a second power joint 172, a signal joint 173, and a reference voltage joint 174. The structure and layout of the driver joints 170, the first power joint 171, the second power joint 172, the signal joint 173, and the reference voltage joint 174 are the same as those of the fourth embodiment and thus will not be described in detail.

The first drive joints 73 join the first drive conductor 61 and the first terminal conductor 66. In FIGS. 35 and 36, the four first drive joints 73 are disposed on the first drive conductor 61 and the first terminal conductor 66 at a position toward the second base side surface 51*d* in the length-wise direction Y.

The third drive joints 75A are disposed on the switching element mount portion 63*a*. The third drive joints 75B are disposed on the semiconductor laser element mount portion 63*b*. In the present embodiment, nine third drive joints 75A and two third drive joints 75B are provided. The third drive joints 75A join the switching element mount portion 63*a* and the third terminal conductor 68. The third drive joints 75B join the semiconductor laser element mount portion 63*b* and the third terminal conductor 68. When the driver circuit 140 is incorporated as described above, the advantages of the fourth embodiment are obtained.

Figure 37:
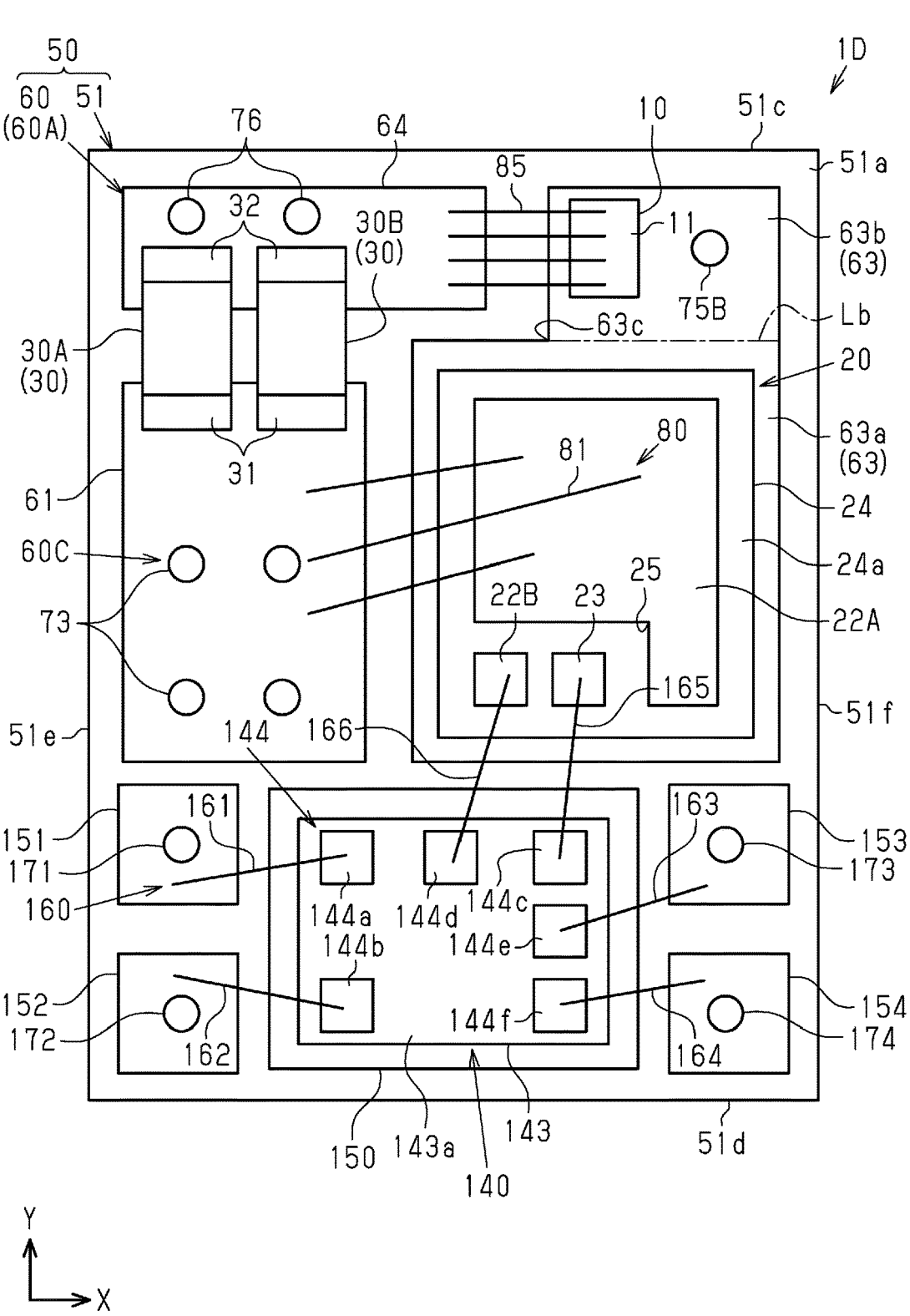
FIG. 37 is a plan view of a modified example of the semiconductor laser device of the fourth embodiment showing an internal structure of the semiconductor laser device with a sealing member removed.

FIG. 37 shows a structure that differs from the semiconductor laser device 1D shown in FIG. 35 in the electrodes formed on the element main surface 24*a* of the switching element 20. In FIG. 37, the first source electrode 22A, the second source electrode 22B, and the gate electrode 23 are formed on the element main surface 24*a* of the switching element 20.

The first source electrode 22A is formed on a substantial portion of the element main surface 24*a*. The first source electrode 22A includes a cutaway portion 25. The cutaway portion 25 is formed in an end of the first source electrode 22A located close to the driver circuit 140 in the length-wise direction Y at a position toward the first drive conductor 61 in the width-wise direction X. The second source electrode 22B and the gate electrode 23 are disposed in the cutaway portion 25.

The second source electrode 22B and the gate electrode 23 are aligned in the length-wise direction Y and arranged to be separate from each other in the width-wise direction X. The second source electrode 22B is located closer to the first drive conductor 61 than the gate electrode 23 in the width-wise direction X. The second source electrode 22B is located partially overlapping the input electrode 144*d* as viewed in the length-wise direction Y. The gate electrode 23 is located partially overlapping the output electrode 144*c* as viewed in the length-wise direction Y. In this structure, the fifth driver connection member 165, which connects the gate electrode 23 and the output electrode 144*c*, is shortened. Also, the sixth driver connection member 166, which connects the second source electrode 22B and the input electrode 144*d*, is shortened.

Figure 38:
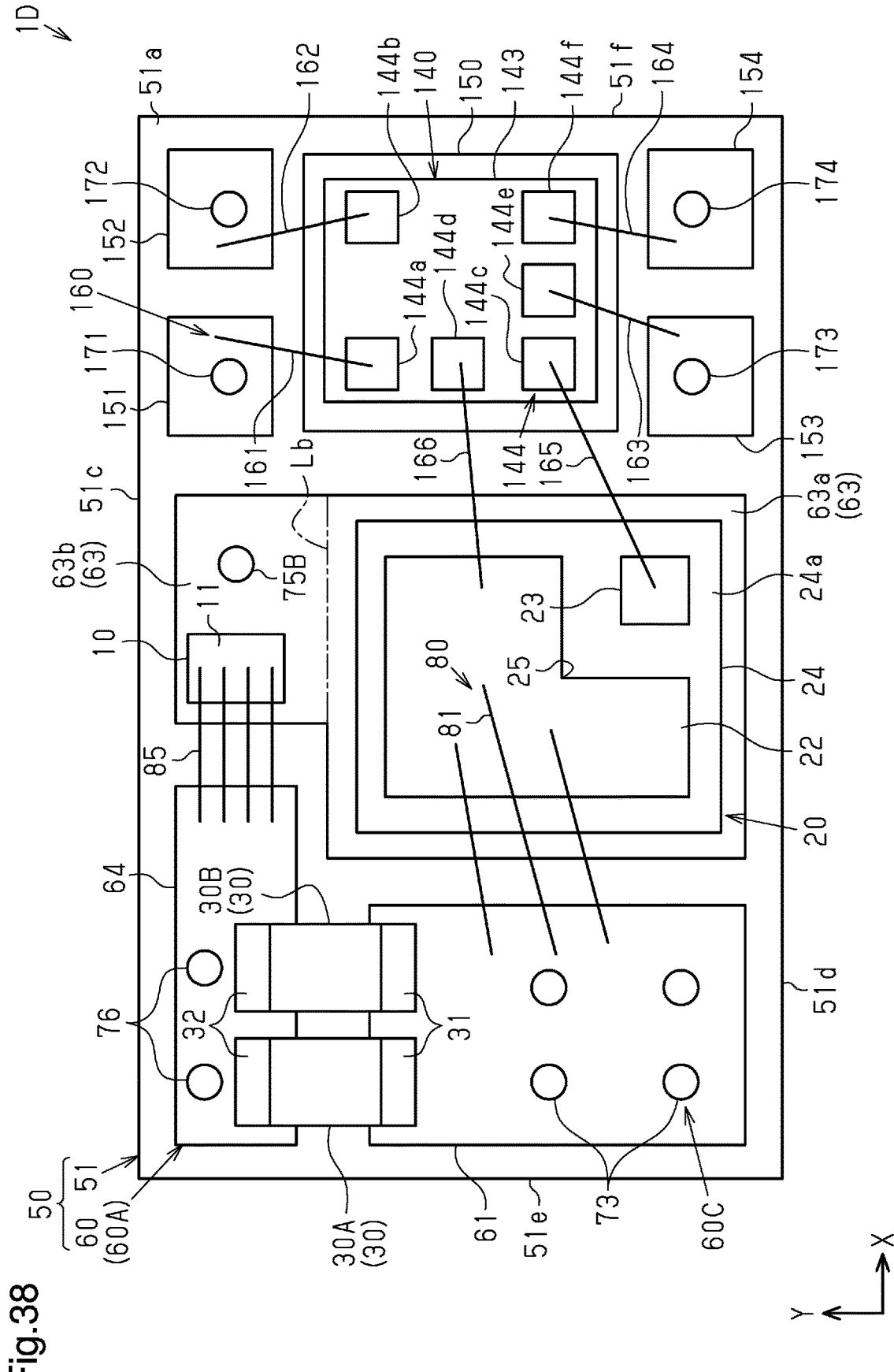
FIG. 38 is a plan view of a modified example of the semiconductor laser device of the fourth embodiment showing an internal structure of the semiconductor laser device with a sealing member removed.
Figure 39:
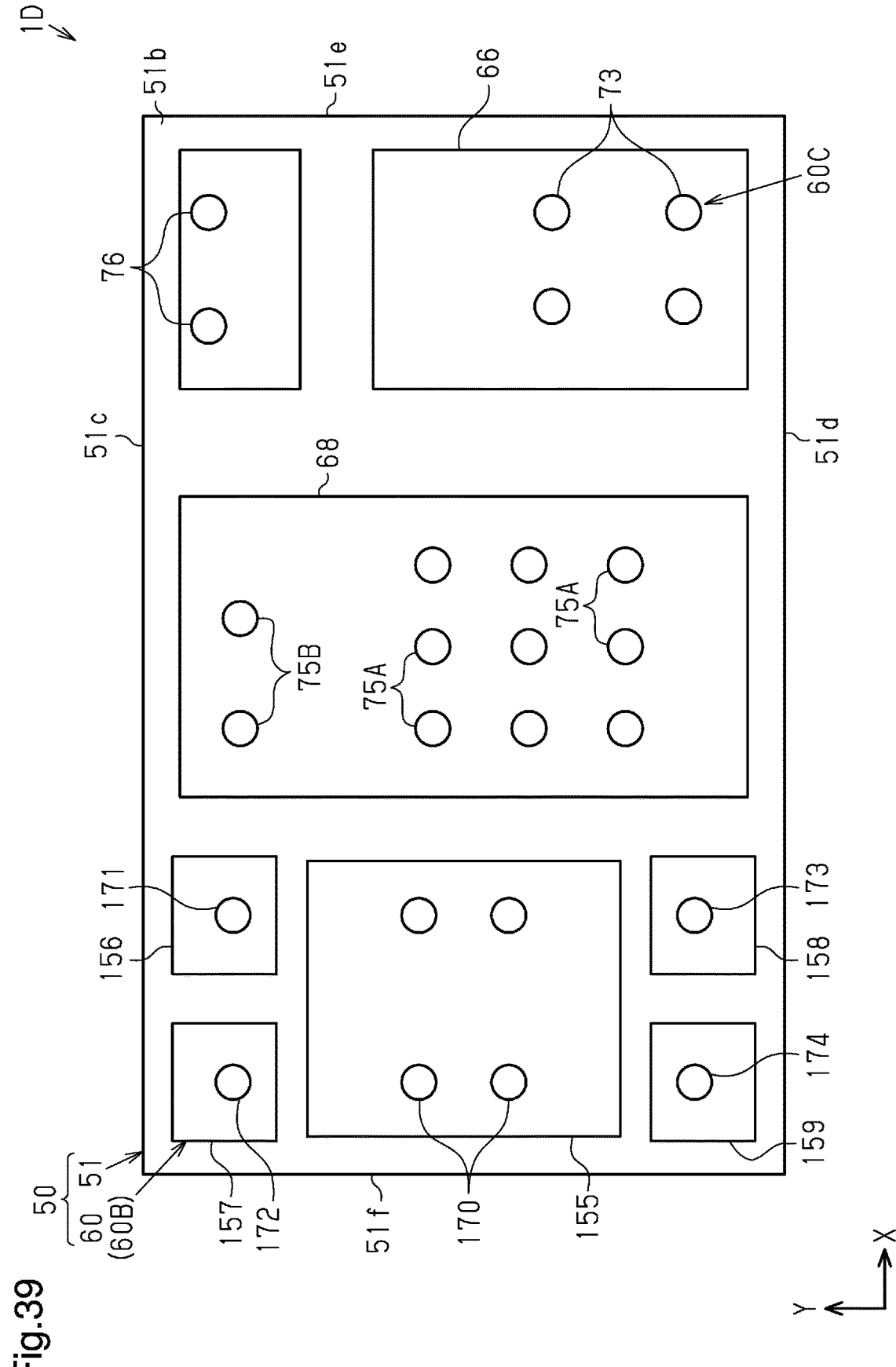
FIG. 39 is a back view of the semiconductor laser device shown in FIG. 38.

FIGS. 38 and 39 show a second example of a semiconductor laser device 1D in which the driver circuit 140 is incorporated in the semiconductor laser device 1B of the second embodiment. As shown in FIG. 38, in the present embodiment, the base member 51 of the support substrate 50 is rectangular in plan view such that the long sides extend in the width-wise direction X and the short sides extend in the length-wise direction Y. In the present embodiment, the distance between the third drive conductor 63 and the third base side surface 51*e* of the base member 51 in the width-wise direction X is greater than in the fourth embodiment. In the conductor 60 of the present embodiment, the second drive conductor 62 and the control conductor 65 are omitted from the main surface conductor 60A, and the second terminal conductor 67 and the control terminal conductor 70 (refer to FIG. 34) are omitted from the back surface conductor 60B.

The third drive conductor 63 is disposed on a center of the base main surface 51*a* in the width-wise direction X. The driver circuit mount portion 150, the first power conductor 151, the second power conductor 152, the signal conductor 153, and the reference voltage conductor 154 are located at a side of the third drive conductor 63 opposite from the first drive conductor 61 (toward the fourth base side surface 51*f*) in the width-wise direction X. In plan view, the driver circuit mount portion 150 is rectangular such that the long sides extend in the length-wise direction Y and the short sides extend in the width-wise direction X.

The first power conductor 151 and the second power conductor 152 are located closer to the first base side surface 51*c* than the driver circuit mount portion 150 in the length-wise direction Y. The first power conductor 151 and the second power conductor 152 are aligned in the length-wise direction Y and arranged to be separate from each other in the width-wise direction X. As viewed in the length-wise direction Y, the first power conductor 151 and the second power conductor 152 are located overlapping the driver circuit mount portion 150. The first power conductor 151 is located closer to the third drive conductor 63 than the second power conductor 152 in the width-wise direction X.

The signal conductor 153 and the reference voltage conductor 154 are located closer to the second base side surface 51*d* than the driver circuit mount portion 150 in the length-wise direction Y. The signal conductor 153 and the reference voltage conductor 154 are aligned in the length-wise direction Y and arranged to be separate from each other in the width-wise direction X. As viewed in the length-wise direction Y, the signal conductor 153 and the reference voltage conductor 154 are located overlapping the driver circuit mount portion 150. The signal conductor 153 is located closer to the third drive conductor 63 than the reference voltage conductor 154 in the width-wise direction X.

The driver circuit 140 is mounted on the driver circuit mount portion 150. The driver circuit 140 shown in FIG. 38 differs from the driver circuit 140 shown in FIG. 35 in the orientation when mounted on the driver circuit mount portion 150. More specifically, as viewed in a direction perpendicular to the base main surface 51*a*, the driver circuit 140 shown in FIG. 38 is rotated 90 degrees clockwise from the driver circuit 140 shown in FIG. 35. The driver connection members 161 to 165 are connected generally in the same manner as the driver connection members 161 to 165 shown in FIG. 35. The first end 166*a* of the sixth driver connection member 166 is connected to an end of the source electrode 22 located close to the input electrode 144*d* in the width-wise direction X.

As shown in FIG. 39, the driver terminal conductor 155, the first power terminal conductor 156, the second power terminal conductor 157, the signal terminal conductor 158, and the reference voltage terminal conductor 159 are located toward the fourth base side surface 51*f* from the third terminal conductor 68 in the width-wise direction X.

The driver terminal conductor 155 is disposed on a portion of the base back surface 51*b* of the base member 51 overlapping the driver circuit mount portion 150 as viewed in the thickness-wise direction Z. The driver terminal conductor 155 is identical in shape and size to the driver circuit mount portion 150. The first power terminal conductor 156 is disposed on a portion of the base back surface 51*b* overlapping the first power conductor 151 as viewed in the thickness-wise direction Z. The first power terminal conductor 156 is identical in shape and size to the first power conductor 151. The second power terminal conductor 157 is disposed on a portion of the base back surface 51*b* overlapping the second power conductor 152 as viewed in the thickness-wise direction Z. The second power terminal conductor 157 is identical in shape and size to the second power conductor 152. The signal terminal conductor 158 is disposed on a portion of the base back surface 51*b* overlapping the signal conductor 153 as viewed in the thickness-wise direction Z. The signal terminal conductor 158 is identical in shape and size to the signal conductor 153. The reference voltage terminal conductor 159 is disposed on a portion of the base back surface 51*b* overlapping the reference voltage conductor 154 as viewed in the thickness-wise direction Z. The reference voltage terminal conductor 159 is identical in shape and size to the reference voltage conductor 154.

In this structure, the semiconductor laser element 10 is located in the center of the base member 51 in the width-wise direction X. Thus, there is no imbalance of the semiconductor laser element 10 on the support substrate 50 in the width-wise direction X, so that wiring patterns of the wiring substrate may be designed without considering the imbalance of the semiconductor laser element 10. This improves the versatility of the semiconductor laser device 1D.

Figure 40:
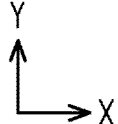
FIG. 40 is a plan view of a modified example of the semiconductor laser device of the fourth embodiment showing an internal structure of the semiconductor laser device with a sealing member removed.

FIG. 40 shows a structure of the semiconductor laser device 1D that is based on the semiconductor laser device 1A of the first embodiment in which the switching element 20 of the semiconductor laser device 1A is replaced with the latera-structure switching element 20A of the semiconductor laser device 1C of the third embodiment and the driver circuit 140 is incorporated.

As shown in FIG. 40, the first source electrode 22A, the second source electrode 22B, and the gate electrode 23 of the switching element 20A are formed on an end of the element main surface 24*a* located close to the driver circuit 140. The first source electrode 22A overlaps the first power electrode 144*a* and the second power electrode 144*b* of the driver circuit 140 as viewed in the length-wise direction Y. The second source electrode 22B overlaps the input electrode 144*d*, the signal electrode 144*e*, and the reference voltage output electrode 144*f* of the driver circuit 140 as viewed in the length-wise direction Y. The gate electrode 23 overlaps the output electrode 144*c* of the driver circuit 140 as viewed in the length-wise direction Y.

The driver connection members 161 to 165 are connected in the same manner as the fourth embodiment of the driver connection members 161 to 165. The sixth driver connection member 166 connects the input electrode 144*d* of the driver circuit 140 and the second source electrode 22B of the switching element 20A. The back surface conductor 60B has the same structure as the fourth embodiment of the back surface conductor 60B. The semiconductor laser device 1D shown in FIG. 40 obtains the same advantages as the fourth embodiment.

Figure 41:
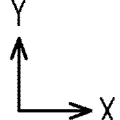
FIG. 41 is a plan view of a modified example of the semiconductor laser device of the fourth embodiment showing an internal structure of the semiconductor laser device with a sealing member removed.

In the semiconductor laser device 1D shown in FIG. 40, the number of semiconductor laser elements 10 may be changed in any manner. In an example, as shown in FIG. 41, the semiconductor laser device 1D shown in FIG. 40 may be changed to include two semiconductor laser elements 10A and 10B. In this case, the shape of the third drive conductor 63 and the fourth drive conductors 64A and 64B, the layout of the semiconductor laser elements 10A and 10B, and the connection of the laser connection members 85 and 86 are the same as those of the semiconductor laser device 1A in the modified example shown in FIG. 17. Also, although not shown in the drawings, the shape and layout of the third terminal conductor 68 and the fourth terminal conductors 69A and 69B of the back surface conductor 60B are the same as those of the semiconductor laser device 1A in the modified example shown in FIG. 18.

Figure 42:
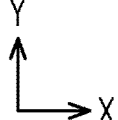
FIG. 42 is a plan view of a modified example of the semiconductor laser device of the fourth embodiment showing an internal structure of the semiconductor laser device with a sealing member removed.

In the semiconductor laser device 1D shown in FIG. 41, as shown in FIG. 42, the anode electrodes 11 of the two semiconductor laser elements 10A and 10B may be connected by the element connection member 87.

Figure 43:
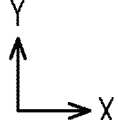
FIG. 43 is a plan view of a modified example of the semiconductor laser device of the fourth embodiment showing an internal structure of the semiconductor laser device with a sealing member removed.

In the semiconductor laser devices 1D shown in FIGS. 41 and 42, as shown in FIG. 43, the semiconductor laser element 10C shown in FIGS. 20 and 21 may be used instead of the semiconductor laser elements 10A and 10B.

In the semiconductor laser device 1D of the fourth embodiment and its modified examples, the driver circuit 140 is mounted on the base main surface 51*a* of the base member 51 of the support substrate 50. Alternatively, for example, the driver circuit 140 may be embedded in the support substrate 50. In this structure, the switching element 20 and the driver circuit 140 are arranged in the thickness-wise direction Z, so that the semiconductor laser device 1D is reduced in size in the width-wise direction X or the length-wise direction Y.

In the semiconductor laser device 1D of the fourth embodiment and its modified examples, the diameter of the driver connection members 161 to 166 may differ from the diameter of the other connection members 80. Also, the driver connection members 161 to 166 may be formed from a material that differs from the material forming the other connection members 80.

Fifth Embodiment

A fifth embodiment of a semiconductor laser device 1E will now be described with reference to FIGS. 44 and 46. The semiconductor laser device 1E of the present embodiment differs from the semiconductor laser device 1B of the second embodiment mainly in the shape of part of the conductor 60. In the present embodiment, for the sake of convenience, the same reference characters are given to those elements that are the same as the corresponding elements of the second embodiment. Such elements may not be described in detail.

Figure 44:
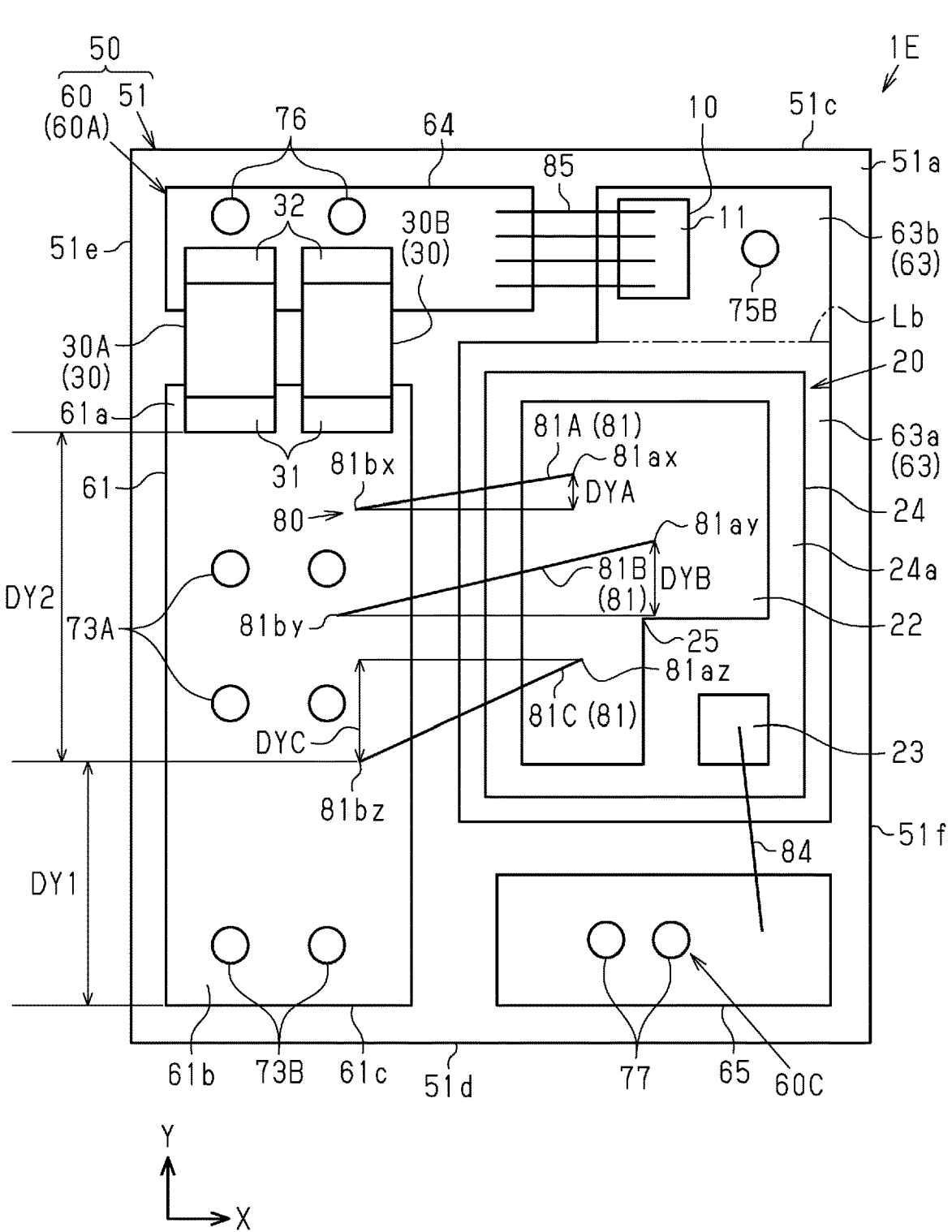
FIG. 44 is a plan view of a fifth embodiment of a semiconductor laser device showing an internal structure of the semiconductor laser device with a sealing member removed.

As shown in FIG. 44, the semiconductor laser device 1E includes the first drive conductor 61, the third drive conductor 63, the fourth drive conductor 64, and the control conductor 65 as the main surface conductor 60A. That is, the semiconductor laser device 1E does not include the second drive conductor 62.

The dimension of the base member 51 of the support substrate 50 in the length-wise direction Y is greater than the dimension of the second embodiment of the base member 51 in the length-wise direction Y. The dimension of the base member 51 in the width-wise direction X is equal to the dimension of the second embodiment of the base member 51 in the width-wise direction X. Thus, in plan view, the aspect ratio of the base member 51 differs from that of the second embodiment of the base member 51.

The first drive conductor 61, the third drive conductor 63, and the fourth drive conductor 64 are arranged in the same manner as those of the second embodiment. The dimension of the first drive conductor 61 in the length-wise direction Y is greater than the dimension of the second embodiment of the first drive conductor 61 in the length-wise direction Y. The dimension of the third drive conductor 63 in the length-wise direction Y is greater than the dimension of the second embodiment of the third drive conductor 63 in the length-wise direction Y. More specifically, the dimension of the switching element mount portion 63a in the length-wise direction Y is greater than the dimension of the second embodiment of the switching element mount portion 63a in the length-wise direction Y. In the present embodiment, opposite ends of the first drive conductor 61 in the length-wise direction Y are referred to as a first end 61a and a second end 61b. The first end 61a is an end of the first drive conductor 61 located close to the first base side surface 51c. The first terminals 31 of the capacitors 30A and 30B are connected to the first end 61a. The second end 61b is an end of the first drive conductor 61 located close to the second base side surface 51d.

The control conductor 65 is located closer to the second base side surface 51d than the third drive conductor 63. In plan view, the control conductor 65 is rectangular such that the long sides extend in the width-wise direction X and the short sides extend in the length-wise direction Y The dimension of the control conductor 65 in the width-wise direction X is greater than the dimension of the second embodiment of the control conductor 65 in the width-wise direction X.

Figure 45:
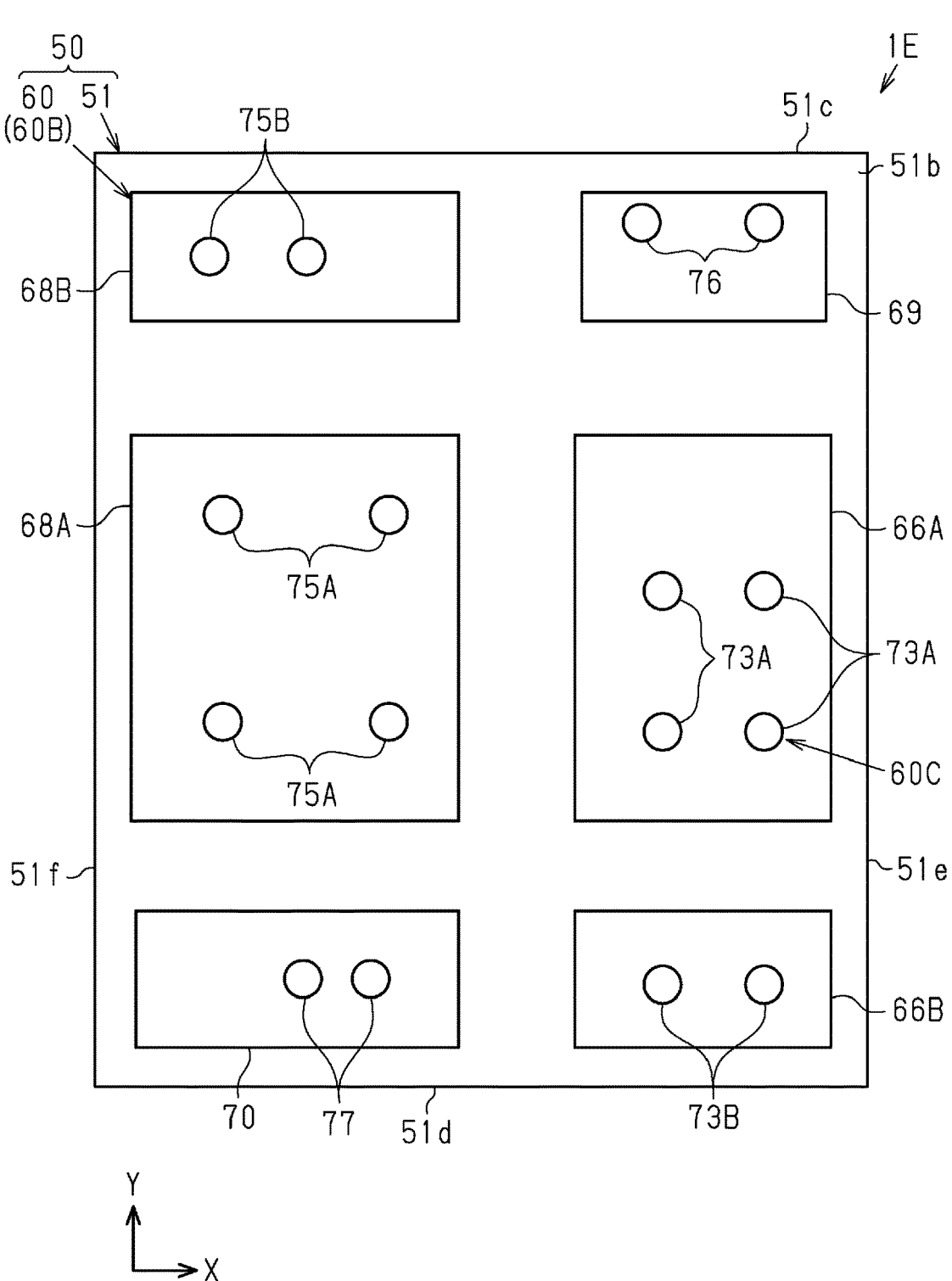
FIG. 45 is a back view of the semiconductor laser device shown in FIG. 44.

As shown in FIG. 45, the semiconductor laser device 1E includes the first terminal conductors 66A and 66B, the third terminal conductors 68A and 68B, the fourth terminal conductor 69, and the control terminal conductor 70 as the back surface conductor 60B. That is, the semiconductor laser device 1E does not include the second terminal conductor 67. In the present embodiment, the first terminal conductors 66A and 66B, the third terminal conductors 68A and 68B, and the fourth terminal conductor 69 are arranged in the same manner as in the second embodiment. The dimension of each of the third terminal conductors 68A and 68B in the width-wise direction X is less than the dimension of each of the third terminal conductors 68A and 68B in the second embodiment in the width-wise direction X. The dimension of the third terminal conductor 68A in the length-wise direction Y is greater than the dimension of the second embodiment of the third terminal conductor 68A in the length-wise direction Y.

The control terminal conductor 70 is located overlapping the control conductor 65 in the thickness-wise direction Z. The dimension of the control terminal conductor 70 in the width-wise direction X is greater than the dimension of the second embodiment of the control terminal conductor 70 in the width-wise direction X.

The semiconductor laser device 1E of the present embodiment includes the first drive joints 73A and 73B, the third drive joints 75A and 75B, the fourth drive joints 76, and the control joints 77 as the joints 60C. That is, the semiconductor laser device 1E does not include the second drive joints 74. In the present embodiment, the first drive joints 73A and 73B, the third drive joints 75A and 75B, and the fourth drive joints 76 are arranged in the same manner as in the second embodiment. The present embodiment differs from the second embodiment in that four third drive joints 75A and two control joints 77 are provided. The four third drive joints 75A are separated from each other in the width-wise direction X and the length-wise direction Y. The two control joints 77 are aligned in the length-wise direction Y and arranged to be separate from each other in the width-wise direction X.

As shown in FIG. 44, the switching element 20, which is mounted on the switching element mount portion 63a of the third drive conductor 63, is greater in the dimension in the length-wise direction Y than the second embodiment of the switching element 20.

In the present embodiment, the connection positions of the first drive connection members 81 to the source electrode 22 and the first drive conductor 61 differ from those in the second embodiment. More specifically, three first drive connection members 81 are referred to as the first drive connection members 81A, 81B, and 81C for the sake of convenience. The first drive connection member 81A is located closest to the capacitors 30A and 30B among the three first drive connection members 81A to 81C. The first drive connection member 81C is located farthest from the capacitors 30A and 30B among the three first drive connection members 81A to 81C. The first drive connection member 81B located between the first drive connection member 81A and the first drive connection member 81B in the length-wise direction Y.

The first drive connection member 81A includes a first end 81ax connected to a portion of the source electrode 22 located closer to the first base side surface 51c than the center of the source electrode 22 in the length-wise direction Y. The first drive connection member 81A includes a second end 81bx connected to a portion of the first drive conductor 61 located closer to the first base side surface 51c than the center of the first drive conductor 61 in the length-wise direction Y. More specifically, the second end 81bx is located closer to the first base side surface 51c than the four first drive joints 73, which are formed on the first drive conductor 61. The second end 81bx is located closer to the second base side surface 51d than the first end 81ax in the length-wise direction Y. Thus, in plan view, the first drive connection member 81A extends toward the second base side surface 51d from the first end 81ax toward the second end 81bx.

The first drive connection member 81B includes a first end Slay connected to a portion of the source electrode 22 located closer to the first base side surface 51c than the center of the source electrode 22 in the length-wise direction Y and closer to the center than the first end 81ax. The first drive connection member 81B includes a second end 81by connected to a portion of the first drive conductor 61 located closer to the first base side surface 51c than the center of the first drive conductor 61 in the length-wise direction Y and closer to the center than the first end 81ax. More specifically, the second end 81by is located between the four first drive joints 73 in the length-wise direction Y. The second end 81by is located closer to the second base side surface 51d than the first end 81ay in the length-wise direction Y. Thus, in plan view, the first drive connection member 81B extends toward the second base side surface 51d from the first end 81ay toward the second end 81by.

The first drive connection member 81C includes a first end 81az connected to a portion of the source electrode 22 located closer to the second base side surface 51d than the center of the source electrode 22 in the length-wise direction Y. More specifically, the first end 81az is connected to a portion of the source electrode 22 located adjacent to the cutaway portion 25 in the width-wise direction X. The first drive connection member 81C includes a second end 81bz connected to a portion of the first drive conductor 61 located closer to the second base side surface 51d than the center of the first drive conductor 61 in the length-wise direction Y. More specifically, the first drive conductor 61 has an edge 61c located close to the second base side surface 51d. A distance DY1 between the edge 61c and the second end 81bz in the length-wise direction Y is less than a distance DY2 between the first terminal 31 of the capacitor 30B and the second end 81bz in the length-wise direction Y. The second end 81bz is connected to a portion of the first drive conductor 61 located toward the switching element 20 in the width-wise direction X.

The second end 81*bz* is located closer to the second base side surface 51*d* than the first end 81*az* in the length-wise direction Y. Thus, in plan view, the first drive connection member 81C extends toward the second base side surface 51*d* from the first end 81*az* toward the second end 81*bz*. A distance DYC between the first end 81*az* and the second end 81*bz* in the length-wise direction Y is greater than a distance DYA between the first end 81*ax* and the second end 81*bx* of the first drive connection member 81A in the length-wise direction Y. The distance DYC is greater than a distance DYB between the first end Slay and the second end 81*by* of the first drive connection members 81B in the length-wise direction Y.

As shown in FIG. 44, the second end 81*bx* of the first drive connection member 81A is located closer to the capacitors 30A and 30B than the second ends 81*by* and 81*bz* of the first drive connection members 81B and 81C. Thus, the first drive connection member 81A refers to one of the drive connection members that is located closer to the capacitors 30A and 30B. In other words, the first drive connection member 81A refers to a first drive connection member that connects the second drive electrode (the source electrode 22 of the switching element 20) and a portion of the drive conductor (the first drive conductor 61) located close to the first terminals 31 of the capacitors 30A and 30B. The second end 81*bz* of the first drive connection member 81C is located farther from the capacitors 30A and 30B than the second ends 81*bx* and 81*by* of the first drive connection members 81A and 81C. The second end 81*bz* is located closer to the edge 61*c* of the first drive conductor 61 than the first terminals 31 of the capacitors 30A and 30B. Thus, the first drive connection member 81C refers to one of the drive connection members that is located farther from the capacitors 30A and 30B. In other words, the first drive connection member 81C refers to a second drive connection member that connects the second drive electrode (the source electrode 22 of the switching element 20) and a portion of the drive conductor (the first drive conductor 61) located closer to a second end (the edge 61*c*) than the first terminals 31 of the capacitors 30A and 30B.

Figure 46:
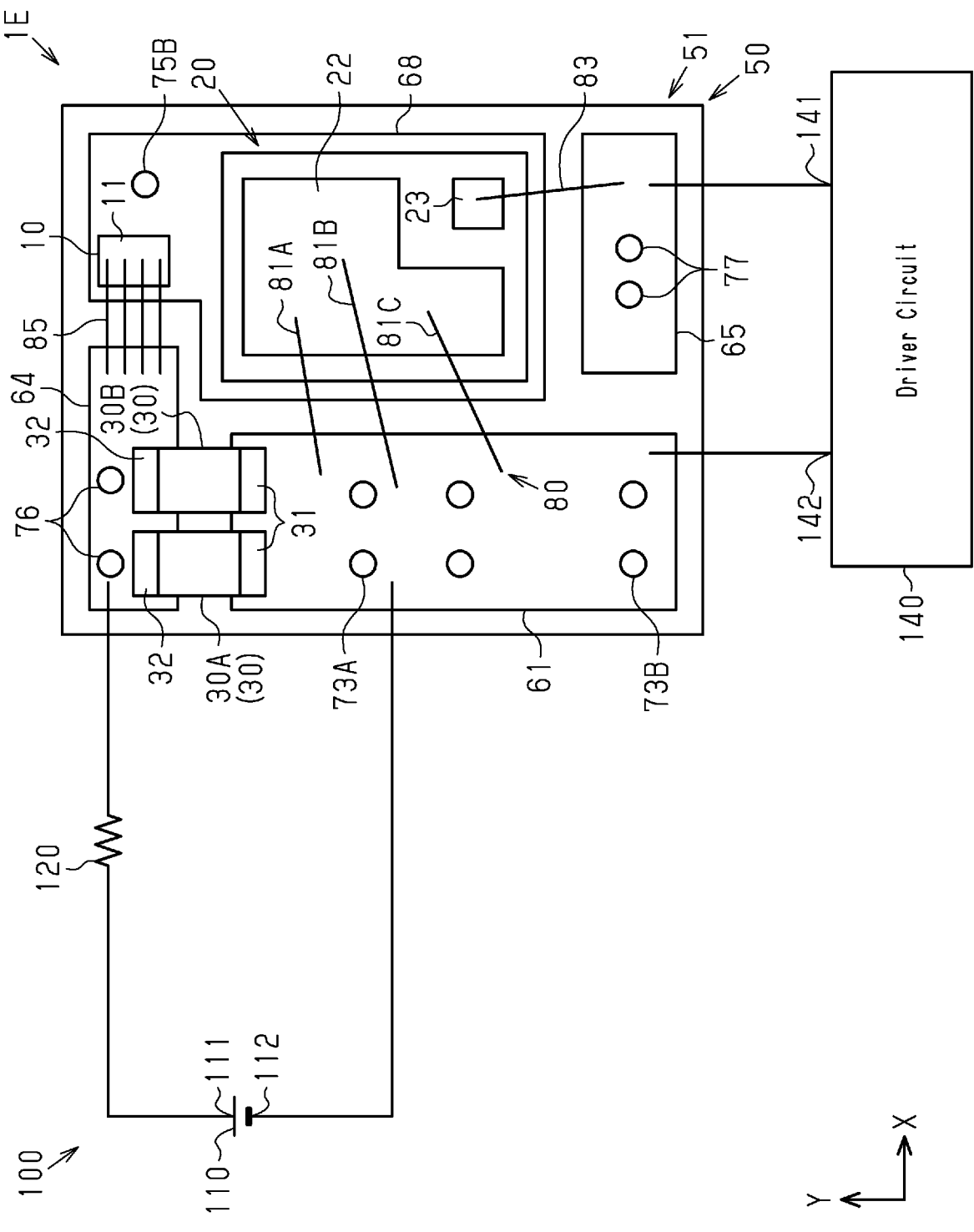
FIG. 46 is a schematic diagram showing a connection configuration when the semiconductor laser device of the fifth embodiment is used in a laser system.

FIG. 46 is a schematic diagram showing the semiconductor laser device 1E of the present embodiment used in the laser system 100. As shown in FIG. 46, the positive electrode 111 of the power supply 110 is connected to the fourth drive conductor 64 by the fourth terminal conductor 69 and the fourth drive joints 76 (refer to FIG. 45). The negative electrode 112 of the power supply 110 is connected to the first drive conductor 61 by the first terminal conductor 66A and the first drive joints 73A (refer to FIG. 45). In FIG. 45, the negative electrode 112 is connected to a portion of the first terminal conductor 66A located closer to the capacitors 30A and 30B than the center of the first terminal conductor 66A in the length-wise direction Y. The output electrode 141 of the driver circuit 140 is connected to the control conductor 65 by the control terminal conductor 70 and the control joints 77 (refer to FIG. 45). The input electrode 142 of the driver circuit 140 is connected to the first drive conductor 61 by the first terminal conductor 66B and the first drive joints 73B (refer to FIG. 45). Thus, the input electrode 142 is electrically connected to an end of the first drive conductor 61 located close to the second base side surface 51*d*. The output electrode 141 of the driver circuit 140 is electrically connected to the gate electrode 23 by the control conductor 65 and the control connection member 84. The input electrode 142 of the driver circuit 140 is electrically connected to the source electrode 22 by the first drive conductor 61 and the first drive connection members 81C.

When the laser system 100 is driven, a driving current loop is formed through which the current flows in the order of the positive electrode 111 of the power supply 110, the anode electrode 11 and the cathode electrode 12 of the semiconductor laser element 10, the drain electrode 21 and the source electrode 22 of the switching element 20, the first drive connection member 81A, and the negative electrode 112 of the power supply 110. Also, a control current loop is formed through which the current flows in the order of the output electrode 141 of the driver circuit 140, the control conductor 65, the control connection member 84, the source electrode 22, the first drive connection member 81C, the first drive conductor 61, and the input electrode 142. These current loops are independently formed.

The semiconductor laser device 1E of the present embodiment has the following advantages.

(5-1) The semiconductor laser device 1E includes the first drive connection member 81A and the first drive connection member 81C. The first drive connection member 81A is connected to the source electrode 22 of the switching element 20 and a portion of the first drive conductor 61 located close to the first terminals 31 of the capacitors 30A and 30B. The first drive connection member 81C is connected to the source electrode 22 and a portion of the first drive conductor 61 located closer to the gate electrode 23 than the first terminals 31 of the capacitors 30A and 30B. In this structure, the drive loop, which is a first path of current flowing from the source electrode 22 of the switching element 20 through the first drive connection member 81A to a portion of the first drive conductor 61 located close to the first terminals 31 of the capacitors 30A and 30B, is formed separately from the control loop, which is a second path of current flowing from the source electrode 22 through the first drive connection member 81C to a portion of the first drive conductor 61 located close to the gate electrode 23. Thus, variations in the current in the drive loop are less likely to affect the control loop. That is, the control loop is less likely to be affected by inductance of the first drive connection members 81. Accordingly, in the control loop, the voltage Vgs applied to the gate electrode 23 of the switching element 20 is less likely to be affected by counter electromotive force due to inductance of the first drive connection member 81A.

(5-2) The semiconductor laser element 10 is configured to emit a laser beam having a pulse width of 10 ns or less. In this structure, as the pulse width is decreased, the shortest one of the current paths through which the current can flow is formed in the drive loop. Thus, the current flows from the source electrode 22 of the switching element 20 to the first drive connection member 81A, which is located closest to the capacitors 30A and 30B. This reduces the effect of the drive loop on the first drive connection member 81C, which is located far from the capacitors 30A and 30B.

Modified Examples of Fifth Embodiment

The fifth embodiment is based on the structure of the semiconductor laser device 1B of the second embodiment, and the shape of the conductor 60 differs from that of the conductor 60 of the second embodiment. Alternatively, for example, the fifth embodiment may be based on the structure of the semiconductor laser devices 1A and 1C of the first and third embodiments. When the fifth embodiment is based on the structure of the semiconductor laser device 1A of the first embodiment and the semiconductor laser device 1C of the third embodiment, for example, the first drive conductor 61B and the second drive conductor 62 are integrated with each other. This structure obtains the same advantages as the fifth embodiment.

Modified Examples of Embodiments

The embodiments exemplify, without any intention to limit, applicable forms of a semiconductor laser device according to the present disclosure. The semiconductor laser device according to the present disclosure may be applicable to forms differing from the above embodiments. In an example of such a form, the configuration of the embodiments is partially replaced, changed, or omitted, or a further configuration is added to the embodiments. In the following modified examples, the same reference characters are given to those components that are the same as the corresponding components of the embodiments. Such components will not be described in detail.

In the embodiments, the capacitors 30A and 30B are mounted on the base main surface 51a of the base member 51 of the support substrate 50. However, the position of the capacitors 30A and 30B is not limited to that described above. For example, the capacitors 30A and 30B may be embedded in the support substrate 50.

In the embodiments, the joints 60C are obtained by embedding the conductive portions 72 into the through holes 71. However, the configuration of the joints 60C are not limited to that described above. At least one of the joints 60C may be obtained by embedding an insulative material, instead of the conductive portion 72, into the through hole 71.

In the embodiments, the diameter of the first drive connection members 81 and 82, the diameter of the second drive connection member 83, the diameter of the control connection member 84, and the diameter of the laser connection members 85 and 86 are equal to each other. Alternatively, the diameter of the first drive connection members 81 and 82, the diameter of the second drive connection member 83, the diameter of the control connection member 84, and the diameter of the laser connection members 85 and 86 may be set separately. For example, the diameter of the control connection member 84 may be smaller than the diameter of the drive connection members 81 to 83 and the diameter of the laser connection members 85 and 86.

In the embodiments, the first drive connection members 81 and 82, the second drive connection member 83, the control connection member 84, and the laser connection members 85 and 86 are formed of the same material. Alternatively, for example, the material of the control connection member 84 may differ from the material of the drive connection members 81 to 83 and the laser connection members 85 and 86.

In the embodiments, the diode 130 of the laser system 100 is disposed outside the semiconductor devices 1A to 1E. Alternatively, the semiconductor devices 1A to 1E may incorporate the diode 130.

The technical ideas obtainable from the above embodiments and modified examples are described below.

Clause 1

A semiconductor laser device, including:

a semiconductor laser element;

a switching element connected in series to the semiconductor laser element, the switching element including a control electrode, a first drive electrode, and a second drive electrode and controlling a current flowing to the semiconductor laser element in accordance with a voltage applied to the control electrode;

a capacitor configured to be connected in parallel to the semiconductor laser element and the switching element, a first drive conductor connected to a first terminal of the capacitor;

a second drive conductor located separate from the first drive conductor;

a first drive connection member connecting the first drive conductor and the second drive electrode; and a second drive connection member connecting the second drive conductor and the second drive electrode.

Clause 2

The semiconductor laser device according to clause 1, further including a terminal conductor configured to be a terminal of the semiconductor laser device, where the terminal conductor includes a first terminal conductor configured to be connected to a negative electrode of a power supply, the power supply being configured to supply power to the semiconductor laser device, and a second terminal conductor configured to be connected to an input electrode of a driver circuit, the driver circuit being configured to apply a voltage to the control electrode of the switching element, the first drive conductor is electrically connected to the first terminal conductor, and the second drive conductor is electrically connected to the second terminal conductor.

Clause 3

The semiconductor laser device according to clause 1 or 2, where the semiconductor laser element, the switching element, and the second drive conductor are arranged in order in a predetermined first direction in a plan view of the semiconductor laser device, and the first drive conductor and the switching element are arranged in order in a second direction that is orthogonal to the first direction in the plan view.

Clause 4

The semiconductor laser device according to clause 3, where the second drive conductor and the semiconductor laser element are located at opposite sides of the switching element in the first direction.

Clause 5

The semiconductor laser device according to clause 3 or 4, where the semiconductor laser element is located in a center in the second direction.

Clause 6

The semiconductor laser device according to any one of clauses 3 to 5, where the capacitor is located closer to the semiconductor laser element than the switching element in the first direction.

Clause 7

The semiconductor laser device according to any one of clauses 1 to 6, where the capacitor includes multiple capacitors.

Clause 8

The semiconductor laser device according to any one of clauses 3 to 6, where the capacitor includes multiple capacitors located at opposite sides of the switching element in the second direction, and the first drive conductors are located at opposite sides of the switching element in the second direction.

Clause 9

The semiconductor laser device according to any one of clauses 3 to 6, where the semiconductor laser element includes multiple semiconductor laser elements arranged in order in the second direction.

Clause 10

The semiconductor laser device according to clause 9, where adjacent ones of the semiconductor laser elements in the second direction have electrodes electrically connected to each other by an element connection member.

Clause 11

The semiconductor laser device according to any one of clauses 1 to 9, where the semiconductor laser element includes semiconductor light emitting layers arranged in order in the second direction, and the semiconductor light emitting layers are connected to each other by a single electrode.

Clause 12

The semiconductor laser device according to any one of clauses 1 to 11, further including a third drive conductor connected to the first drive electrode of the switching element, where the semiconductor laser element is connected to the third drive conductor.

Clause 13

The semiconductor laser device according to any one of clauses 1 to 12, further including a fourth drive conductor connected to a second terminal of the capacitor, where the semiconductor laser element, the switching element, and the second drive conductor are arranged in order in a predetermined first direction in a plan view of the semiconductor laser device, and the fourth drive conductor and the first drive conductor are arranged in order in the first direction.

Clause 14

The semiconductor laser device according to any one of clauses 1 to 13, further including:

a control conductor located separate from the first drive conductor and the second drive conductor and configured to be electrically connected to the control electrode; and a control connection member configured to connect the control electrode and the control conductor, where the control connection member and the second drive connection member are located adjacent to each other.

Clause 15

The semiconductor laser device according to clause 14, where the control conductor and the second drive conductor are located adjacent to each other.

Clause 16

The semiconductor laser device according to any one of clauses 1 to 15, including a support substrate including a substrate main surface and a substrate back surface that face in opposite directions in a direction perpendicular to the substrate main surface, where at least the first drive conductor is formed on the substrate main surface, and a terminal conductor configured to be a terminal of the semiconductor laser device is formed on the substrate back surface.

Clause 17

The semiconductor laser device according to clause 16, where the terminal conductor includes a first terminal conductor, a second terminal conductor, and a third terminal conductor, the first terminal conductor is configured to be connected to a negative electrode of a power supply configured to supply power to the semiconductor laser device, the second terminal conductor is configured to be connected to an input electrode of a driver circuit configured to apply a voltage to the control electrode of the switching element, the third terminal conductor is configured to be connected to the first drive electrode of the switching element, and the first terminal conductor is located separate from the third terminal conductor.

Clause 18

The semiconductor laser device according to clause 17, further including a third drive conductor connected to the first drive electrode of the switching element, where the terminal conductor includes a third terminal conductor electrically connected to the third drive conductor, and the first terminal conductor and the third terminal conductor are integrated with each other.

Clause 19

The semiconductor laser device according to any one of clauses 16 to 18, further including a joint configured to electrically connect the first drive conductor and the second drive conductor to the terminal conductor.

Clause 20

The semiconductor laser device according to any one of clauses 1 to 19, further including a sealing member sealing the semiconductor laser element, the switching element, the capacitor, the first drive conductor, the second drive conductor, the first drive connection member, and the second drive connection member, where the sealing member includes a portion transmissive to a laser beam from the semiconductor laser element.

Clause 21

A semiconductor laser device, including:

a semiconductor laser element;

a switching element connected in series to the semiconductor laser element, the switching element including a control electrode, a first drive electrode, and a second drive electrode and controlling a current flowing to the semiconductor laser element in accordance with a voltage applied to the control electrode;

a capacitor connected in parallel to the semiconductor laser element and the switching element; and a first drive conductor connected to a first terminal of the capacitor, where the first drive conductor includes a first end connected to the first terminal of the capacitor and a second end located opposite to the first end in a direction in which the first drive conductor extends, where the semiconductor laser device further includes:

a first drive connection member connecting the second drive electrode and the first drive conductor on a position toward the first terminal of the capacitor; and a second drive connection member connecting the second drive electrode and the first drive conductor on a position closer to the second end than the first terminal of the capacitor.

Clause 22

The semiconductor laser device according to clause 21, where the semiconductor laser element includes an element main surface and an element back surface that face in opposite directions, the second drive electrode and the control electrode are formed on the element main surface, the control electrode is located farther from the first drive conductor than the second drive electrode.

Clause 23

The semiconductor laser device according to clause 21 or 22, where a position of the second drive electrode on which the second drive connection member is connected is closer to the control electrode than a position of the second drive electrode on which the first drive connection member is connected.

Clause 24

The semiconductor laser device according to any one of clauses 21 to 23, further including a sealing member sealing the semiconductor laser element, the switching element, the capacitor, the first drive conductor, the first drive connection member, and the second drive connection member and including a portion transmissive to a laser beam from the semiconductor laser element.

Clause 25

A semiconductor laser device, including:

a semiconductor laser element;

a switching element connected in series to the semiconductor laser element, the switching element including a control electrode, a first drive electrode, and a second drive electrode and controlling a current flowing to the semiconductor laser element in accordance with a voltage applied to the control electrode;

a capacitor connected in parallel to the semiconductor laser element and the switching element;

a first drive conductor connected to a first terminal of the capacitor;

a driver circuit configured to apply a voltage to the control electrode of the switching element;

a first drive connection member connecting the first drive conductor and the second drive electrode; and a second drive connection member connecting the driver circuit and the second drive electrode.

Clause 26

The semiconductor laser device according to clause 25, where the semiconductor laser element and the switching element are arranged in order in a predetermined first direction in a plan view of the semiconductor laser device, the first drive conductor and the switching element are arranged in order in a second direction that is orthogonal to the first direction in the plan view, and the driver circuit and the semiconductor laser element are located at opposite sides of the switching element in the first direction.

Clause 27

The semiconductor laser device according to clause 25, where the semiconductor laser element and the switching element are arranged in order in a predetermined first direction in a plan view of the semiconductor laser device, the first drive conductor and the switching element are arranged in order in a second direction that is orthogonal to the first direction in the plan view, and the driver circuit and the first drive conductor are located at opposite sides of the switching element in the second direction.

Clause 28

The semiconductor laser device according to any one of clauses 25 to 27, where the second drive connection member is connected to the second drive electrode on a position toward the driver circuit.

Clause 29

The semiconductor laser device according to any one of clauses 25 to 28, where the driver circuit includes a chip including a main surface and a back surface that face in opposite directions, an input electrode and an output electrode are formed on the main surface, the input electrode is connected to the second drive connection member, the output electrode is electrically connected to the control electrode, the control electrode and the output electrode are connected by a control connection member, and the input electrode and the output electrode are located adjacent to each other as viewed in a direction perpendicular to the main surface.

Clause 30

The semiconductor laser device according to any one of clauses 25 to 29, further including a sealing member sealing the semiconductor laser element, the switching element, the capacitor, the first drive conductor, the driver circuit, the first drive connection member, and the second drive connection member and including a portion transmissive to a laser beam from the semiconductor laser element.

Clause 31

The semiconductor laser device according to any one of clauses 1 to 30, where the first drive connection member and the second drive connection member are each formed of a wire.

Clause 32

The semiconductor laser device according to clause 31, where the first drive connection member is formed of a plurality of wires, and the second drive connection member is formed of a single wire.

Clause 33

The semiconductor laser device according to clause 31 or 32, where the first drive connection member is equal in diameter to the second drive connection member.

Clause 34

The semiconductor laser device according to any one of clauses 1 to 33, where the semiconductor laser element includes an element main surface and an element back surface that face in opposite directions, the second drive electrode and the control electrode are formed on the element main surface, and the first drive electrode is formed on the element back surface.

Clause 35

The semiconductor laser device according to any one of clauses 1 to 34, where the semiconductor laser element includes an element main surface and an element back surface that face in opposite directions, and the first drive electrode, the second drive electrode, and the control electrode are formed on the element main surface.

Clause 36

The semiconductor laser device according to clause 35, where the semiconductor laser element and the switching element are arranged in order in a predetermined first direction in a plan view of the semiconductor laser device, the second drive electrode is located on the element main surface at a position toward the semiconductor laser element in the first direction, and the first drive electrode and the control electrode are located on a side of the element main surface opposite from the semiconductor laser element in the first direction.

Clause 37

The semiconductor laser device according to any one of clauses 1 to 36, further including:

a support substrate including a substrate main surface, a substrate back surface, and a substrate side surface, the first drive conductor being formed on the substrate main surface, the substrate main surface and the substrate back surface facing in opposite directions in a thickness-wise direction, the substrate side surface being disposed between the substrate main surface and the substrate back surface in the thickness-wise direction and facing in a direction that intersects the substrate main surface and the substrate back surface;

a terminal conductor formed on the substrate back surface and configured to be a terminal of the semiconductor laser device; and a joint connecting the first drive conductor and the terminal conductor, where the substrate side surface includes a recess recessed inward from the substrate side surface, and the joint is disposed in the recess.

Clause 38

The semiconductor laser device according to any one of clauses 1 to 37, where the semiconductor laser element is configured to emit a laser beam having a pulse width of 10 ns or less.

The invention claimed is:

1. A semiconductor laser device, comprising:

a semiconductor laser element:

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode; and a second drive connection member connecting the second drive conductor and the second drive electrode;

a terminal conductor configured to be a terminal of the semiconductor laser device, wherein the terminal conductor includes:

a first terminal conductor configured to be connected to a negative electrode of a power supply, the power supply being configured to supply power to the semiconductor laser device, and a second terminal conductor configured to be connected to an input electrode of a driver circuit, the driver circuit being configured to apply a voltage to the control electrode of the switching element, the first drive conductor is electrically connected to the first terminal conductor, and the second drive conductor is electrically connected to the second terminal conductor.

2. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode; and a second drive connection member connecting the second drive conductor and the second drive electrode; wherein the semiconductor laser element, the switching element, and the second drive conductor are arranged in order in a predetermined first direction in a plan view of the semiconductor laser device, and the first drive conductor and the switching element are arranged in order in a second direction that is orthogonal to the first direction in the plan view.

3. The semiconductor laser device according to claim 2, wherein the second drive conductor and the semiconductor laser element are located at opposite sides of the switching element in the first direction.

4. The semiconductor laser device according to claim 2, wherein the semiconductor laser element is located in a center in the second direction.

5. The semiconductor laser device according to claim 2, wherein the capacitor is located closer to the semiconductor laser element than the switching element in the first direction.

6. The semiconductor laser device according to claim 2, wherein the capacitor includes multiple capacitors.

7. The semiconductor laser device according to claim 2, wherein the capacitor includes multiple capacitors located at opposite sides of the switching element in the second direction, and the first drive conductors are located at opposite sides of the switching element in the second direction.

8. The semiconductor laser device according to claim 2, wherein the semiconductor laser element includes multiple semiconductor laser elements arranged in order in the second direction.

9. The semiconductor laser device according to claim 8, wherein adjacent ones of the semiconductor laser elements in the second direction have electrodes electrically connected to each other by an element connection member.

10. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode; and a second drive connection member connecting the second drive conductor and the second drive electrode; wherein the semiconductor laser element includes semiconductor light emitting layers arranged in order in the second direction, and the semiconductor light emitting layers are connected to each other by a single electrode.

11. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode;

a second drive connection member connecting the second drive conductor and the second drive electrode; and a third drive conductor connected to the first drive electrode of the switching element, wherein the semiconductor laser element is connected to the third drive conductor.

12. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode;

a second drive connection member connecting the second drive conductor and the second drive electrode; and a fourth drive conductor connected to a second terminal of the capacitor, wherein the semiconductor laser element, the switching element, and the second drive conductor are arranged in order in a predetermined first direction in a plan view of the semiconductor laser device, and the fourth drive conductor and the first drive conductor are arranged in order in the first direction.

13. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode;

a second drive connection member connecting the second drive conductor and the second drive electrode;

a control conductor located separate from the first drive conductor and the second drive conductor and configured to be electrically connected to the control electrode; and a control connection member configured to connect the control electrode and the control conductor, wherein the control connection member and the second drive connection member are located adjacent to each other.

14. The semiconductor laser device according to claim 13, wherein the control conductor and the second drive conductor are located adjacent to each other.

15. A semiconductor laser device, comprising:

a semiconductor laser element;

a switching element connected in series to the semiconductor laser element, the switching element including:

a control electrode, a first drive electrode, and a second drive electrode, the switching element controlling a current flowing to the semiconductor laser element in accordance with a voltage applied to the control electrode;

a capacitor configured to be connected in parallel to the semiconductor laser element and the switching element;

a first drive conductor connected to a first terminal of the capacitor;

a second drive conductor located separate from the first drive conductor;

a first drive connection member connecting the first drive conductor and the second drive electrode;

a second drive connection member connecting the second drive conductor and the second drive electrode; and a support substrate including a substrate main surface and a substrate back surface that face in opposite directions in a direction perpendicular to the substrate main surface, wherein at least the first drive conductor is formed on the substrate main surface, and a terminal conductor configured to be a terminal of the semiconductor laser device is formed on the substrate back surface.

16. The semiconductor laser device according to claim 15, wherein the terminal conductor includes a first terminal conductor, a second terminal conductor, and a third terminal conductor, the first terminal conductor is configured to be connected to a negative electrode of a power supply configured to supply power to the semiconductor laser device, the second terminal conductor is configured to be connected to an input electrode of a driver circuit configured to apply a voltage to the control electrode of the switching element, the third terminal conductor is configured to be connected to the first drive electrode of the switching element, and the first terminal conductor is located separate from the third terminal conductor.

17. The semiconductor laser device according to claim 16, further comprising a third drive conductor connected to the first drive electrode of the switching element, wherein the terminal conductor includes a third terminal conductor electrically connected to the third drive conductor, and the first terminal conductor and the third terminal conductor are integrated with each other.

18. The semiconductor laser device according to claim 15, further comprising a joint configured to electrically connect the first drive conductor and the second drive conductor to the terminal conductor.

19. The semiconductor laser device according to claim 1, further comprising:

a sealing member sealing the semiconductor laser element, the switching element, the capacitor, the first drive conductor, the second drive conductor, the first drive connection member, and the second drive connection member, wherein the sealing member includes a portion transmissive to a laser beam from the semiconductor laser element.

\* \* \* \* \*